(12) United States Patent
Murakawa

(10) Patent No.: US 10,480,073 B2
(45) Date of Patent: Nov. 19, 2019

(54) ROTATING SEMI-BATCH ALD DEVICE

(71) Applicant: Shigemi Murakawa, Chiba (JP)

(72) Inventor: Shigemi Murakawa, Chiba (JP)

(*) Notice: Subject to any disclaimer, the term of this patent is extended or adjusted under 35 U.S.C. 154(b) by 559 days.

(21) Appl. No.: 14/831,884

(22) Filed: Aug. 21, 2015

(65) Prior Publication Data

US 2015/0361553 A1 Dec. 17, 2015

Related U.S. Application Data

(63) Continuation of application No. PCT/JP2014/060027, filed on Apr. 4, 2014.

(30) Foreign Application Priority Data

Apr. 7, 2013 (JP) .................................. 2013-080037

(51) Int. Cl.
*C23C 16/455* (2006.01)
*C23C 16/44* (2006.01)
*C23C 16/52* (2006.01)

(52) U.S. Cl.
CPC .... *C23C 16/45551* (2013.01); *C23C 16/4412* (2013.01); *C23C 16/45561* (2013.01); *C23C 16/52* (2013.01)

(58) Field of Classification Search
CPC .......... C23C 16/45551; C23C 16/4412; C23C 16/45561; C23C 16/45565; C23C 16/52
USPC ......................................... 156/345.1–345.55
See application file for complete search history.

(56) References Cited

U.S. PATENT DOCUMENTS

| 3,144,664 A | 8/1964 | Fonken |
| 4,413,022 A | 11/1983 | Suntola et al. |
| 5,225,366 A | 7/1993 | Yoder |
| 5,281,274 A | 1/1994 | Yoder |
| 5,356,476 A * | 10/1994 | Foster ..................... C23C 16/14 118/715 |

(Continued)

FOREIGN PATENT DOCUMENTS

| CN | 1904653 | 1/2007 |
| CN | 101438391 | 5/2009 |

(Continued)

OTHER PUBLICATIONS

"Office Action of Korea Counterpart Application" with English translation thereof, dated Apr. 10, 2017, p. 1-p. 17.

(Continued)

*Primary Examiner* — Charlee J C Bennett
(74) *Attorney, Agent, or Firm* — JCIPRNET

(57) ABSTRACT

The present invention provides a rotating semi-batch ALD device and process which ensure high productivity, minimal particle formation, low gas consumption and high coverage during the production of semiconductors, liquid crystals, LEDs and/or solar cells. The rotating semi-batch ALD device and ALD process are characterized in that: a reaction gas supply means is configured from a shower plate for evenly discharging gas, a cavity for allowing gas to flow down gradually, and a partition wall surrounding the shower plate and the cavity; and a purge gas supply means is configured from a shower plate that causes gas to flow evenly at a high flow velocity in the transverse direction in the narrow gap between the purge gas supply means and substrates being treated.

19 Claims, 29 Drawing Sheets

(56) References Cited

U.S. PATENT DOCUMENTS

| | | | |
|---|---|---|---|
| 5,422,139 A * | 6/1995 | Fischer | C23C 16/455 118/715 |
| 5,711,811 A | 1/1998 | Suntola et al. | |
| 6,156,151 A * | 12/2000 | Komino | H01J 37/3244 156/345.29 |
| 6,523,572 B1 | 2/2003 | Levin et al. | |
| 6,576,062 B2 | 6/2003 | Matsuse | |
| 6,821,563 B2 | 11/2004 | Yudovsky | |
| 6,821,910 B2 * | 11/2004 | Adomaitis | C23C 16/4412 118/715 |
| 6,902,620 B1 * | 6/2005 | Omstead | C23C 16/45551 117/102 |
| 6,972,055 B2 | 12/2005 | Sferlazzo | |
| 7,153,542 B2 | 12/2006 | Nguyen et al. | |
| 7,604,439 B2 | 10/2009 | Yassour et al. | |
| 9,175,393 B1 * | 11/2015 | Higashi | C23C 16/50 |
| 9,514,933 B2 * | 12/2016 | Lei | H01L 21/0217 |
| 10,066,297 B2 * | 9/2018 | Higashi | C23C 16/45565 |
| 10,196,741 B2 * | 2/2019 | Griffin | C23C 16/4584 |
| 2002/0043216 A1 | 4/2002 | Hwang et al. | |
| 2002/0152959 A1 | 10/2002 | Lee et al. | |
| 2003/0194493 A1 * | 10/2003 | Chang | C23C 16/45512 427/248.1 |
| 2004/0026374 A1 * | 2/2004 | Nguyen | H01L 21/67173 216/89 |
| 2005/0001527 A1 * | 1/2005 | Sugiyama | C23C 16/505 313/231.31 |
| 2005/0106864 A1 * | 5/2005 | Jurgensen | C23C 16/46 438/680 |
| 2006/0228827 A1 * | 10/2006 | Kim | C23C 16/45565 438/82 |
| 2007/0095286 A1 * | 5/2007 | Baek | C23C 16/4412 118/719 |
| 2007/0218702 A1 | 9/2007 | Shimizu et al. | |
| 2007/0247066 A1 | 10/2007 | Tokairin et al. | |
| 2007/0264427 A1 * | 11/2007 | Shinriki | C23C 16/45542 427/255.7 |
| 2008/0075858 A1 | 3/2008 | Koh | |
| 2009/0029046 A1 * | 1/2009 | Kudoh | H01L 21/67017 427/248.1 |
| 2009/0229754 A1 * | 9/2009 | Iizuka | C23C 16/4412 156/345.34 |
| 2010/0041213 A1 | 2/2010 | Lee | |
| 2010/0098851 A1 | 4/2010 | Murakawa et al. | |
| 2010/0186669 A1 * | 7/2010 | Shin | C23C 16/45546 118/719 |
| 2011/0212625 A1 * | 9/2011 | Toyoda | C23C 16/4412 438/758 |
| 2011/0268891 A1 * | 11/2011 | MacNeil | C23C 16/4412 427/569 |
| 2012/0321786 A1 * | 12/2012 | Satitpunwaycha | C23C 16/45565 427/252 |
| 2013/0052346 A1 * | 2/2013 | Higashi | C23C 16/45519 427/248.1 |
| 2013/0125818 A1 * | 5/2013 | Wright | C23C 16/45565 118/723 R |
| 2015/0007774 A1 * | 1/2015 | Iwasaki | C23C 16/45542 118/723 R |
| 2015/0194298 A1 * | 7/2015 | Lei | H01L 21/0217 438/680 |
| 2015/0361550 A1 * | 12/2015 | Yabe | C23C 16/45536 438/782 |
| 2017/0183779 A1 * | 6/2017 | Ikegawa | H01L 21/68771 |

FOREIGN PATENT DOCUMENTS

| | | |
|---|---|---|
| CN | 101445918 | 6/2009 |
| CN | 101736320 | 6/2010 |
| CN | 101842873 | 9/2010 |
| JP | H04-287912 | 10/1992 |
| JP | 2007-533153 | 11/2007 |
| JP | 2010-56470 | 3/2010 |
| JP | 2010-56471 | 3/2010 |
| JP | 2011-74593 | 4/2011 |
| JP | 2011-89561 | 5/2011 |
| JP | 2011-124384 | 6/2011 |
| JP | 2011-134996 | 7/2011 |
| JP | 2011-519796 | 7/2011 |
| JP | 2011222960 | 11/2011 |
| KR | 20010073747 A * | 8/2001 |
| KR | 2007-0085761 | 8/2007 |
| TW | 201310532 | 3/2013 |
| WO | 2014168096 | 10/2014 |
| WO | WO-2014168096 A1 * | 10/2014 ......... C23C 16/4412 |

OTHER PUBLICATIONS

"First Office Action of China Counterpart Application" with English translation thereof, dated Jan. 24, 2017, p. 1-p. 24.

A. W. Ott et al., "Al3O3 Thin Film Growth on Si (100) Using Binary Reaction Sequence Chemistry", Thin Solid Films, vol. 292, No. 1-2, pp. 135-144, Jan. 1997.

Y. Widjaja and C. B. Musgrave, "Quantum Chemical Study of the Mechanism of Aluminum Oxide Atomic Layer Deposition", Applied Physics Letters, vol. 80, No. 18, pp. 3304-3306, May 2002.

Y. K. Kim et al., "Novel Capacitor Technology for High Density Stand-Alone and Embedded DRAMs", IEDM Tech Digest, pp. 369-372, Dec. 2000.

R. Matero et al., "Effect of Water Dose on the Atomic Layer Deposition Rate of Oxide Films",Thin Solid Films, vol. 368, pp. 1-7, Jun. 2000.

S. George et al., "Atomic Layer Controlled Deposition of SiO2 and Al2O3 Using ABAB . . . Binary Reaction Sequence Chemistry", Applied Surface Science, vol. 82/83, pp. 460-467, Dec. 1994.

L. Hiltunen et al., "Nitride of Ti, Nb, Ta and Mo Growth at Thin Films by ALE Method", Thin Solid Films, vol. 166, pp. 149-154, Dec. 1988.

R. Hegde et al., "Thin film properties of low-pressure chemical vapor deposition TiN barrier for ultra-large-scale integration applications," Journal of Vacuum Science and Technology B, vol. 11, No. 4, Jul./Aug. 1993, pp. 1287-1296.

M. Ritala et al., "Atomic Layer Epitaxy Growth of TiN Thin Films from TiI4 and NH3", J. Electrochem. Soc., vol. 145, No. 8, pp. 2914-2919, Aug. 1998.

Y. S. Kim et al., "Atomic-Layer Chemical Vapor-Deposition of TiN Thin Films on Si(100) and Si(111)", Journal of Korean Physical Society, vol. 37, No. 6, pp. 1045-1050, Dec. 2000.

H. Kim, "Atomic Layer Deposition of Metal and Nitride Thin Films: Current Research Efforts and Applications for Semiconductor Device Processing", Journal of Vacuum Science and Technology B., vol. 21, No. 6, pp. 2231-2261, Nov./Dec. 2003.

R.G. Gordon et al., "Kinetic Model for Step Coverage by Atomic Layer Deposition", Chem. Vap. Deposition, vol. 9, No. 2, pp. 73-78, Mar. 2003.

"Office Action of China Counterpart Application," with English translation thereof, dated Jun. 22, 2017, p. 1-p. 18.

"Office Action of China Counterpart Application," with English translation thereof, dated Nov. 1, 2017, p. 1-p. 8.

* cited by examiner

ROTATING SEMI-BATCH ALD DEVICE

CROSS-REFERENCE TO RELATED APPLICATIONS

This application is a Continuation of PCT International Application No. PCT/JP2014/060027, filed on Apr. 4, 2014, which claims priority benefit of Japanese Patent Application No. 2013-080037, filed on Apr. 7, 2013. Each of the above-mentioned applications is hereby incorporated by reference herein and made a part of this specification.

BACKGROUND OF THE INVENTION

Field of the Invention

The invention relates to an atomic layer deposition (ALD) device and a process thereof for achieving high-quality deposition with high productivity and low gas consumption in the production of electronic devices, such as semiconductors, flat panels, solar cells, and light emitting diodes (LED).

Description of Related Art

Since the atomic layer deposition (ALD) technology was invented as an epitaxial technique by the group of Tuomo Suntola in the 1970s, it has been widely used for the production of electronic devices, such as semiconductor, flat panel, solar cell, and LED, as a high-quality deposition technique to achieve low impurity concentration and highly uniform coverage (step coverage) at low temperature. Especially, as described in Non-patent Literatures 1-4, because high step coverage is required for depositing high dielectric thin films of $Al_2O_3$ or $HfO_2$ in formation of dynamic random access memory (DRAM) capacitors having a high aspect ratio shape where the depth is large with respect to the opening diameter, ALD has become a critical technology that determines the device performance. ALD is also expected to become the key for developing the double pattern technology which can improve the resolution limit capacity of the ArF immersion exposure apparatus as an alternative to the very expensive extreme ultra-violet (EUV) exposure apparatus. Here, a silicon oxide film, which has a thickness of 10-20 nm and has excellent uniformity and favorable step coverage with no dependence on the pattern shape, needs to be deposited on the patterned resist film at a low temperature of about 200° C. or less, which does not deteriorate the organic resist film, and as disclosed in Non-patent Literature 5, the ALD technology of $SiO_2$ film is actively developed for mass production as the solution. Furthermore, formation of high-k/metal gate with use of the ALD technology has become an indispensable technique for manufacturing low power consumption semiconductors that are to be installed in portable terminals or tablet PCs. In semiconductor manufacturing, besides these processes, a number of ALD applicable processes have been developed, such as formation of DRAM capacitor upper and lower electrodes using metals, e.g. TiN and Ru (Non-patent Literatures 6-10), formation of gate electrode side wall using SiN, formation of barrier seed in contacts and through holes, and formation of high-k insulating film and the charge trap film for NAND flash memory, and are expected to become the key technologies in the future. In the areas of flat panels, LEDs and solar cells, research and development works for applying ALD, which achieves high step coverage and low-temperature processing, to ITO film formation or passivation film formation have also begun.

Single-substrate ALD equipment and batch furnace equipment have been the mainstream of ALD apparatuses. Especially, for forming high-k/metal gate, it is necessary to sequentially perform plasma oxynitridation of the silicon substrate or metal deposition in the same vacuum atmosphere as high-k ALD. Thus, the single-substrate ALD apparatus is widely used as one chamber installed in the cluster type system. In contrast, the batch furnace ALD equipment is most popular for forming the high-k insulating film of DRAM capacitor.

However, both the single-substrate ALD equipment and the batch ALD equipment have much lower productivity with a throughput of about 20 WPH (wafers per hour) or less, compared to other film deposition techniques. It is attributed to the essential defect of switching ALD, which alternately introduces gases into the process chamber by opening and closing the respective gas valves such that the metal-containing material gas and the non-metal gas, such as ozone, are not mixed in the reaction container, so as to deposit multiple atomic layers. For example, in the single-substrate ALD deposition of TiN, one ALD cycle includes 8 steps, which are vacuum evacuation, Ti precursor feeding, vacuum evacuation, purge gas feeding, vacuum evacuation, $NH_3$ feeding, vacuum evacuation, and purge gas feeding. In each step, the valve switching, the process chamber pressure stabilization, and each reaction take about 1 second in total. Therefore, several seconds or more are consumed for completing one ALD cycle. As disclosed in Non-patent Literature 1, the amount of increase of the TiN film thickness in one single ALD cycle is ¼ TiN layer, which is about 0.1 nm, due to the steric hindrance among the precursors. Accordingly, when using the single-substrate ALD, it takes hundreds of seconds to form the 10 nm thick TiN layer. Thus, the throughput per process chamber is only about 4 WPH. Assuming that 4 process chambers are equipped on one deposition apparatus system, the total throughput can be only 16 WPH. Batch ALD, on the other hand, may contain about 100 substrates in one process chamber furnace. However, as the volume of the chamber furnace is increased dozens of times or more, the time required for gas supply and vacuum evacuation also becomes dozens of times more, and one ALD cycle would usually take several minutes. If the gas supply and vacuum evacuation are performed at a speed higher than this, gas replacement may be incomplete and particles may be generated by the reaction of the gas mixture. Then, it would take several hours to deposit 10 nm thick TiN films even with the batch ALD using furnace, which results in the throughput of about dozens of substrates per hour, almost equivalent to the single-substrate ALD system.

In order to enhance the throughput of these switching ALD processes, stacked or rotating semi-batch ALD devices have been in development in recent years. The stacked ALD, as seen in Patent Literature 1 or 2 for example, is a method of stacking several single-substrate ALD process chambers in the vertical direction and switching all the chambers at the same timing. Even though the stacked ALD improves the throughput several times compared to the single-substrate ALD chamber, it has not been used widely in the industry because of the high equipment manufacturing costs. The rotating semi-batch ALD device, on the other hand, includes a rotating table which circumferentially carries a plurality of substrates being processed, and a plurality of reaction gas and purge gas supply means which are disposed in a sector shape in an upper space of the rotating table. Each substrate is exposed sequentially to the gases through rotation the rotating table, so as to carry out the ALD processes. As the rotating ALD requires no gas switching that accompanies the gas supply and vacuum evacuation, which are essential for the conventional switching ALD, high-speed deposition is possible. Moreover, since the switching gas valves are unnecessary, the equipment manufacturing costs may be reduced. Now development of mass production of such rotating semi-batch ALD is in progress.

The first patent application for a rotating semi-batch ALD device was filed in 1990 (Patent Literature 3), in which a large cylindrical vacuum container is divided into four sector-shaped sub-chambers that are two reaction gas chambers and two purge gas chambers disposed between the reaction gas chambers, and a reaction gas supply means is disposed above the central part of each sub-chamber and a gas exhaust part is disposed at a lower part of the two purge gas chambers. By rotating a disk-shaped table, a plurality of substrates being processed on the table pass through the respective chambers for carrying out ALD deposition. This invention became the prototype of the rotating semi-batch ALD devices thereafter. In this configuration, however, each sub-chamber has a large volume and the gas supply part is disposed only at the central part of each sub-chamber. Therefore, the flow of the reaction gas and the purge gas becomes uneven or locally stagnant. The uneven or stagnant gas flow may result in insufficient ALD reaction and poor step coverage, and the residual gas may be mixed with other reaction gases and cause generation of particles.

Since then, various improvements have been made to the rotating semi-batch ALD and may be categorized into four types according to the reaction gas separation methods. The first type is a partition wall separation ALD device, in which the vacuum container is divided into relatively large sub-chambers by partition walls, the same as Patent Literature 3, and the gas supply/exhaust method is improved to make the reaction gas or the purge gas flow evenly in each sub-chamber. Patent Literatures 4-7 provide specific examples. In Patent Literature 4, a vacuum evacuation chamber is arranged between the reaction gas sub-chambers, such that the reaction gas flows uniformly from the reaction gas sub-chambers toward the vacuum evacuation chamber. In Patent Literature 5, a purge gas chamber is disposed between the reaction gas chambers to cause the purge gas to flow from the center to the peripheral direction, so as to enhance the separation of the reaction gases. In addition, in Patent Literature 6, the purge gas is ejected from the partition walls that surround the reaction gas sub-chambers to improve gas separation. However, these partition wall separation ALD devices are unable to sufficiently reduce uneven flow or stagnant reaction gas because of the large volume of the sub-chambers. Thus, it is difficult to completely solve the problems of low coverage and particles in Patent Literature 1. In Patent Literature 7, the vacuum container is divided into four sub-chambers and the gas supply means connected to each sub-chamber is provided with a switching function to supply the reaction gas or the purge gas in a pulse-like manner, by which one sub-chamber may be used as the reaction chamber or the purge chamber. With this configuration, the gas separation performance is improved and the types of the reaction gases may be varied to achieve deposition of multiple atomic components. Nevertheless, since it is required to perform gas exhaust and supply following the gas switching, the ALD cycle time becomes very long.

The second type of the rotating semi-batch ALD devices is a gas curtain ALD device, in which the purge gas flows like a curtain between the reaction gas supply means to reduce mixture of the reaction gases. Patent Literatures 8-11 provide specific examples. In Patent Literatures 8 and 9, the purge gas is streamed downwards from the top to prevent mixture of the reaction gases. In Patent Literature 10, the purge gas flows upwards from the bottom to the top to form the gas curtain. Moreover, in Patent Literature 11, a reaction gas nozzle and a purge gas nozzle are arranged alternately and radially and rotated, so as to alternately supply the reaction gas and the purge gas to each substrate. Such gas curtain ALD has the advantage of simpler structure in comparison with the partition wall separation ALD device, but is inferior in gas separation and thus particles caused by mixture of the reaction gases may occur easily.

The third type of the rotating semi-batch ALD devices is a micro-reactor ALD device, where the functions of gas supply and exhaust are integrated into a compact rectangular reactor having a width of about several centimeters, and by preventing the reaction gas from leaking outside the reactor, the gas separation function is enhanced. A plurality of such reactors are disposed and different reaction gases or purge gases are supplied to the respective reactors, and the gases are exhausted by the adjacent part so as to achieve favorable gas separation performance. Patent Literatures 12-15 provide specific examples. Patent Literature 12 was filed in 1979 and became the prototype of such micro-reactor, which discloses a structure that a first reaction gas nozzle, a first purge gas nozzle, a second reaction gas nozzle, and a second purge gas nozzle are arranged linearly through the respective exhaust ports. Patent Literature 13 adopts a structure in which a plurality of rectangular micro-reactors with one single gas supply and exhaust function are disposed radially in the vacuum container. By using the reaction gas as an etching gas, not only deposition, etching, pre-deposition treatment, or film modification after deposition is also possible. In Patent Literature 14, a first reaction gas nozzle, a first purge gas nozzle, a second reaction gas nozzle, a second purge gas nozzle, and the exhaust ports disposed between the nozzles constitute one compact sector-shaped ALD reactor, and a plurality of such ALD reactors are arranged radially and sequentially. Moreover, in Patent Literature 15, the first reaction gas is charged into a large vacuum container, and the second reaction gas and the purge gas are supplied and exhausted from the rectangular micro-reactors that are disposed radially. This configuration does not require the micro-reactor of the first reaction gas and simplifies the structure. These micro-reactor ALD devices may significantly improve gas separation compared to other types of rotating ALD devices.

However, with the micro-reactor structure, the trade-off between productivity and the step coverage becomes more serious, compared to other ALD types due to the narrower width of the micro-reactor. For example, in the case where the width of one micro-reactor is several centimeters, even if the rotation speed of the table is as low as about 30 RPM, the exposure time to the reaction gas is as short as dozens of milliseconds, which is too short to achieve sufficient ALD reaction and consequently the step coverage is low. Particularly, for the second reaction gas that does not include a metal, because the ALD deposition usually requires more than 100 ms, the short exposure time is a big problem. The rotation speed may be lowered to increase the exposure time and more micro-reactors may be arranged to improve the productivity, but the productivity drops instead. The reason is explained below. It is known that, in the ALD process, the relationship between the exposure time of the substrates being processed to the reaction gas and the deposition rate of one single ALD cycle is as shown in FIG. 1, wherein when the exposure time is short, the deposition rate increases linearly to the exposure time; and when the exposure time exceeds a certain time, the deposition rate is saturated and becomes a constant value. This saturation phenomenon corresponds to a state where all the adsorption reaction sites on the surface of the substrates being processed are covered with the reaction gas. The time when the deposition rate begins to saturate may be defined as an ALD saturation reaction time and the region where the deposition rate is saturated and becomes constant may be defined as an ALD saturation reaction region. In the rotating semi-batch ALD device, if the number of the substrates being processed on the rotating table is n, the number of the micro-reactors is q, and the rotation speed of the rotating table is r rpm, when depositing a film with a thickness of A nm at the deposition rate of a per minute in one single ALD process (nm/cycle), the throughput W is calculated by W=60 nqra/A (WPH). When the rotation speed is sufficiently low and the ALD reaction falls in the saturation reaction region (equivalent to the point A in FIG. 1), the throughput is proportional to the product of the number n of the substrates being processed and the number q of the micro-reactors according to the above equation. Therefore, the throughput is improved as the number of the substrates being processed on the rotating susceptor and the micro-reactors increases. However, under the condition that the exposure time usually used in the micro-reactor is dozens of milliseconds, the reaction is in operation between the ALD unsaturation reaction region (the point C in FIG. 1) and the limit region where the ALD saturation reaction is obtained (the point B in FIG. 1). In the ALD unsaturation reaction region, the exposure time is reduced as the number of the micro-reactors q increases, and consequently the ALD deposition rate a decreases. For this reason, the throughput W does not increase even though the number of the micro-reactors q is increased. Each micro-reactor requires a minimal gas separation. As the number of the micro-reactors q increases, the area that the gas separation region occupies in the reaction gas supply unit is relatively increased. Correspondingly, the time of contact with the reaction gas is shortened. Therefore, the trade-off between the throughput and the step coverage becomes more serious. For the rotating semi-batch ALD device, it is advantageous to dispose fewer gas supply units that occupy a relatively large area, rather than arranging more micro-reactors, in view of the trade-off between productivity and step coverage.

The fourth type of the rotating semi-batch ALD devices is a narrow gap gas dispersion ALD device, which includes a pair of first and second reaction gas supply units and a purge gas region disposed between the reaction gas supply units, wherein a dispersion plate is attached to the gas supply nozzle, and a shower plate is used to make the reaction gas and the purge gas flow uniformly in a narrow gap space between the gas nozzle and the substrate. This configuration makes it possible to perform operations at a higher rotation speed than the micro-reactor configuration and the productivity is expected to improve. The series of inventions of Patent Literatures 16-21 and Patent Literature 22 provide specific examples. In the series of inventions of Patent Literatures 16-21, the gas dispersion plates are arranged adjacent to the reaction gas and the purge gas. Also, various works are made to improve the gas flow uniformity by setting the purge gas temperature to a high temperature, increasing the circumferential length of the second reaction gas dispersion plate relative to the circumferential length of the first gas reaction gas dispersion plate, arranging the gas nozzle ejecting hole to face forward, disposing the purge gas rectification plate close to the reaction gas nozzle, optimizing the position of the exhaust hole, and so on. Moreover, in Patent Literature 22, sector-shaped shower plates are used to replace the gas nozzles of the reaction gas and the purge gas, and a gas exhaust region that is narrow in width is disposed between the shower plates and the gases are exhausted from a few exhaust holes. Such narrow gap gas dispersion ALD configurations yield high throughput but are disadvantageous in significantly increasing the gas consumption to about dozens of SLM, which raises the consumption material costs. In addition, these gas dispersion configurations have a drawback that the reaction gas utilization efficiency is as low as 0.5%, and more than 99.5% of the reaction gas is discharged without being used.

Furthermore, the high gas flow induces another problem. That is, when a large gas flow is generated in one direction on the substrates being processed, a pressure difference occurs between two ends of the substrate and causes the substrate to float up. This problem may easily cause the substrates being processed to float especially when forming a film with high compressive stress. If the substrate floats, the substrate may hit the upper gas supply part and be damaged. Thus, when the gas flows at a high flow rate in one direction on the substrates being processed, the process reliability of the manufacturing device is seriously affected.

Moreover, according to the inventions of the narrow gap gas dispersion ALD devices as disclosed in the series of Patent Literatures 16-21, the table that holds the substrates being processed is rotated at a high speed of about 300 RPM, in order to achieve high productivity. Due to the high-speed rotation, the exposure time of the substrates to the reaction gas is 100 ms or shorter, which results in the state that does not reach the ALD saturation reaction region, as indicated by the point C in FIG. 1. In such a case, the problem of low step coverage becomes worse for trenches or holes with a high aspect ratio.

PRIOR ART LITERATURE

Patent Literature

Patent Literature 1: U.S. Pat. No. 5,711,811.
Patent Literature 2: US Patent Publication No. 2010-0098851.
Patent Literature 3: U.S. Pat. Nos. 5,225,366 and 5,281,274.
Patent Literature 4: U.S. Pat. No. 3,144,664.
Patent Literature 5: U.S. Pat. No. 6,972,055.
Patent Literature 6: US Patent Publication No. 2007-247066 and US Patent Publication No. 2007-0218702.
Patent Literature 7: US Patent Publication No. 2008-0075858.
Patent Literature 8: U.S. Pat. No. 6,576,062.
Patent Literature 9: US Patent Publication No. 2003-0194493.
Patent Literature 10: US Patent Publication No. 2002-0043216.
Patent Literature 11: Japanese Patent Publication No. H04-287912.
Patent Literature 12: U.S. Pat. No. 4,413,022.
Patent Literature 13: U.S. Pat. No. 7,153,542.
Patent Literature 14: U.S. Pat. No. 6,821,563.
Patent Literature 15: US Patent Publication No. 2010-0041213.
Patent Literature 16: Japanese Patent Publication No. 2010-56470.
Patent Literature 17: Japanese Patent Publication No. 2010-56471.
Patent Literature 18: Japanese Patent Publication No. 2011-124384.
Patent Literature 19: Japanese Patent Publication No. 2011-134996.

Patent Literature 20: Japanese Patent Publication No. 2011-74593.
Patent Literature 21: Japanese Patent Publication No. 2011-89561.
Patent Literature 22: Korean Patent Publication No. 2007-0085761.
Patent Literature 23: Japanese Patent Publication No. 2007-533153 and U.S. Pat. No. 7,604,439.
Patent Literature 24: Japanese Patent Publication No. 2011-519796 and U.S. Pat. No. 6,523,572.

Non-Patent Literature

Non-patent Literature 1: W. Ott; Thin Solid Films, Vol. 292, No. 1-2, p 135 (1997), "Al3O3 Thin Film Growth on Si (100) Using Binary Reaction Sequence Chemistry".
Non-patent Literature 2: Y. Widjaja; Appl. Phys. Lett. Vo. 80, p 18 (2002), "Quantum Chemical Study of the Mechanism of Aluminum Oxide Atomic Layer Deposition".
Non-patent Literature 3: Y. K. Kim; IEDM Tech Digest 369 (2000), "Novel Capacitor Technology for High Density Stand-Alone and Embedded DRAMs".
Non-patent Literature 4: R. Matero; Thin Solid Films, Vol. 368, p 1 (2000), "Effect of Water Dose on the Atomic Layer Deposition Rate of Oxide Films".
Non-patent Literature 5: S. George; Applied Surface Science, Vol. 82, p 460 (1994), "Atomic Layer Controlled Deposition of SiO2 and Al2O3 Using ABAB . . . Binary Reaction Sequence Chemistry".
Non-patent Literature 6: L. Hiltunen; Thin Solid Films, Vol. 166, p 149 (1988), "Nitride of Ti, Nb, Ta and Mo Growth at Thin Films by ALE Method".
Non-patent Literature 7: R. Hedge; Vac. Sci. Technol. B11, p 1287 (1993), "Thin film properties of low-pressure chemical vapor deposition TiN barrier for ultra-large-scale integration applications".
Non-patent Literature 8: M. Ritala; Electrochem. Soc. Vol. 145 (8), p 2914 (1998), "Atomic Layer Epitaxy Growth of TiN Thin Films from TiI4 and NH3".
Non-patent Literature 9: Y. S. Kim; J. Korean Physical Society, Vol. 37 No. 6, p 1045 (2000), "Atomic-Layer Chemical Vapor-Deposition of TiN Thin Films on Si(100) and Si(111)".
Non-patent Literature 10: H. Kim; J. Vac. Sci. Tech. B, Vol. 21, p 2231 (2003), "Atomic Layer Deposition of Metal and Nitride Thin Films: Current Research Efforts and Applications for Semiconductor Device Processing".
Non-patent Literature 11: R. G. Gordon; Chem. Vapor Deposition, Vol. 9, pp 73 (2003), "Kinetic Model for Step Coverage by Atomic Layer Deposition".

SUMMARY OF THE INVENTION

Problem to be Solved

In view of the aforementioned issues, the invention provides technologies to achieve the rotating semi-batch ALD device and process with high throughput, low particle contamination, low gas consumption, and high step coverage.

Solution to the Problem

The invention includes six embodiments made based on findings with respect to a rotating semi-batch ALD device and an ALD process, wherein the rotating semi-batch ALD device includes a vacuum container, a rotating susceptor, a plurality of substrates being processed disposed on the susceptor, a substrate heating heater disposed right under the substrates being processed, a plurality of sector-shaped reaction gas supply means disposed in an upper portion of the vacuum container, a purge gas supply means disposed between the reaction gas supply means to separate reaction gases, and a vacuum evacuation means provided as an independent separate system to each gas supply means, and an ALD deposition is performed by repeatedly exposing the substrates being processed to the reaction gases sequentially through rotation of the susceptor. Each embodiment of the invention achieves significant effects alone, and any two or more embodiments may be combined to further improve the effects.

(1) In the rotating semi-batch ALD device, at least one reaction gas supply means includes a shower plate ejecting the gas uniformly, a cavity allowing the gas to flow down, and a partition wall surrounding the cavity; and the purge gas supply means includes a shower plate setting a space between the purge gas supply means and the substrates being processed to a narrow gap to cause the gas to flow uniformly at a high flow speed in a transverse direction in the space, so as to optimize the gas supply means and improve productivity and step coverage.

(2) In the rotating semi-batch ALD device, each of the reaction gas and purge gas supply means has a structure surrounded by a vacuum evacuation groove to independently and partially exhaust the reaction gas and the purge gas, so as to improve gas separation.

(3) In the rotating semi-batch ALD device, the reaction gas supply and exhaust means are separated by a diameter of the substrates being processed or more, such that two gas supply means are not moved to be above the same substrates being processed, so as to reduce particle generation and improve gas separation.

(4) In the rotating semi-batch ALD device, an air bearing mechanism of the purge gas supply means is combined with other holding means, such as a spring and disposed in an upper gas supply means or the rotating susceptor to accurately control a gap between a lower end of the upper gas supply means and the substrates being processed, so as to reduce gas consumption.

(5) The rotating semi-batch ALD device and an ALD sequence thereof are characterized in that a relative position relationship between the substrates being processed and the gas supply part when the ALD starts and ends and/or a substrate susceptor rotation speed is adjusted according to the number of the substrates being processed or a configuration of the gas supply means, so as to perform the same number of ALD cycles for the same time on all the substrates being processed.

(6) In the rotating semi-batch ALD device, an ALD saturation reaction time is calculated based on a maximum aspect ratio (the ratio of the depth to the width of a hole or trench) of a pattern formed on the surface of the substrates being processed and the substrate rotation speed is controlled such that the surface of the substrates being processed is exposed to the reaction gas longer than the calculated saturation reaction time, so as to achieve both high step coverage and high productivity.

Embodiments of the invention are described in detail hereinafter.

First, the first embodiment of the invention is described. The ALD reaction is carried out by alternately exposing the substrates being processed to the metal-containing reaction gas and the non-metal reaction gas. For example, the ALD reaction of TiN using $TiCl_4$ and $NH_3$ may be expressed by the following two-step reaction. Here, the metal-containing reaction gas is usually an organic metal compound or a metal halogen compound. A material whose vapor pressure at the processing temperature is equal to or greater than the process pressure is selected. Generally, metals such as Si, Ti, Hf, Zr, Ru, Ta, and Sr are used for semiconductor manufacturing, but the invention is not particularly limited thereto, and the metals may be selected according to the atoms that constitute the target film. Ozone, $O_2$, $NH_3$, $N_2$, Hz, etc. are used as the non-metal reaction gas depending on the deposition material. Similarly, the invention is not limited to the foregoing non-metal reaction gases, which may be selected according to the atoms that constitute the target film.

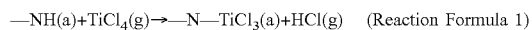
(Reaction Formula 1)

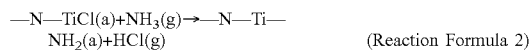
(Reaction Formula 2)

Here, a and g in the parentheses represent the state of the material, wherein a corresponds to the surface adsorption state and g corresponds to the gaseous state. In the ALD process, first, $TiCl_4$ (i.e. the metal-containing reaction gas) is physically adsorbed to —NH (i.e. the non-metal gas) which is adsorbed in the lower layer by a weak bonding force mainly due to a Van der Waals force according to Reaction Formula 1, and then chemically bonded to the nitrogen atom by a Lewis acid-based reaction. In this case, the metal-containing reaction gas molecules are large in molecular diameter and may not be adsorbed to all the nitrogen atoms due to the steric hindrance. In the typical ALD deposition, the metal-containing gas molecules are adsorbed at a ratio of about one nitrogen atom among four nitrogen atoms. Thereafter, in the second step shown by Reaction Formula 2, ammonia gas molecules $NH_3$ (i.e. the non-metal reaction gas) chemically react with the adsorbed —N—Ti—Cl and are bonded to Ti atoms. Both Reaction Formulas 1 and 2 are chemical adsorption reactions including the exchange in the bonds on the substrate surface, and HCl is generated as the reaction product. In almost all ALD reactions, the reaction of the second step requires larger excitation energy than the reaction of the first step. Therefore, in almost all ALD reactions, the second step shown by Reaction Formula 2 limits the speed of the whole ALD reaction. The reaction rate $R_2$ of Reaction Formula 2 may be expressed by the following equation.

$$R_2 = k_2(1-\theta)P_{NH3} - k_{-2}\theta P_{HCl} \quad \text{(Equation 1)}$$

Here, θ represents the ratio of reaction adsorption sites of —N—Ti—Cl(a) surface to which $NH_3$ gas is not chemically adsorbed. In addition, $k_2$ and $k_{-2}$ represent the reaction rate constants of the forward reaction (adsorption reaction) and the backward reaction (elimination reaction) in the second step reaction, and $P_{NH3}$ and $P_{HCl}$ indicate the partial pressures of the $NH_3$ gas and HCl gas. According to this equation, it is known that an effective way to increase the reaction rate is to raise the $NH_3$ gas partial pressure and increase the gas flow rate, so as to exhaust HCl quickly to lower the HCl gas partial pressure. On the other hand, a large number of reports suggest that in fact almost all ALD reactions may be relatively well approximated by the Langmuir isothermal adsorption equation. It implies that Reaction Formula 2 is in an equilibrium state or in a state near equilibrium and the reaction rate of forward and backward reactions are substantially equivalent to each other. Then, the ratio θ of the adsorption sites may be expressed as the function of the partial pressures of HCl gas and $NH_3$ gas in the following equation.

$$\theta = k_2 P_{NH3}/(k_2 P_{NH3} + k_{-2} P_{HCl}) \quad \text{(Equation 2)}$$

θ is proportional to $P_{NH3}$ when $P_{NH3}$ is small, and the ratio of the adsorption sites becomes saturated at θ≈1 when $P_{NH3}$ is large, which follows the Langmuir adsorption saturation curve behavior.

Here, the most important thing is that, in order to achieve high step coverage, it is necessary to maintain all the adsorption sites in the saturated state, that is, to maintain the ideal ALD reaction of θ=1. It implies that the equilibrium of Reaction Formula 2 is shifted greatly to the forward reaction direction, and $K_{-2}\theta P_{HCl}$, i.e. the second item on the right of the equation 1, is so small and negligible. That is, in the ALD reaction for the desired real manufacturing process, despite that a considerable amount of HCl (i.e. the reaction product of the second step reaction) exists, the backward reaction may be ignored and the reaction rate $R_2$ is simplified as the following equation.

$$R_2 = k_2(1-\theta)P_{NH3} \quad \text{(Equation 3)}$$

Consequently, the reaction rate of the practical ALD reaction is proportional only to the ratio of non-adsorption sites (1−θ) and the reaction gas partial pressure $P_{NH3}$. Thus, it is not required to increase the reaction gas flow rate, and the ALD reaction is carried out only through exposure to high-concentration reaction gas. Therefore, it is applicable not only to the ALD deposition of TiN but also to almost all ALD processes. Moreover, it is known that the reaction involving the metal-containing reaction gas shown in Reaction Formula 1 also has the same reaction mechanism. From the above, it is concluded that, for improving the reaction rate of the ALD reaction, it is important to disperse the substrates being processed uniformly and using high-concentration reaction gases as the material, and there is no need to increase the gas flow rate.

Secondly, an important finding is that the mean free path is about dozens of microns to two millimeters at the pressure of 0.1 Torr to several Torr, which is commonly used in the ALD process. For example, with a reaction gas nozzle including a few gas ejection holes with a pitch of 10 mm or more, it is difficult to supply the reaction gas at a uniform high concentration to the substrate to every corner of the sector-shaped gas supply means. Also, it is found that the reaction gas may be stagnant at corners of the gas supply part away from the gas nozzle for a long period of time, causing gaseous phase reaction with the other reaction gases and resulting in generation of particles. Based on the aforementioned two findings with respect to the ALD reaction and the gas flow, in the invention, the reaction gas supply means has a configuration that includes: a shower plate having gas ejection holes with a uniform pitch, a cavity allowing the ejected reaction gas to flow down moderately to be supplied uniformly to the substrates being processed, and a substantially vertical partition wall surrounding the cavity.

On the other hand, regarding supply of the purge gas, it is required to completely discharge the unreacted gas and the reaction product gas that remain in the extremely fine holes or trench pattern, which has dimensions of about 10 nm and is engraved on the surface of the substrates being processed, in a general exposure time i.e. a short period of time of about 100 ms or less. It is found that, in this case, a slow down flow is inadequate, and it is preferred to increase the gas flow rate of the purge gas flowing through the substrates being processed as much as possible on every portion of the substrate. For example, when a nitrogen gas at a pressure of 1 Torr is used as the purge gas, its gas density is $1.5 \times 10^{16}$ cm$^{-3}$, and the nitrogen gas diffusion flux to the substrates being processed is $3 \times 10^{20}$ cm$^{-2}$ s$^{-1}$. Provided that the rotation speed of the substrates being processed is 30 revolutions per minute and the area ratio of one purge gas supply part in the gas supply means is ⅛, the purge gas exposure time of the substrates being processed in one purge gas supply part is 250 ms. In this period of time, the number of the nitrogen gas molecules that flow into the hole with a diameter of 32 nm and an aspect ratio of 100 through diffusion is $5\times10^8$ s$^{-1}$ per second. In addition, the number of the residual reaction gas molecules inside the hole may be estimated to be 40 or so. Therefore, while the substrates being processed is in contact with the purge gas, a nitrogen gas that is about $10^7$ times the residual gas molecules is supplied to flow into the hole. In the general rotating semi-batch ALD device, basically the purge gas exposure time does not limit the rotation speed, but the exposure time with respect to the reaction gas would limit the speed. However, if there is residual reaction gas in the purge gas space, the residual reaction gas molecules may enter the hole again and reduce the substitution effect. In the case of manufacturing a gigabit DRAM device, since there are $1\times10^{11}$ holes or more existing in the substrates being processed having a diameter of 300 mm, the drop in the substitution effect results from the particles in the holes, which causes bit failure. Therefore, in order to fully achieve the substitution effect for replacing the residual gas in the hole, it is important to discharge the reaction gas remaining in the purge space as quickly as possible. As a matter of fact, it is found that an effective way to reduce the residual gas is to increase the flow rate of the purge gas on surface of the substrates being processed. In the invention, the spatial gap relative to the substrates being processed is minimized to increase the purge gas flow rate in the transverse direction, so as, to improve the reaction gas substitution effect by the purge gas.

Regarding the ejection method of the purge gas in the sector-shaped gas supply part, it is known that, like the ejection method of the reaction gas, the gas flow may be biased or stagnant in the gas nozzle with a few gas ejection holes and incomplete gas substitution may occur. Further, it is found that, in order to uniformly disperse the purge gas in the purge gas supply part, it is preferred to set the interval of arrangement of the gas ejection holes to a distance that is several times or less the mean free path of the purge gas. Basically, the pressure of the ALD process is about 0.1 Torr or more, and the mean free path of the nitrogen molecules under this pressure is about 2 mm or less. Thus, in the invention, the purge gas ejection means adopts a shower plate structure having a uniformly disposed pitch of 10 mm or less. It is found that, with the narrow gap and the shower plate structure having the narrow pitch, the substitution and discharge efficiency may be improved by increasing the purge gas flow rate on every portion of the substrate surface and reducing the concentrations of the unreacted gas and the reaction product gas on the substrate surface.

As described above, in the rotating semi-batch ALD device of the first embodiment of the invention, at least one reaction gas supply means includes a shower plate uniformly discharging the gas, a cavity allowing the gas to flow down, and a partition wall surrounding the cavity, and the purge gas supply means includes a narrow-gap and narrow-pitch shower plate for supplying the purge gas uniformly at a high flow rate in the transverse direction in the space between the purge gas supply means and the substrates being processed.

Next, the second embodiment of the invention is described. The second embodiment is characterized in that, in the rotating semi-batch ALD device, each of the sector-shaped reaction gas supply means and the purge gas supply means is surrounded by a vacuum evacuation groove, which is a separate system respectively. Conventionally, in most rotating semi-batch ALD devices except for the micro-reactor type, each reaction gas is discharged from the bottom of the vacuum container through the gap between the rotating susceptor and the vacuum container wall. In this method, the reaction gases may be mixed at the bottom of the vacuum container and the exhaust line and generate particles. Besides, mixing of the reaction gas and the purge gas may also occur and impair the gas separation effect. On the other hand, in the micro-reactor ALD device, a vacuum evacuation groove is disposed between the reaction gas nozzle and the purge gas nozzle to achieve a better gas separation effect and low particle generation. In the conventional micro-reactor semi-batch ALD device, however, the vacuum evacuation groove is disposed only between the reaction gas supply part and the adjacent purge gas supply part, and no independent vacuum evacuation groove is provided on the central side or the outer peripheral side of the reaction gas supply part. Consequently, a portion of the reaction gas flows toward the outer periphery direction during high-speed rotation and causes leakage from the micro-reactor. Therefore, the vacuum evacuation grooves are disposed not only between the sector-shaped reaction gas supply part and the purge gas supply part but also on the central side and the outer peripheral side of the reaction gas supply part and in both the reaction gas supply means and the purge gas supply means for examining particle generation and the gas separation effect. The result shows that the vacuum evacuation grooves on the central side and the outer peripheral side play an important role in gas separation, the same as the vacuum evacuation grooves between the reaction gas supply part and the purge gas supply part. It is found that, by further disposing the vacuum evacuation grooves in the outer periphery of the purge gas supply part, unidirectional gas flow is suppressed to reduce disturbance between the gases and further enhance the gas separation effect. Further, it is found that because the reaction gas supply parts are close to each other in the central portion, the purge gas supply part surrounded by the vacuum evacuation groove in the central portion is required. In view of the foregoing results, in the invention, the sector-shaped reaction gas supply parts arranged side by side in the circumferential direction, the purge gas supply parts disposed between these reaction gas supply parts, and the purge gas supply part disposed in the center are all surrounded by the vacuum evacuation grooves, so as to achieve the best reaction gas separation characteristics. It is also found that, by disposing the vacuum evacuation grooves to surround all the purge gas supply means, the purge gas may flow in four directions to perform gas substitution more efficiently, and floating of the substrate caused by unidirectional flow may also be prevented.

Hereinafter, the third embodiment of the invention is described. The step that limits the rate of productivity of the ALD process is the time of exposure of the substrate to the reaction gas, especially the non-metal reaction gas. Generally, the time of contact between the purge gas and the substrates being processed does not limit the rate of ALD reaction. Accordingly, in the upper gas supply means, it is desirable to make the area occupied by the purge gas supply part as small as possible and correspondingly maximize the area occupied by the reaction gas supply part. Nevertheless, if the area occupied by the purge gas supply unit is too small, the gas separation effect of the metal reaction gas and the non-metal reaction gas may be low and two reaction gases may be mixed to cause particle generation. Thus, the width of the intermediate portion of the sector-shaped purge gas supply and exhaust means is changed to ¼, ½, ¾, and 4/4 of the diameter of the substrates being processed, and the increase of the particles on the substrates being processed at these moments is measured. The result is that, on the surface of the substrates being processed, no increase of particles is observed even when the width of the intermediate portion of the purge gas supply and exhaust means is ¼ of the diameter of the substrates being processed. However, an obvious increase in particle number is observed on the rear surface of the substrates being processed, especially at the edge around the rear surface of the substrate, when the number of the substrates that have been processed exceeds 1000. No significant drop in the particle number is observed even when the width of the intermediate portion of the purge gas supply and exhaust means is increased to ½ and ¾ of the diameter of the substrate. However, particle generation on the rear surface is hardly observed when the width of the intermediate portion of the purge gas supply and exhaust means is equal to or greater than the diameter of the substrate. It is inferred from the above observations that the cause of the particle generation lies in: when the substrates being processed is disposed in the recess of the rotating susceptor, the reaction gas diffuses along the groove formed between the recess and the substrate or remains between the substrate and the susceptor, and these gases are mixed and react with other reaction gases in the gaseous phase and the reaction products generated therefrom adhere to the susceptor and grow. Then, the reaction products may peel off due to physical contact or friction with the substrate and become the particles. If the intermediate width of the purge gas supply and exhaust means is equal to or greater than the diameter of the substrate, the metal-containing reaction gas and the non-metal reaction gas are not mixed in the groove, and therefore particle generation does not occur. Thus, in the invention, different reaction gas supply means are separated by the purge gas supply and exhaust means for a distance equal to or greater than the diameter of the substrates being processed, such that two gas supply means do not come above the same substrate, so as to improve the gas separation efficiency.

Next, the fourth embodiment of the invention is described. In the rotating semi-batch ALD device as disclosed in the first and second embodiments of the invention, if the gap between the lower end of the partition wall surrounding the cavity of the reaction gas supply means and the substrates being processed is small, the reaction gas supply amount for maintaining the partial pressure of the reaction gas at the process pressure is small. In addition, for the purge gas supply means, as the gap becomes small, the gas flow rate on the surface of the substrates being processed is increased and the gas supply flow rate required for gas separation decreases. In any case, the gas consumption of the ALD device may be reduced as the gap becomes smaller. However, in the rotating semi-batch ALD device, the rotating susceptor or the gas supply means disposed thereon may usually have a diameter of 1 meter or more and the weight may be dozens of kilograms, and shape distortion may occur correspondingly due to expansion of the material at a high temperature, dead weight, or pressure difference. For this reason, although it is desirable to control the gap within the range of a few millimeters, it is not easy to perform such control constantly in the ALD process. Patent Literatures related to the conventional rotating semi-batch ALD devices have not provided any effective solution to deal with this issue.

The following method is considered a general gap control means using the existing technology, that is, attaching one single or a plurality of laser beam sources to the upper gas supply means, irradiating the substrates being processed with the laser beam, optically measuring the distance to the substrates being processed based on the phase deviation of the incident light and the reflected light, and feeding the measured value back to the stepping motor that vertically drives the rotating susceptor in real time. A worm gear, a planetary gear, or a rack-and-pinion is used for conversion between the rotational movement of the stepping motor and the vertical movement of the susceptor. Since the rotation accuracy of the stepping motor is very accurate, which is about 0.05°, it is possible to control the gap with an accuracy of millimeters. Nevertheless, it is difficult to ensure the parallelism between the rotating susceptor and the upper gas supply means and the gap varies depending on the locations. Therefore, it is difficult to control the gap to be several millimeters or less at all positions of the substrates being processed.

The issue described above may be solved if there is technology for accurately floating the upper gas supply means at a distance of millimeters or less. An air cushion technique, which keeps objects floating by ejecting gas from fine pores, has been known as a narrow gap floating means, and it has been practically used as a contact-less transporting technology for liquid crystal glass substrates or a semiconductor silicon substrates. If the gap is small, the gas ejection pressure rises and causes a larger differential pressure. Consequently, a force that enlarges the gap is applied automatically. Thus, the air cushion has an automatic gap control function for maintaining the gap uniformly at all locations. In recent years, as devised in Patent Literature 23 and Patent Literature 24, a technique that alternately arranges gas discharge holes and gas ejection holes to improve the stable floating retention characteristics in the gap has also been developed. However, the air cushion alone may only suspend a weight of about 1.3 $g/cm^2$ at the differential pressure of about 1 Torr, for example, which is inadequate to support the upper gas supply means of dozens of kilograms or more. There are methods that utilize springs or magnets for floating heavy objects, but with these means, it is difficult to accurately control the gap within a few millimeters in real time. Thus, in the invention, a flexible holding means, such as spring, magnet, and/or flexible flange, is used to float and maintain the upper gas supply means, and the purge gas supply part of the upper gas supply means is provided with the air cushion function, so as to provide a gap control means that accurately controls the gap within millimeters for all the substrate surfaces.

The fifth embodiment of the invention is described below. In comparison with other deposition methods such as CVD, the ALD process achieves high uniformity in film thickness and is therefore mainly used in the critical process for forming high-quality thin films that have a thickness of about 10 nm or less and affect the device performance. In the ALD process, the film thickness is increased stepwise per ALD cycle, and generally the amount of increase of the film thickness is about 0.1 to 0.2 nm in one single ALD cycle. Therefore, in many ALD processes, the number of ALD cycles is about dozens to 100. On the other hand, in the rotating semi-batch ALD device, multiple substrates are processed for film deposition simultaneously but the substrates are respectively located in different gas supply parts. Alternatively, the same substrate may be located in different gas supply parts depending on the portions of the substrate. For example, when one substrates being processed is in the metal reaction gas supply part, the other substrates may be located in the purge gas supply part or the non-metal reaction gas supply part, or in another metal-containing reaction gas supply part. Therefore, there are different ALD cycle histories according to the substrates being processed. The ALD cycle numbers differ between the substrates being processed or within the substrates being processed, and a variation in film thickness occurs between the substrates or within the substrate. As a result, in the case of depositing an extremely thin film of 10 nm or less, these variations may reach about 3% by only one ALD cycle, which impairs the advantage of ALD in film thickness uniformity, compared to other CVD methods. For the micro-reactor semi-batch ALD device, since more than one gas supply unit is disposed on one substrates being processed, the problem becomes more serious. Therefore, the rotation speed and the relative positions of the gas supply means and the substrates being processed at the time of starting and cutting off the supply of each reaction gas are adjusted, and the result shows that the same number of ALD cycles and the same exposure time may be maintained for all positions of all the substrates regardless of the number of the substrates or the configuration of the gas supply means. Based on the above examination results, in the invention, the relative position relationship between the substrates being processed and the gas supply part when each reaction gas is supplied or stopped and/or the substrate susceptor rotation speed is controlled according to the number of the substrates being processed or the configuration of the gas supply means, so as to perform ALD of the same film thickness on all positions of all the substrates being processed.

The sixth embodiment of the invention is described below. The reaction rate $R_2$ of the non-metal ALD reaction as indicated in Reaction Formula 2 is shown in Equation 3 and can be described by the first-order reaction in proportion only to the non-adsorption site $\theta$ under a constant pressure. The reaction rate $R_2$ is represented by $d\theta/dt$, and by solving the differential equation, the adsorption site may be represented by a function of time as shown in the following equation. Here, $\gamma$ represents $k_2 P_{NH3}$.

$$\theta = 1 - e^{-\gamma t} \quad \text{(Equation 4)}$$

When the substrates being processed is exposed to $NH_3$ gas, the surface of the substrate is rapidly covered by $NH_x$ adsorbed molecules, which is close to $\theta=1$, and the ALD adsorption reaction is saturated and does not proceed any further. This saturation phenomenon also occurs in the case of Reaction Formula 1. This saturation adsorption characteristic is a feature of ALD that deposits the thin film per atomic layer, which corresponds to the ALD saturation reaction region shown in FIG. 1. It is found that the ALD saturation time at which the ALD saturation reaction region is reached is dependent on the pressure and is about several microseconds in a normal ALD pressure range. For example, in Reaction Formula 1, if the pressure of $TiCl_4$ is 1 Torr, the $TiCl_4$ reaction gas reaches the surface of the substrates being processed through diffusion. The diffusion flux $\varphi TiCl_4$ is represented by the following equation.

$$\varphi TiCl_4 = P/(2\pi mkT)^{0.5} \quad \text{(Equation 5)}$$

Here, P is the partial pressure of the $TiCl_4$ reaction gas. Moreover, T and m respectively represent the temperature of the substrate surface and the molecular weight of the reaction gas. k is the Boltzmann's constant. At the process temperature of 350° C., the reaction gas flux indicated by Equation 5 is about $1\times10^{20}$ (1/cm$^2$ s). Meanwhile, the number of adsorption sites on the surface of the substrates being processed is $1\times10^{15}$ (1/cm$^2$) for most of the substances. The ALD saturation reaction time $T_{s0}$ on the surface of the substrates being processed may be represented by the ratio of the reaction gas flux and the surface adsorption site number, and it is known from the above example that the saturation state of Equation 4 is reached in about 10 μs.

On the other hand, because the number of the gas molecules that reach the inside of the hole or trench with a high aspect ratio is small, the saturation reaction time $t_s$ is longer than the saturation reaction time $t_{s0}$ at the surface. The latest DRAM stack capacitor has a hole diameter of 30 nm or less, a depth of about 3 μm, and an aspect ratio of about 100. As the simplest model, the saturation reaction time $t_s$ for the hole with such an extremely high aspect ratio may be estimated by using the time required for the gas molecules to flow from the inlet of the hole to occupy all the adsorption sites in the hole through diffusion. However, it is assumed that the number of adsorption sites is the same density for all the surfaces. In this case, the saturation time $t_s$ is equal to $2\alpha t_{s0}$ ($t_s=2\alpha t_{s0}$) when the aspect ratio is defined by $\alpha$. When the aspect ratio is 100, the saturation time $t_s$ is approximately 2 ms. In fact, the flux of the reaction gas in the hole or trench decreases as the depth of the hole or trench increases. Accordingly, the saturation time $t_s$ becomes even longer.

At 1 Torr and 350° C., the rotating semi-batch ALD device of the invention is used to perform ALD deposition of TiN with $TiCl_4$ and $NH_3$ on hole patterns having aspect ratios of 0 (flat surface) to 8 by changing the rotation speed. Then, the relationship between the step coverage of the TiN film and the aspect ratio is examined with use of a scanning electron microscope and a transmission electron microscope. It is known from the result that, as shown in FIG. 2, the step coverage remains 1 in the ALD reaction until a certain critical aspect ratio, and the step coverage drops suddenly when the aspect ratio exceeds the critical aspect ratio. This is a unique phenomenon of the ALD reaction and is completely different from the commonly observed phenomenon of the CVD reaction, in which the step coverage decreases gradually as the aspect ratio increases. Moreover, the critical aspect ratio where the step coverage begins to drop sharply becomes lower as the rotation speed increases and the time of exposure to $NH_3$ gas decreases. These are very important findings. In other words, if the maximum rotation speed or the minimum exposure time required for ensuring 100% coverage for the pattern having the maximum aspect ratio on the substrates being processed is calculated and obtained in advance by means of experiments or some computational methods, 100% step coverage may be achieved for all the substrates by setting the rotation speed of the actual ALD process to the calculated maximum rotation speed or below or setting the exposure time to the minimum exposure time or longer. Accordingly, in the invention, the ALD saturation reaction time is calculated based on the maximum aspect ratio of the surface shape of the substrates being processed, and the substrate rotation speed is controlled such that the substrate surface is exposed longer than the saturation reaction time as calculated.

Further, as significant findings, in the state where the step coverage begins to drop, a dimensional analysis with respect to the relationship between the critical aspect ratio and the time of exposure of the substrate to the $NH_3$ reaction gas supply means is carried out, and it is found from the result that, as shown in FIG. 3, when the aspect ratio is 10 or more, the exposure time may approximate to a quadratic function of the aspect ratio, as indicated in Equation 6.

$$t_s - t_{s0} = \gamma \alpha^2 \quad \text{(Equation 6)}$$

$t_{s0}$ is a point where the aspect ratio is extrapolated to the point of zero, namely, the square root of the exposure time for maintaining the ALD reaction on a flat surface. In the experiment of the above example, although some errors may be included, this $t_{s0}$ is about dozens of microseconds which approximately matches the ALD saturation time for a flat surface as calculated in the discussion of Equation 5. In addition, it is found that, in the case where the aspect ratio is 80, the saturation time needs to be one second or more, which is at least ten thousand times the saturation time for the flat surface. Thus, the saturation time is largely dependent on the aspect ratio. For devices with such a high aspect ratio, when the rotation speed is 300 rpm, the exposure time of the reaction gas is about 50 ms or less and is shorter than the saturation time. Thus, complete step coverage may not be achieved for the pattern having the high aspect ratio. The invention is made in view of these issues and achieves 100% step coverage reliably. Further, it is found that the same quadratic function is obtained also in the ALD deposition of other types of films, such as AlO film and HfO film, in addition to TiN. Moreover, with respect to a trench pattern, it is found that, when the saturation time is obtained as a function of the aspect ratio, the saturation time is approximately represented by a linear function and that the saturation time may be represented by a relatively simple linear or quadratic function of the aspect ratio regardless of the pattern. It is found that these results are very consistent with the simulation performed on the circular hole pattern in Non-patent Literature 11, and that this model is applicable to various actual ALD processes or substrate patterns. Since the saturation time may be represented by a simple linear or quadratic function of the aspect ratio, if there is data of the aspect ratio and the saturation time of about one point or two points, the saturation time derivation function with respect to other aspect ratios may be obtained easily. In the above example of TiN, when the aspect ratio is 10 or more, $t_s \gg t_{s0}$, for example. If the saturation time $t_{s1}$ of the aspect ratio $\alpha_1$ of a certain point is obtained, the saturation time $t_s$ of a random aspect ratio $\alpha$ may approximate to $t_s = t_{s1}(\alpha/\alpha_1)^2$. In view of the above findings and considerations, the invention provides the rotating semi-batch ALD device characterized in that the ALD saturation reaction time is calculated as a function $f(\alpha)$ of the aspect ratio $\alpha$ based on the maximum aspect ratio of the substrate surface shape and the substrate rotation speed is controlled such that the substrate surface is exposed longer than the calculated time. For a pattern with a high aspect ratio, $f(\alpha)$ may approximate to a linear or quadratic function of the aspect ratio $\alpha$.

Furthermore, the same experiment is carried out with the pressure changed to 0.5 Torr and 3.0 Torr, and the results show that the square roots of the process pressure and the process temperature are in inverse proportion to the minimum necessary exposure time. Accordingly, if the saturation reaction time at the pressure and temperature of the first condition is calculated, the saturation reaction time at any pressure and any temperature may also be obtained. In the invention, the effect of the pressure is also taken into consideration for obtaining the necessary minimum exposure time or the maximum rotation speed. Since the aspect ratio increases as the ALD deposition proceeds, in the invention, the effect of the increasing aspect ratio in the process is also taken into consideration for controlling the rotation speed in real time.

Effects of the Invention

By using the six invention features described above solely or in combination, the ALD process of high productivity, low gas consumption, and low particle generation may be achieved without impairing the two characteristics of 100% step coverage and high film thickness uniformity, which are the greatest merits of the ALD process. Furthermore, it is very difficult to achieve these characteristics at the same time with the conventional rotating semi-batch ALD device and process. The invention is greatly conducive to economically producing better devices in the fields of semiconductor, LED, and solar cell.

DESCRIPTION OF THE EMBODIMENTS

Figure 1:
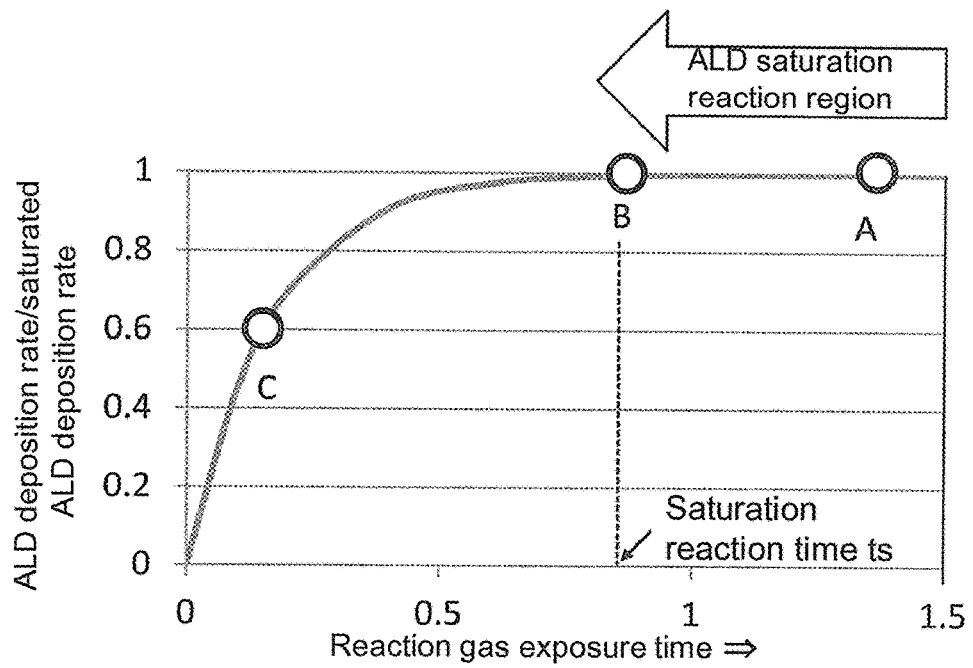
FIG. 1 is a diagram illustrating the issues of the ALD process and showing the relationship between the reaction gas exposure time and the reaction rate.
Figure 2:
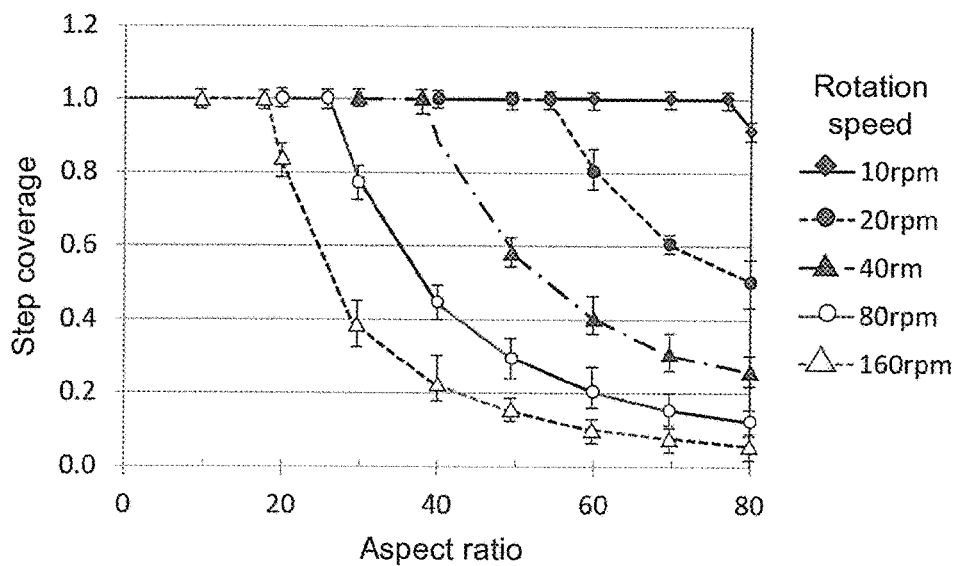
FIG. 2 is a diagram illustrating the findings for the invention and showing the relationship between the reaction gas exposure time and the step coverage.
Figure 3:
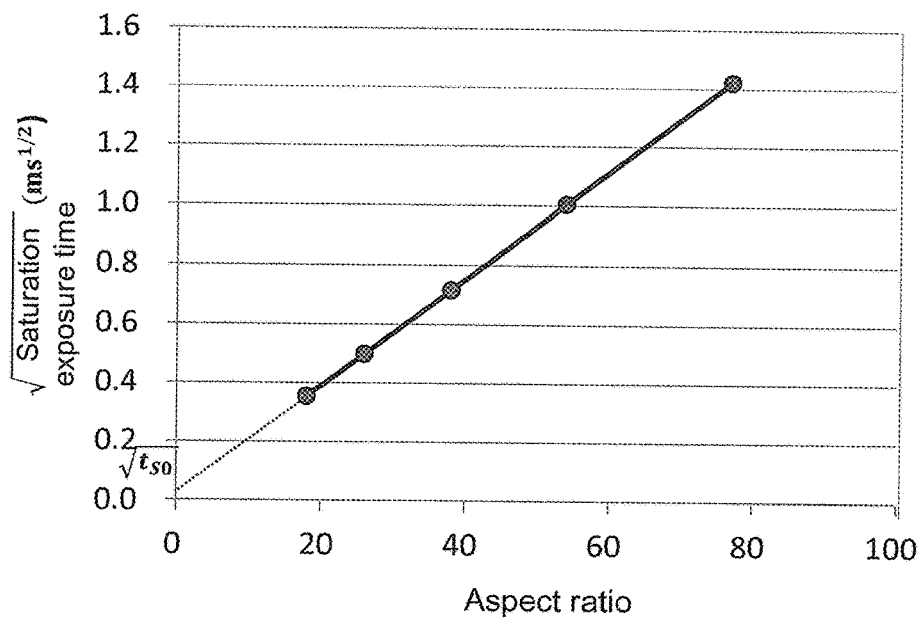
FIG. 3 is a diagram illustrating the findings for the invention and showing the relationship between the aspect ratio patterned on the surface of the substrate to be processed and the ALD saturation reaction time.
Figure 4:
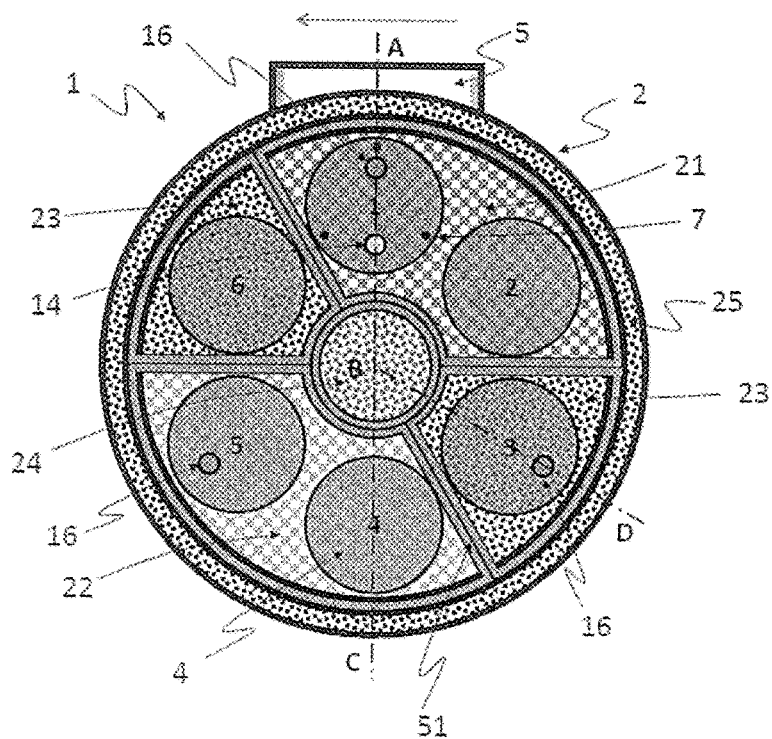
FIG. 4 is a schematic plan view of the ALD device in an embodiment where six substrates to be processed are disposed, and the metal-containing reaction gas supply means and the non-metal reaction gas supply means occupy areas equivalent to two substrates.

Hereinafter, specific embodiments of the invention including the aforementioned six features are described in detail with reference to the figures. First, the first embodiment of the invention is described with reference to FIG. 4 to FIG. 9. FIG. 4 is a schematic plan view of the rotating semi-batch ALD device according to the invention. A gas supply and exhaust means 2 is disposed in the upper portion of a vacuum container 1 and includes a metal-containing reaction gas supply and exhaust part 21, a non-metal reaction gas supply and exhaust part 22, a purge gas supply and exhaust part 23, a central purge gas supply and exhaust part 24, and a peripheral purge gas supply and exhaust part 25. Right below the gas supply and exhaust means 2, a substrates being processed 4 is disposed in a recess 32 of a rotating susceptor 3 with a gap g, such that a surface of the substrates being processed 4 and a surface of the susceptor 3 are at the same height. In the embodiment of FIG. 4, six substrates are disposed, which are numbered 1-6 respectively. In this embodiment, the rotating susceptor 3 that carries the substrates being processed 4 is rotated counterclockwise or clockwise, when viewed from above as indicated by the arrow in FIG. 4, around a rotation shaft 34 by a rotation driving motor 37 through a rotation gear 36. The rotation shaft 34 is vacuum-shielded by a magnetic fluid shield 35. The metal-containing reaction gas supply and exhaust part 21, the non-metal gas supply and exhaust part 22, and the two purge gas supply and exhaust parts 23 arranged therebetween each have a sector shape, and the time during which every part of the substrates being processed 4 passes through each gas supply part is made the same. By this method, the exposure time of every part of the substrates being processed 4 to the reaction gas is equal, so as to achieve high uniformity of the ALD film thickness.

Figure 5:
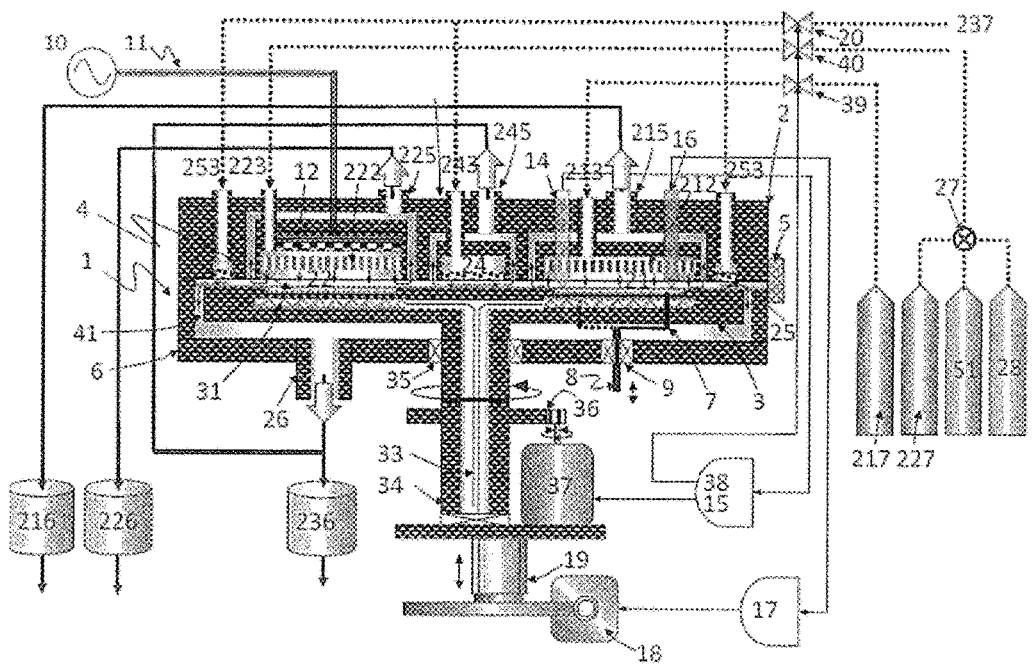
FIG. 5 is a schematic cross-sectional view of the ALD device along the line ABC in the embodiment of FIG. 4.
Figure 6:
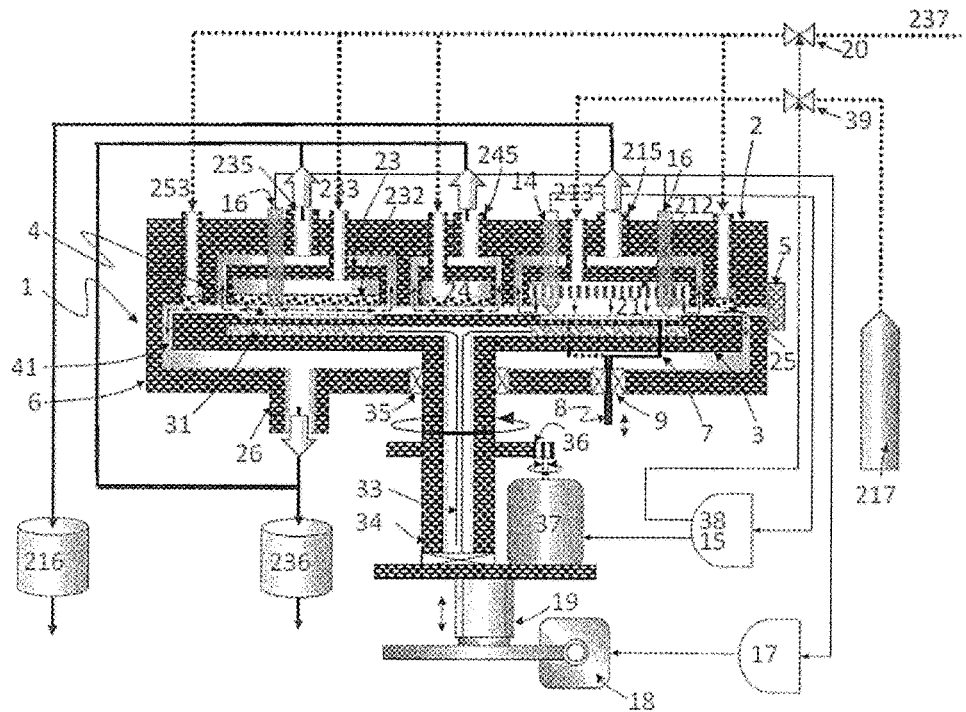
FIG. 6 is a schematic cross-sectional view of the ALD device along the line ABD in the embodiment of FIG. 4.
Figure 7:
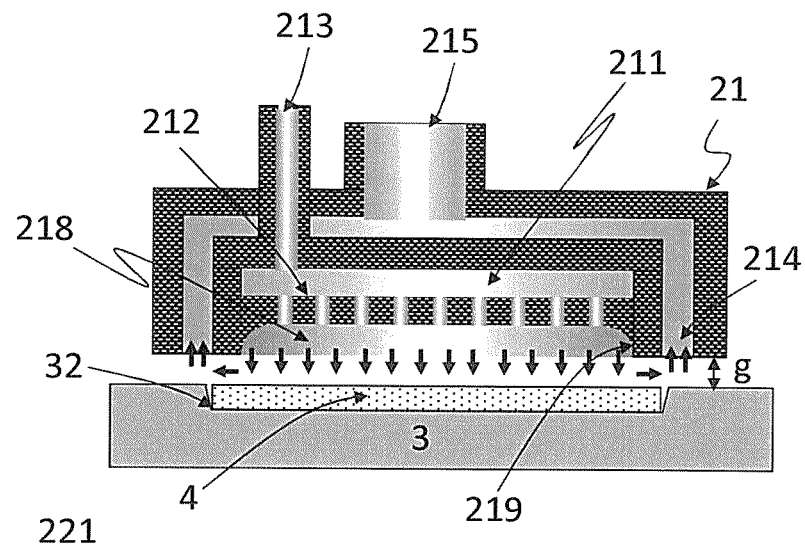
FIG. 7 is a schematic cross-sectional view of the metal-containing reaction gas supply unit in the first and second embodiments of the invention.

A cross section of FIG. 4 along ABC is shown in FIG. 5 and a cross section of FIG. 4 along ABD is shown in FIG. 6. The gas supply and exhaust means 2 is disposed in the upper portion of the vacuum container 1. In FIG. 5, the metal-containing reaction gas supply and exhaust part 21 is on the right side and the purge gas supply and exhaust part 22 is on the left side. Details of the metal-containing reaction gas supply part 21 are illustrated in FIG. 7. The metal-containing reaction gas supply and exhaust means 21 includes a metal-containing reaction gas supply part 211, a partition wall 219 surrounding the metal-containing reaction gas supply part 211, and an vacuum evacuation groove 214. A shower plate 212 is disposed in the metal-containing reaction gas supply part 211, and a cavity 218 is formed underneath the shower plate 212. A reaction gas supplied from a gas inlet port 213 is dispersed uniformly by the shower plate 212 to become a down flow that flows slowly and uniformly in the downward direction through the cavity 218, as indicated by the arrow in the figure, to react with the surface of the substrates being processed 4 underneath. Then, unreacted gas and reaction product gas pass through the narrow gap between the lower end of the cavity 218 and the substrates being processed 4 and are exhausted from a gas discharge groove 214 formed surrounding the cavity 218, and transported to a vacuum pump 216 through a gas exhaust port 215. The non-metal reaction gas supply and exhaust part 22 has a similar configuration, but the exhaust line and the vacuum pump are separate systems to prevent mixture with the metal-containing reaction gas. Regarding the height of the cavity, as the height increases, the gas volume increases and more time is required for gas switching when ALD starts and ends, which is unfavorable. If the height is 5 cm or less, the gas switching may be completed in a few seconds, and its influence to the throughput of the device is so small and negligible. Moreover, in the case that the height of the cavity is small, there is no influence on the uniformity of the film thickness and the step coverage. With this reaction gas supply and exhaust configuration, the two reaction gases may react with the surface of the substrates being processed 4 efficiently and the gas consumption may be reduced. In addition, since the two reaction gases are exhausted efficiently independently through the gas exhaust grooves surrounding the respective gas supply parts, there is no gas leakage from the gas supply and exhaust means, and excellent reaction gas separation may be achieved in comparison with the conventional rotating semi-batch ALD device. Furthermore, since the exhausted gas has a high concentration of the reaction gas, recycling may be performed efficiently for reuse of the reaction gas or gas exclusion may also be performed efficiently, and the gas consumption may be significantly reduced as compared to the conventional rotating semi-batch ALD device.

Figure 9:
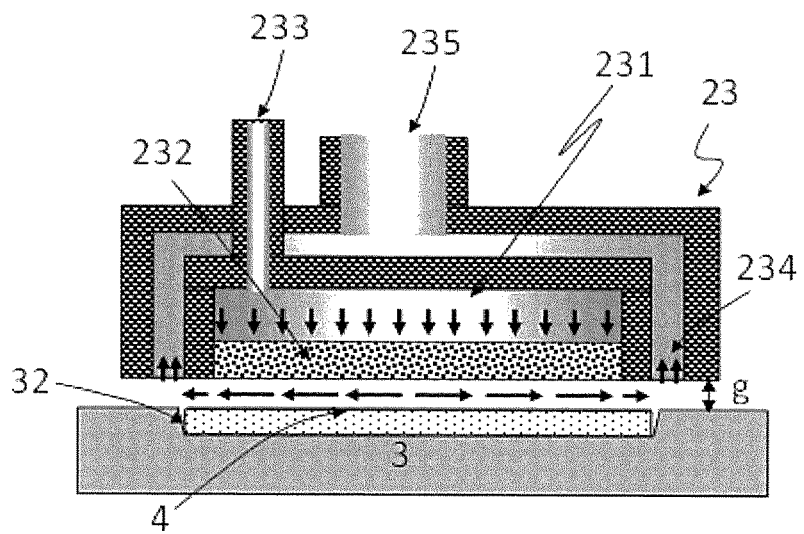
FIG. 9 is a schematic cross-sectional view of the purge gas supply unit in the first and second embodiments of the invention.

On the other hand, the purge gas supply and exhaust means 23, as shown in FIG. 9, includes a purge gas supply part 231 and a purge gas exhaust groove 234 surrounding the purge gas supply part 231. Here, unlike the metal reaction gas supply and exhaust means 21, a shower plate 232 is disposed to directly face the substrates being processed 4 with the narrow gap g therebetween and no cavity is formed under the shower plate 232. With this configuration, the purge gas exhausted from the shower plate 232 flows in the transverse direction along the substrates being processed 4 through the narrow gap g and the residual gas that remains on the surface of the substrates being processed or in the cavity may be discharged efficiently. The gas flow rate is inversely proportional to the thickness of the gap; or in order to achieve the same gas flow rate, a narrow gap may be used such that the gas flow may be reduced. Therefore, it is preferable to make the gap g smaller. The gap g is usually controlled to be 4 mm or less by inputting a signal from an optical gap measuring means 16 to a gap control sequencer 17 and driving a stepping motor 18 through PID (proportional integral and differential) control.

Moreover, in the embodiment shown in FIG. 4 and FIG. 5, the purge gas is supplied not only from the purge gas supply part 23 disposed between the reaction gas supply and exhaust parts 21 and 22, but also from the purge gas supply and exhaust part 24 disposed in the central part of the vacuum container 1 and the peripheral purge gas supply part 25 disposed circumferentially around the inner wall of the vacuum container. With this configuration, mixture of the reaction gases near the center and the peripheral part of the vacuum container 1 may be prevented.

In this embodiment, regarding the shower plates disposed in all the purge gas supply parts, considering that the process pressure is about 0.1 Torr or more, the arrangement pitch of the gas ejection holes is set to be 5 mm, which is 3 times the mean free path of nitrogen molecules in the pressure, and it has been confirmed that favorable gas flow uniformity is achieved with the pitch being 10 mm or less. Furthermore, a porous plate may be used in place of the shower plate. In that case, since the gas ejection hole has a small pitch, the uniformity of gas dispersion is further improved. Moreover, in order to prevent stagnation of the reaction gas at the edges of the shower plates in the reaction gas supply parts 211 and 221, the distance between the outermost gas ejection hole and the partition wall is set to be 5 mm or less, and a favorable effect is achieved if the distance is set less than 10 mm. The corners may also be rounded to remove the places where the gas may stagnate.

Figure 8:
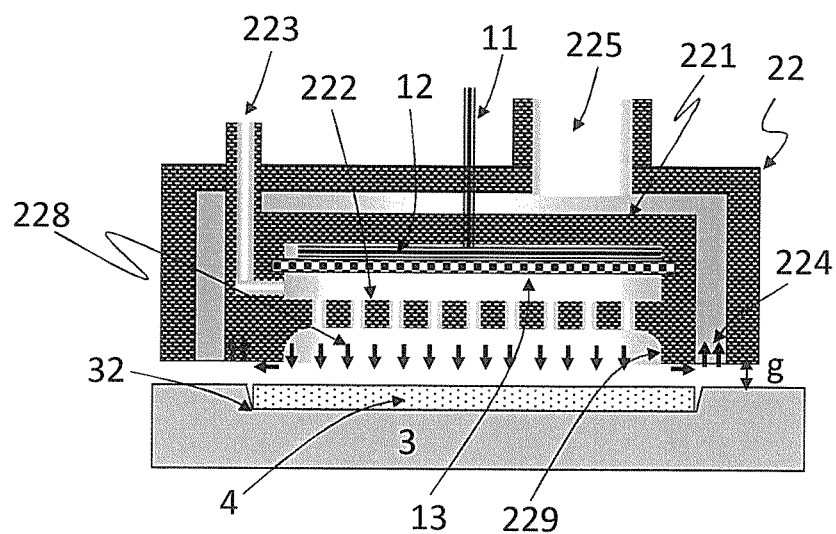
FIG. 8 is a schematic cross-sectional view of the non-metal reaction gas supply unit in the first and second embodiments of the invention.

FIG. 5 and FIG. 8 illustrate another form of the first embodiment of the invention regarding the non-metal reaction gas supply part 221. Here, in order to facilitate reaction of the second step (reaction formula 2) which is performed by the non-metal gas that restricts the whole ALD reaction speed, a plasma excitation means 12, such as a RF coil and a microwave radiation antenna, is disposed right above a non-metal reaction gas supply shower plate 222 through a dielectric plate 13. The non-metal reaction gas is supplied from a non-metal reaction gas inlet port 223. The plasma excitation means 12 is connected to a RF or microwave power source 10 through a coaxial cable 11 and may generate a plasma in a cavity 228 directly under the shower plate 222. The non-metal gas is excited by the plasma, such that the second step reaction of the ALD may be carried out quickly. The non-metal reaction gas supply and exhaust means 22 also includes a vertical partition wall 229 surrounding the non-metal reaction gas supply part 221. In the embodiment of FIG. 8, the plasma is generated directly in the non-metal reaction gas supply part 221. Nevertheless, a remote plasma may also be generated outside the reaction gas supply and exhaust means 22 to excite the non-metal gas, and the excited radicals may be induced to the non-metal gas supply part 22 to be ejected from the shower plate 222. In addition to the plasma, a catalytic reaction may be generated by using a metal mesh of tungsten or platinum that is heated to a high temperature, or UV light irradiation may also be used for generating the non-metal reaction gas radicals. These radical generation means are particularly effective in the case of using nitrogen gas as the non-metal reaction gas to perform ALD deposition of metal nitrides. The reason is that nitrogen gas is inert and hardly has surface reaction with the adsorbed metal atom precursor, and therefore the nitrogen needs to be excited to generate nitrogen radicals. Besides, in terms of the adsorption reaction of the metal-containing reaction gas, such gas molecule excitation means may often cause a minus effect. In other words, ligand of the metal-containing gas molecules is taken by the plasma, etc. and the molecules cause a gas phase reaction therebetween, by which particles are generated and the step coverage is reduced due to the CVD reaction. Thus, the gas molecule excitation means using plasma or the like is used only for the non-metal reaction gas supply part 221, and not provided in the metal-containing reaction gas supply part 211.

The plasma generation means 12 provided in the non-metal reaction gas supply part 221 is used not only for activating the process gas to expedite the ALD deposition rate but also for removing or etching ALD reaction products deposited on the rotating susceptor 3. In this case, halogen compounds such as $ClF_3$, $NF_3$, $F_2$ and $C_xH_yF_z$ are used as the process gas for removing metal oxides and metal nitrides as volatile metal halide compounds. In this embodiment of the invention, after TiN of 10 nm is deposited on 5000 substrates being processed, in a state where no substrate is disposed, the temperature is raised to 400° C. to generate chlorine radicals by plasma, so as to remove the TiN film attached to the rotating susceptor. An example of a means introducing an etching gas is shown in FIG. 5, including an etching gas supply cylinder 28, and a valve 27 switching between the non-metal reaction gas, the etching gas and the pretreatment gas, wherein the non-metal reaction gas is supplied from a non-metal reaction gas supply cylinder 227, the etching gas is supplied from the etching gas supply cylinder 28, and the pretreatment gas is supplied from a pretreatment gas bomb 51. The metal-containing reaction gas is supplied from a metal-containing reaction gas supply cylinder 217.

In addition, as a known technique related to the temperature control of the substrates being processed 4, a heater 31 is embedded right below the recess 32 of the susceptor 3 for heating the substrates being processed 4, so as to control the temperature of the substrates being processed 4. The heating temperature is set in a range of 100° C. to 500° C., which covers almost all ALD reaction, according to the films to be deposited and the types of the reaction gases. It has also been proposed to embed the heating heater in the entire rotating susceptor or separately dispose the heating heater right under the susceptor 3. In this embodiment, however, the heater 31 is embedded only in the area right under the substrate 4 in the rotating susceptor 3 considering energy saving, high-speed and high-accuracy temperature control, prevention of heater material corrosion, and easy maintenance. Nevertheless, the invention is not intended to limit the heating method of the heater, and any method may be adopted. Moreover, another known technique in the deposition process is to maintain the temperature of the whole vacuum container 1 and control the temperatures of the inner wall of the vacuum container 1 and the surface of the rotating susceptor 3 other than where the substrates 4 are disposed to be lower than the process temperature at which the ALD reaction proceeds and higher than the condensing temperature of the metal-containing reaction gas at a predetermined process pressure. Further, an electrostatic chuck (not shown) is disposed on the rotating susceptor 3 for preventing the substrates being processed 4 from floating or being detached when the susceptor 3 rotates at a high speed or when the gas flow increases.

Next, the second embodiment of the invention is described with reference to FIG. 4 to FIG. 9. A metal-containing reaction gas vacuum evacuation groove 214, a non-metal reaction gas vacuum evacuation groove 224, a purge gas vacuum evacuation groove 234, and a central purge gas vacuum evacuation groove 244 are arranged independently around the metal reaction gas supply part 211, the non-metal reaction gas supply part 221, the purge gas supply part 231 disposed between the two gas supply parts for separating two gases, and the purge gas supply part 241 disposed in the center of the gas supply part for gas separation, so as to exhaust gases independently from a metal-containing reaction gas exhaust port 215, a non-metal reaction gas exhaust port 225, a purge gas exhaust port 235, and a central purge gas exhaust port 245. The metal-containing reaction gas is exhausted by a metal-containing reaction gas vacuum pump 216 and the non-metal reaction gas is exhausted separately by a non-metal reaction gas vacuum pump 226. As to the purge gas, the purge gas exhausted from the purge gas exhaust port 235, the central purge gas exhaust port 245, and the vacuum container exhaust port 26 disposed in the vacuum container lower portion 6 is collected and exhausted by a purge gas vacuum pump 236. Only for the peripheral purge gas supply means 25 that is disposed around the vacuum container wall, the purge gas is exhausted through a gap 41 between the rotating susceptor 3 and the vacuum container wall 6, and no exhaust groove is formed on the inner side of the peripheral purge gas supply means 25. The reason is that the peripheral gas purge supply means 25 is not provided primarily for gas separation, but for setting the pressure in the vacuum container and for controlling the gap between an upper gas supply means 2 (to be described later) and the substrates being processed 4. Nevertheless, it is also possible to dispose a vacuum evacuation groove on the inner side of the peripheral purge supply part. As described above, all the reaction gas supply parts and purge gas supply parts are respectively surrounded by an independent vacuum evacuation groove, and the gas exhaust of the reaction gas supply part and the purge gas supply part has a dual structure, by which the gases may be respectively exhausted efficiently to achieve a better reaction gas separation effect than the conventional rotating semi-batch ALD device. In addition, since the exhausted gas has a high concentration of the reaction gas, recycling may be performed efficiently for reuse of the reaction gas or gas exclusion may also be performed efficiently, and the gas consumption may be significantly reduced as compared to the conventional rotating semi-batch ALD device.

Next, the third embodiment of the invention is described with reference to FIG. 4, FIG. 7, and FIG. 10 to FIG. 17. In the embodiment shown in FIG. 4, six substrates being processed 4 are mounted on the rotating susceptor 3. The sector-shaped metal-containing reaction gas supply and exhaust part 21 and non-metal reaction gas supply and exhaust part 22 have the same opening angle and respectively occupy an area equivalent to two substrates, and are spaced by one substrate. A purge gas supply and exhaust part 23 is disposed in a gas separation region that is as wide as one substrate. In this case, the metal-containing reaction gas supply and exhaust part 21 and the non-metal reaction gas supply and exhaust part 22 would not be located on the same substrate at any timing. Therefore, the reaction gases would not be mixed along the gap between the recess 32 of the rotating susceptor 3 and the substrate 4 in FIG. 7, and an increase in the backside particles does not occur.

Figure 10:
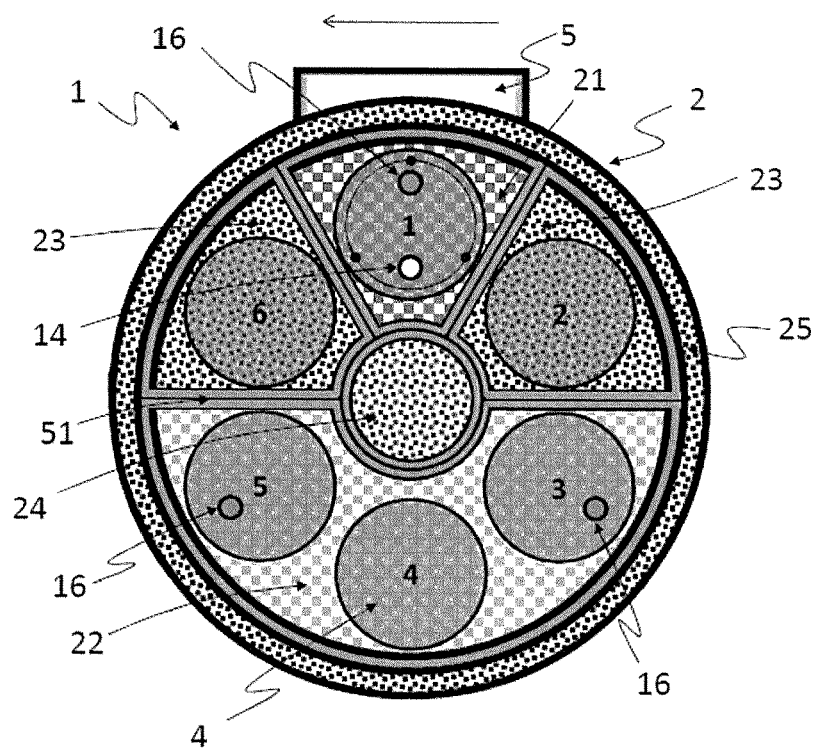
FIG. 10 is a schematic plan view of the ALD device in the third embodiment of the invention where six substrates are disposed and the metal-containing reaction gas supply means occupies the area equivalent to one substrate.
Figure 11:
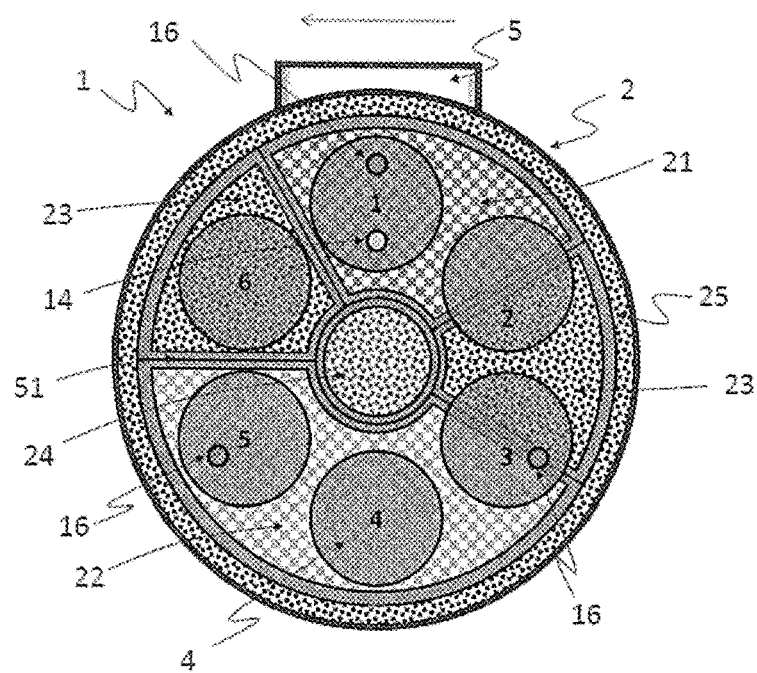
FIG. 11 is a schematic plan view of the ALD device in the third embodiment of the invention where six substrates are disposed and the metal-containing reaction gas supply means occupies the area equivalent to 1.5 substrates.

FIG. 10 illustrates another form of the third embodiment of the invention. In the rotating semi-batch ALD process, as the areas of the reaction gas supply and exhaust parts 21 and 22 increase, the time of contact between the reaction gas and the substrates being processed 4 becomes longer, and the rotation speed may be increased correspondingly to improve the throughput. It is particularly effective if the contact time of the non-metal reaction gas and the substrates being processed 4 is maintained as long as possible. FIG. 10 illustrates a situation where, in the case of six substrates being processed, the metal-containing reaction gas supply and exhaust part 21 occupies an area equivalent to one substrate while the non-metal reaction gas supply part 22 occupies an area equivalent to three substrates. Like the case of FIG. 4, the two gas supply and exhaust parts are separated from each other by an area equivalent to one substrate, and the purge gas supply and exhaust part 23 is disposed in the gas separation region. FIG. 11 illustrates yet another form of the third embodiment of the invention. Here, in the case of six substrates being processed, the metal-containing reaction gas supply and exhaust part 21 occupies an area equivalent to 1.5 substrates while the non-metal reaction gas supply and exhaust part 22 occupies an area equivalent to 2.5 substrates. In this case, although the boundary of each gas supply part is misaligned with the location of the substrates being processed, the metal-containing reaction gas supply and exhaust part 21 and the non-metal reaction gas supply and exhaust part 22 are separated from each other by the area equivalent to one substrate at all times, and thus the reaction gases would not be mixed along the gap between the recess 32 of the susceptor 3 and the substrate 4. In the embodiment described above, the area ratio of the metal-containing reaction gas supply and exhaust part 21 and the non-metal reaction gas supply and exhaust part 22 is 2:2, 1.5:2.5, and 1:3. Nevertheless, the invention is not limited to these ratios, and the area ratio may be any ratio between 2:2 to 1:3, such as 2.3:2.7. Moreover, in some rare cases, the area of the metal-containing reaction gas supply and exhaust part 21 may be larger than the area of the non-metal reaction gas supply and exhaust part 22. What structure is to be adopted for the reaction gas supply and exhaust part is determined according to the ratio of the necessary minimum exposure time of the metal-containing reaction gas adsorption reaction required for maintaining ALD saturation reaction to the necessary minimum exposure time of the non-metal reaction gas adsorption reaction. In any case, it is important to separate the metal-containing reaction gas supply and exhaust part 21 and the non-metal reaction gas supply and exhaust part 22 at a distance of a sector-shaped area equivalent to one substrate.

Figure 12:
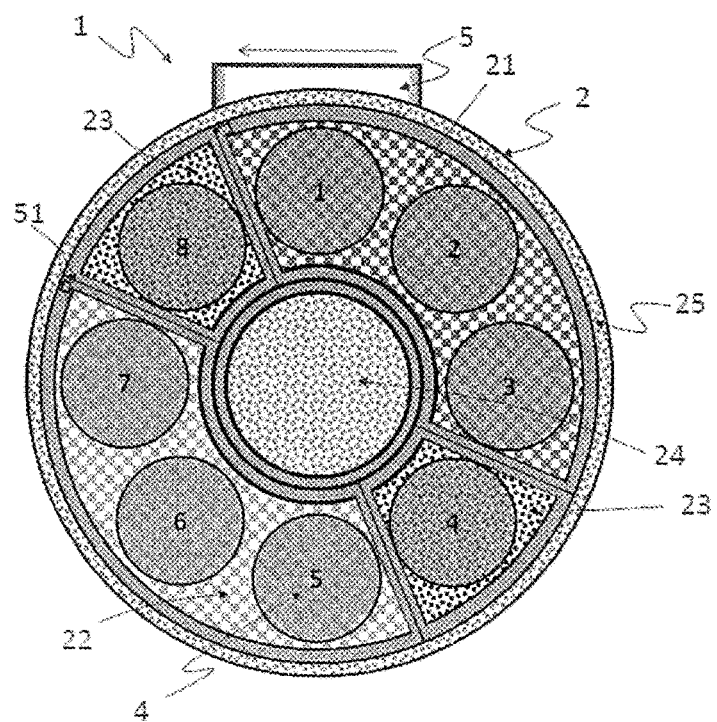
FIG. 12 is a schematic plan view of the ALD device in the third embodiment of the invention where eight substrates are disposed, and the metal-containing reaction gas supply means and the non-metal reaction gas supply means occupy areas equivalent to three substrates.

The embodiments of the invention as disclosed in FIG. 12 to FIG. 17 illustrate the configurations for different area ratios between the metal-containing reaction gas supply and exhaust part 21 and the non-metal reaction gas supply and exhaust part 22 in the case where eight substrates being processed 4 are disposed on the rotating susceptor 3. In these figures, in order to more clearly show the configuration, information irrelevant to the relative positions of the substrates and the gas supply means, such as film thickness meter, gap measuring device, and substrate lift pin, is omitted. In the embodiment of FIG. 12, the metal-containing reaction gas supply and exhaust part 21 and the non-metal reaction gas supply and exhaust part 22 have equal areas and each cover an area equivalent to three substrates. Since the two reaction gas supply and exhaust parts are separated by an area equivalent to one substrate, the two gases do not mix with each other along the gap around the substrate 4. FIG. 13, FIG. 14, FIG. 15, and FIG. 16 respectively illustrate the embodiments where the area ratio of the metal-containing reaction gas supply and exhaust part 21 and the non-metal reaction gas supply and exhaust part 22 is 2.5:3.5, 2:4, 1.5:4.5, and 1:5. In any case, the metal-containing reaction gas supply and exhaust part 21 and the non-metal reaction gas supply and exhaust part 22 are separated by the area equivalent to one substrate, such that the reaction gases are not mixed along the gap of the recess around the substrate 4. Similar to the case of the rotating semi-batch ALD device with six substrates, the area ratio of the metal-containing reaction gas supply and exhaust part 21 and the non-metal reaction gas supply and exhaust part 22 is not limited to the values specified above and may any ratio between 3:3 to 1:5. Moreover, the area of the metal-containing reaction gas supply and exhaust part 21 may be larger than the area of the non-metal reaction gas supply and exhaust part 22. What structure is to be adopted for the reaction gas supply and exhaust part is determined according to the ratio of the necessary minimum exposure time of the metal-containing reaction gas adsorption reaction required for maintaining ALD saturation reaction to the necessary minimum exposure time of the non-metal reaction gas adsorption reaction. In any case, it is important to separate the metal-containing reaction gas supply and exhaust part 21 and the non-metal reaction gas supply and exhaust part 22 at a distance of a sector-shaped area equivalent to one substrate.

Figure 17:
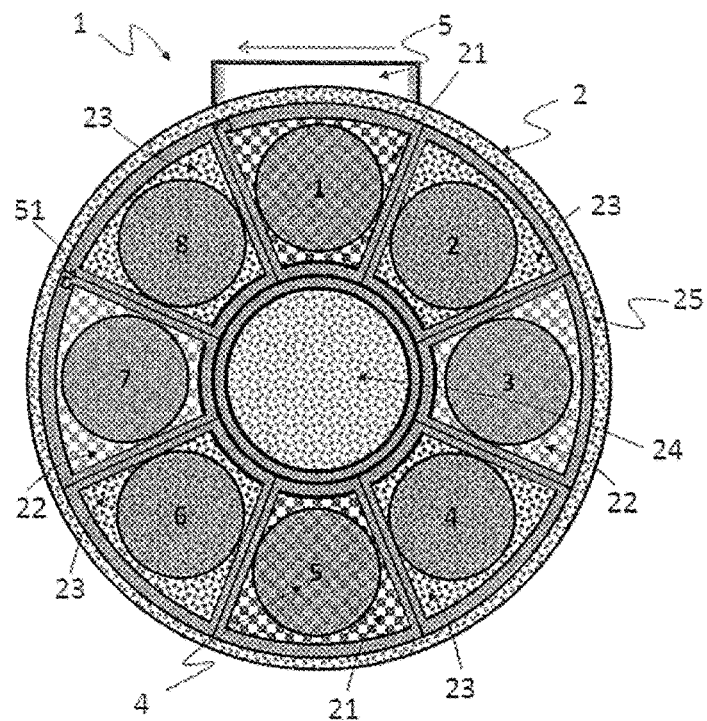
FIG. 17 is a schematic plan view of the ALD device in the third embodiment of the invention where eight substrates are disposed and two pairs of ALD gas supply and exhaust means are disposed.

FIG. 17 illustrates another form of the third embodiment of the invention, in which eight substrates being processed are disposed in the ALD device. Here, two groups of metal-containing reaction gas supply and exhaust parts 21 and non-metal reaction gas supply and exhaust parts 22 are disposed to be respectively separated by an area equivalent to one substrate. This embodiment has a merit that, by supplying two types of metal-containing reaction gases and/or two types of non-metal reaction gases, a hybrid film including films of different elements may be deposited. For example, a hybrid film of HfO/AlO may be deposited by using Hf precursor gas as the first metal-containing reaction gas, using Al precursor gas as the second metal-containing reaction gas, and respectively supplying ozone from the two non-metal reaction gas supply parts. With this configuration, however, each reaction gas supply and exhaust part only occupies the area equivalent to one substrate. Consequently, the time during which the substrates being processed contacts the reaction gas in each reaction gas supply part becomes shorter, and correspondingly the rotation speed of the rotating susceptor is lowered and the throughput decreases.

Figure 18:
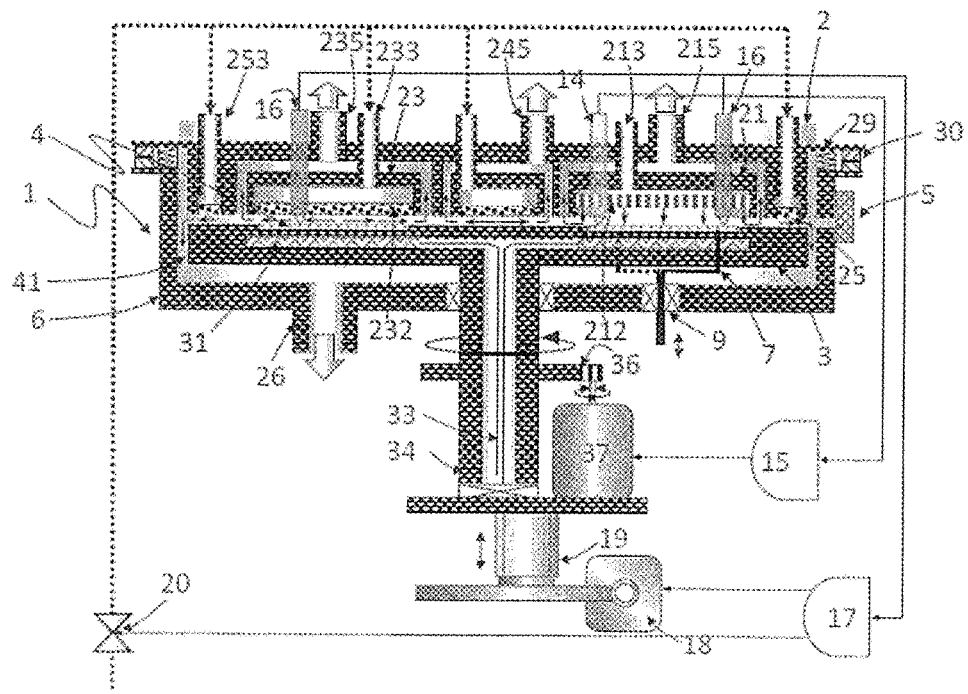
FIG. 18 is a schematic cross-sectional view of the ALD device in the fourth embodiment of the invention.
Figure 19:
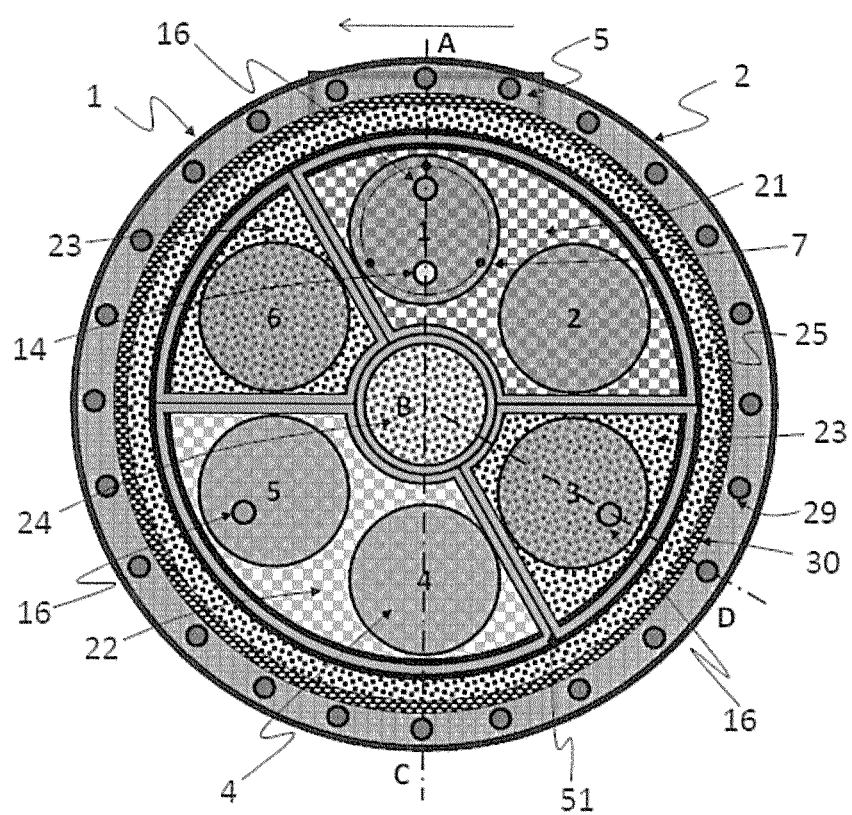
FIG. 19 is a schematic plan view of the ALD device in the fourth embodiment of the invention.
Figure 20:
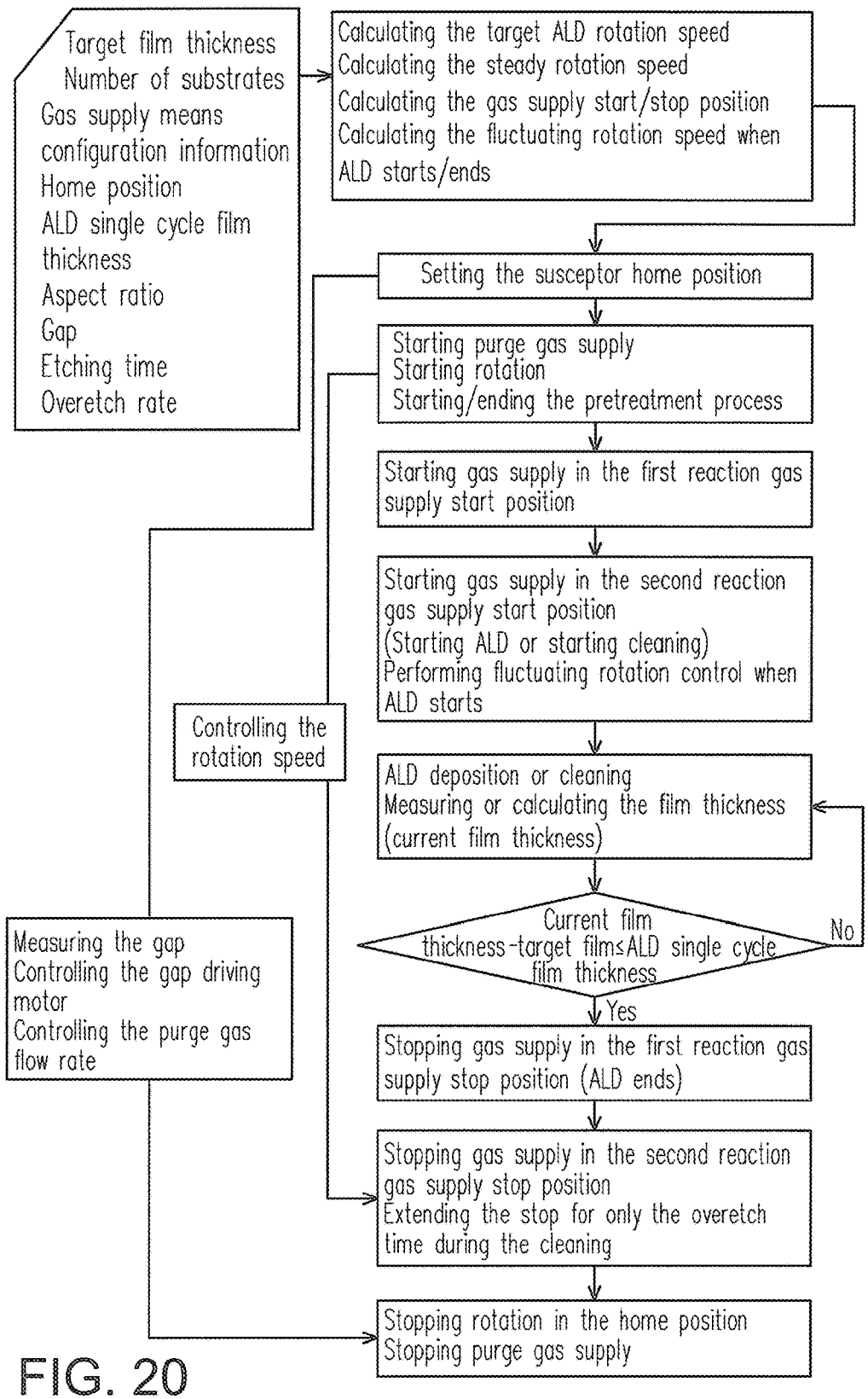
FIG. 20 is a diagram showing an ALD deposition control system including a gap control flowchart and a gas supply control flowchart in the fourth and fifth embodiments of the invention.

Hereinafter, the fourth embodiment of the invention is described with reference to FIG. 18, FIG. 19, and FIG. 20. In this embodiment, as shown in FIG. 18, the upper gas supply means 2 has a mechanism that the position of the upper gas supply means 2 with respect to the vacuum container 1 may be changed in the vertical direction with use of flexible bellows 29, and the upper gas supply means 2 is supported by a permanent magnet pair 30. That is, the upper permanent magnet and the lower permanent magnet are disposed to repel each other, so as to keep the upper gas supply means 2 floating. As shown in FIG. 19, a plurality of the permanent magnet pairs 30 are disposed at a certain interval around the vacuum container 1, so as to evenly distribute the load. However, the permanent magnet pairs 30 may also be disposed to occupy the entire periphery of the vacuum container. As to the strength and configuration of the magnet, they are selected such that, in a state where the vacuum container is evacuated and has no pressure difference relative to the atmospheric pressure, the upper gas supply means 2 is balanced right before floating. In this embodiment, the permanent magnet pairs are used for keeping the upper gas supply and exhaust means 2 floating. However, a spring or an electromagnet coil may also be used for the same purpose, and it is important to use these floating means in combination with a gap fine-adjustment means with an air cushion.

As the air cushion, the purge gas is ejected from the peripheral purge gas supply part 25 and/or the central purge gas supply and exhaust part 24 toward the rotating susceptor 3 at a pressure of 1 Torr to several Torr, equal to that of the ALD process or slightly higher. The metal-containing reaction gas, the non-metal reaction gas, and the purge gas supplied therebetween also provide a floating force equivalent to the differential pressure between the process pressure and the vacuum container base pressure, and these gas supply means may also be utilized as the air cushion. With these all taken into consideration, the air cushion force in this embodiment is about 20 kg. The floating force is insufficient for lifting the upper gas supply and exhaust means, but it may become a sufficient force when used in combination with the aforementioned floating means, such as spring and magnet. In addition, regarding the structure of the purge gas supply shower plate, gas ejection holes and exhaust holes may be arranged alternately on the shower plate. In this case, the repelling force and the attraction force are applied at the same time, such that the gap may be controlled more accurately in a self-aligned manner.

As a method for accurately controlling the gap g between the upper gas supply and exhaust means 2 and the substrates being processed 4, in this embodiment, as shown in FIG. 18, the gap g is measured by a laser beam measuring means 16, and the gap is controlled by sending a PID feedback to a purge gas ejection amount adjustment valve 20 through a gap control sequencer 17. Here, the laser beam measuring means 16 measures the gap g at three different points and individually controls the amount of gas supply from the purge gas supply part, which is divided into three portions in the circumferential direction, so as to improve the in-plane uniformity of the gap across the entire region of the susceptor. The gas supply part may be divided into more portions in the circumferential direction to enhance the characteristic of uniform gap control. In addition, the number of the laser optical measuring means 16 may be determined by comparing the reduction of gas consumption achieved through gap control and the device fabrication costs, so as to be economically optimal. The gap control, as shown in FIG. 20, is incorporated into the ALD deposition control system and is constantly continued after the substrates being processed 4 is disposed on the susceptor 3 in the vacuum container and the vacuum container is evacuated and before the vacuum container is evacuated to a high vacuum for opening the gate valve when the ALD process has been completed and the rotation has stopped. By applying the techniques, such as the air cushion, the floating means, and the gap control system, as disclosed in the embodiment above, the gap g between the lower end of the upper gas supply and exhaust means 2 and the rotating susceptor 3 may be maintained about 1 mm or less.

Next, the fifth embodiment of the invention is described with reference to FIG. 5, FIG. 20, and FIG. 21 to FIG. 44. Regarding the deposition process sequence, first, in FIG. 5, the inside of the vacuum container 1 and the gas supply and exhaust means 2 is evacuated to create a high vacuum through the exhaust port 26 disposed in the lower portion 6 of the vacuum container 1 and the exhaust ports 215, 225, 235, and 245 of the gas supply and exhaust means 2 disposed in the upper portion of the vacuum container 1 using the vacuum pumps 236, 216, and 226. After the predetermined high vacuum is reached, a gate valve 5 disposed in the vacuum container 1 is opened and a vertically-drivable arm 8 is driven to raise a pin 7, and a vacuum transporting robot (not shown) is used to convey the substrates being processed 4 to the position of the recess 32 of the rotating susceptor 3, which has been set to be at a predetermined temperature, to be placed above the pin 7. Then, the pin holding arm 8 is driven by a magnetic shield 9 to lower the pin 7 in the downward direction, so as to dispose the substrates being processed 4 into the recess 32 of the rotating susceptor 3. After the first substrate is disposed on the rotating susceptor 3, the rotating susceptor 3 is rotated counterclockwise to the next substrate mounting position, and then the second substrates being processed 4 is disposed on the rotating susceptor 3 in the same way. This process is repeated to dispose all the substrates being processed 4 on the rotating susceptor 3. After all the substrates being processed are disposed, the substrates being processed are adhered closely to the susceptor 3 by an electrostatic chuck (not shown) embedded in the rotating susceptor 3 and the gate valve 5 is closed. Here, as shown in FIG. 20, the number of the substrates being processed, the target film thickness, the rotating susceptor home position, the single ALD cycle deposition rate, and the maximum aspect ratio of the pattern formed on the substrates being processed are inputted in advance to the ALD device control system. Of course, other process parameters, such as the gas flow rate and temperature pattern, may also be inputted to the control system. Here, in order to specify the contents of the fifth embodiment of the invention, only the parameters related to the invention are listed. Next, the supply start and stop positions of the metal-containing reaction gas, the supply start and stop positions of the non-metal reaction gas, the necessary ALD cycle number, the rotation speeds of the rotating susceptor when the supply of the reaction gas starts and ends, and the rotation speed of the rotating susceptor in a steady state are calculated according to the aforementioned data. After the substrates being processed are disposed on the rotating susceptor, the rotating susceptor 3 is set to the home position. Thereafter, the purge gas is supplied to flow from the purge gas supply part 23 in the upper portion of the vacuum container, the central purge gas supply part 24, and the peripheral purge gas supply part 25 disposed in the periphery of the vacuum container 1, and each gas exhaust groove is evacuated to set the pressure in the vacuum container to a predetermined process pressure. Then, the rotating susceptor 3 starts to rotate at an initial rotation speed. When the substrates being processed 4 arrives at a predetermined location that is inputted in advance, the gas supply cut-off valves 39 and 40 are controlled through a gas supply cut-off sequencer 38 to start ejecting or exhausting the metal-containing reaction gas and/or the non-metal reaction gas from the reaction gas supply and exhaust parts 21 and 22. Alternatively, the purge gas may be set to flow from each reaction gas supply part and then switched to the reaction gas at the predetermined position. At the moment, for the first revolution, the rotating susceptor 3 is rotated based on a fluctuating rotation speed pattern when the ALD starts, corresponding to the number of the substrates being processed and the configuration of the gas supply and exhaust means 2. Starting from the second revolution, the rotating susceptor 3 is rotated at a steady ALD rotation speed calculated based on the aspect ratio. The substrates being processed 4 rotate with the rotating susceptor 3 to be sequentially exposed to the metal-containing reaction gas, the purge gas, the non-metal reaction gas, and the purge gas, so as to carry out the ALD process. When the number of ALD cycles reaches the target ALD cycle number (i.e. an integer closest to the value obtained by dividing the target film thickness by the deposition of one single ALD cycle), in the substrate position that is inputted in advance, the gas supply cut-off valves 39 and 40 are controlled through the gas supply cut-off sequencer 38 to cut off supply of the metal-containing reaction gas and the non-metal reaction gas, so as to end the ALD reaction. In the case where a film thickness meter 14 disposed in-line is used to measure the film thickness in real time during the ALD deposition, the ALD process is deemed completed when the film thickness reaches the predetermined thickness. By controlling the timing of starting and ending the ALD, the same film thickness is obtained on all the substrates being processed. When the ALD process is completed, the metal-containing reaction gas and the non-metal reaction gas are switched to the purge gas respectively at the predetermined positions. After the residual reaction gas in the vacuum container is completely discharged, the rotating susceptor 3 is stopped at the home position and lowered in the downward direction by the stepping motor, and the purge gas is stopped. Then, after the vacuum container is evacuated to a high vacuum, the gate valve 5 is opened for using the vertically-drivable pin 7 and the vacuum transporting robot (not shown) to discharge the substrates being processed 4 from the vacuum container 1 to a load lock chamber (not shown) in the reverse procedure of disposing the substrates being processed 4 on the susceptor 3. Regarding the process sequence and the positions of the rotating susceptor 3 and the substrates being processed 4 when the gases are supplied or stopped in the invention, specific embodiments with eight substrates and six substrates are illustrated below with reference to FIG. 21 to FIG. 44. The invention adjusts the rotation speed and the substrate positions at the timings of gas supply and stop according to the configuration of the gas supply and exhaust means 2, so as to maintain the same ALD cycle number and the same exposure time for all the substrates and thereby achieve ALD deposition with the target film thickness, and thus the invention is not limited to the specific embodiments as disclosed.

Figure 21:
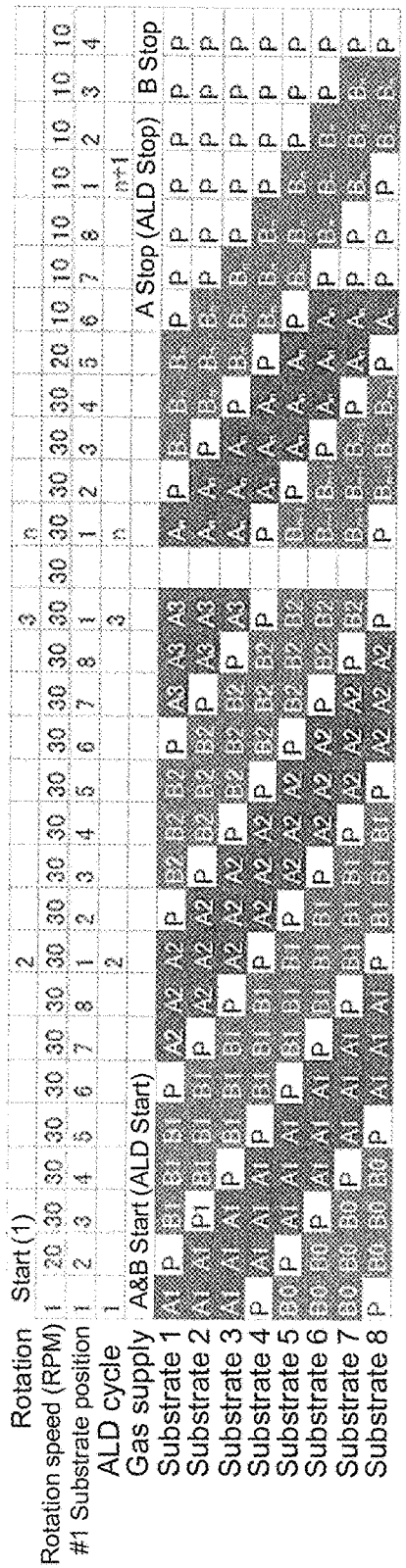
FIG. 21 is a diagram showing the ALD process sequence in the fifth embodiment of the invention in the configuration of the gas supply and exhaust means and eight substrates as shown in FIG. 12.
Figure 22:
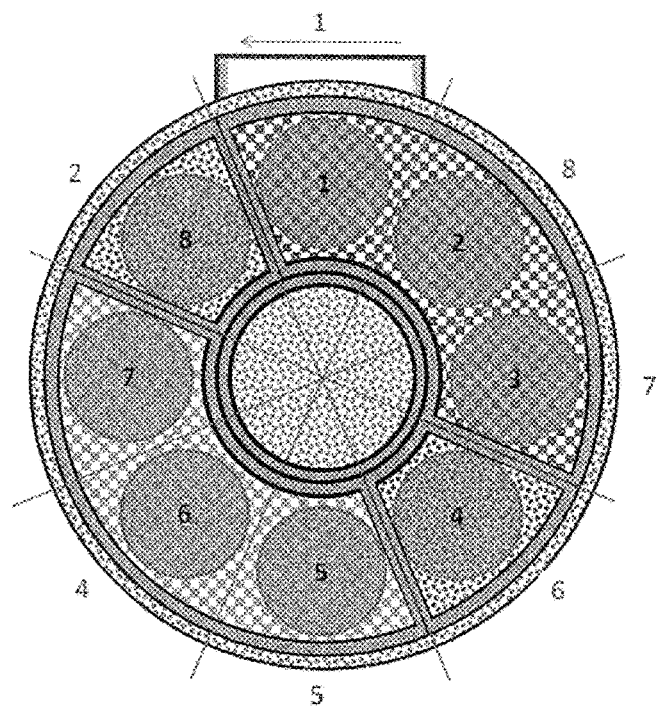
FIG. 22 is a diagram showing the substrate configuration when the ALD process starts in the fifth embodiment of the invention in the configuration of the gas supply and exhaust means and eight substrates as shown in FIG. 12.
Figure 23:
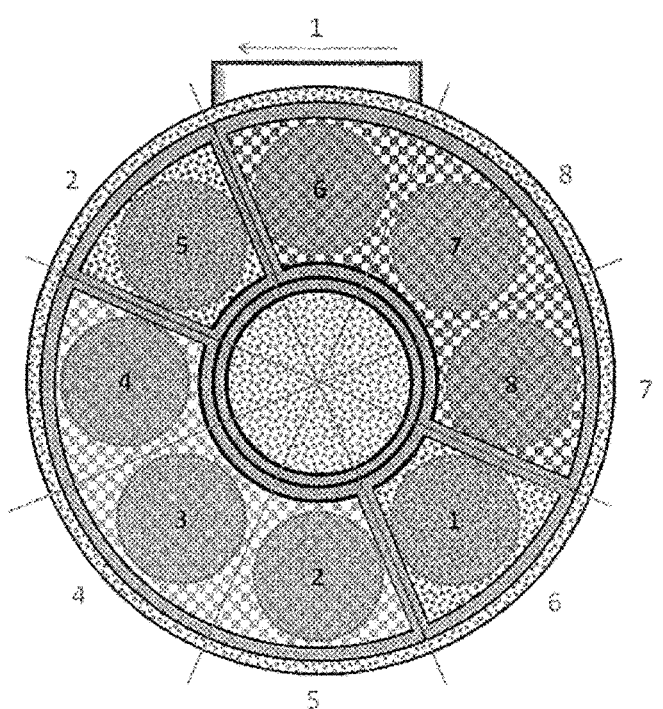
FIG. 23 is a diagram showing the substrate configuration when the ALD process ends in the fifth embodiment of the invention in the configuration of the gas supply and exhaust means and eight substrates as shown in FIG. 12.

As one embodiment of the invention, FIG. 21 illustrates an ALD process sequence, in which the number of the substrates being processed is eight, and the metal-containing reaction gas supply and exhaust part 21 and the non-metal reaction gas supply and exhaust part 22 are disposed to sandwich a purge area equivalent to one substrates being processed and the two reaction gas supply parts respectively occupy an area equivalent to four substrates. Moreover, FIG. 22 and FIG. 23 illustrate the substrate positions when the ALD starts and ends in this sequence. In this sequence diagram, the symbol A represents the metal-containing reaction gas, the symbol B represents the non-metal reaction gas, and the symbol P represents the purge gas. In order to clearly show the relative positions of the substrates being processed 4 and the gas supply means 2, the gas supply and exhaust means 2 is divided into eight areas, respectively assigned with numbers 1-8. In the home position, the first substrate corresponds to the first position. Sequentially, the second substrate corresponds to the eighth position and the third substrate corresponds to the seventh position in the reverse direction. In this embodiment, in the home position, the metal-containing reaction gas and the non-metal reaction gas start to flow at the same time, which is defined as the ALD start time point. At the moment, as shown in FIG. 22, the first to third substrates are in contact with the metal-containing reaction gas and the fifth to seventh substrates are in contact with the non-metal reaction gas. The fourth and eighth substrates are in contact with the purge gas. At the ALD start time point, the first substrates being processed is in contact with only one metal reaction gas area for $\frac{1}{3}$ of the contact time in the steady state. Likewise, the time during which the second substrates being processed is in contact with the metal reaction gas is $\frac{2}{3}$ of the contact time in the steady state. To compensate for the short contact time, when the rotation starts, the rotation speed is set to be $\frac{1}{3}$ of the steady rotation or less in the first substrate exposure step. Likewise, the rotation speed is set to be $\frac{2}{3}$ of the steady rotation or less in the second substrate exposure step. In the embodiment, the steady rotation speed is set to be 30 RPM, the rotation speed for processing the first substrate is set to be 5 RPM, and the rotation speed for processing the second substrate is set to be 20 RPM. The reason for setting the rotation speed to 10 RPM ($\frac{1}{3}$ of the steady rotation) instead of 5 RPM when the ALD starts is that, when the supply of the reaction gas starts, the switching may take about 2 seconds or more, and the switching from the purge gas to the reaction gas also takes the time lag for actually ejecting the gas to the substrates being processed into consideration. Alternatively, in the state where the rotation of the susceptor is stopped, when the supply of the reaction gas starts, the rotation may wait about 2 to 3 seconds to start. By performing such fluctuating rotation speed control at the time of starting ALD, all the substrates being processed may be exposed to the first metal reaction gas for sufficient time.

On the other hand, in this embodiment, the ALD stops as shown in FIG. 23, which is set as the timing of cutting off the metal reaction gas. At the moment, the first substrates being processed is located in the sixth gas supply means area (the purge gas supply part). At the time point the ALD reaction sequence is completed, the metal reaction gas has been exposed to all the eight substrates n times. The non-metal reaction gas continues to flow even after the metal-containing reaction gas is cut off. Then, by stopping the non-metal reaction gas at the time that the first substrate reaches the fourth gas supply means area in the $n+1^{th}$ revolution or thereafter, for all the substrates, the surface of the substrates being processed may be terminated with the non-metal gas. As a result, all the eight substrates being processed are applied with n layers of the ALD sequence. Here, when the metal-containing reaction gas is stopped, the eighth substrates being processed has just entered the area of the last metal-containing reaction gas supply means and is in contact with the metal-containing reaction gas for only ⅓ of the time in the steady rotation state. Therefore, in the last substrate processing step of completing the ALD, the susceptor rotation speed is set to be ⅓ of the steady speed or less. Moreover, at the time of processing the previous substrate, the contact time of the seventh substrates being processed and the metal-containing reaction gas is ⅔ of the steady rotation state. Thus, the rotation speed is set to be ⅔ of the steady rotation speed or less. In this embodiment, the rotation speed is lowered to 20 RPM at the time of starting processing the two substrates prior to the cut-off of the metal-containing reaction gas, and the rotation speed is further lowered to 10 RPM at the cut-off. The steady rotation speed is set to be 30 revolutions per minute in this embodiment but not limited thereto. As described later in the sixth embodiment of the invention, the steady rotation speed may be set in advance according to the maximum aspect ratio of the pattern of the substrates being processed. For example, if the pattern aspect ratio is about 10, it is possible to increase the rotation speed to approximately 200 RPM without lowering the step coverage characteristic. Moreover, in the case of performing the fluctuating rotation speed control when the ALD starts and ends, the first and the last revolutions may somewhat require more time. Since the overall rotation speed is 100 revolutions or more, its influence on the throughput is small and negligible.

Figure 24:
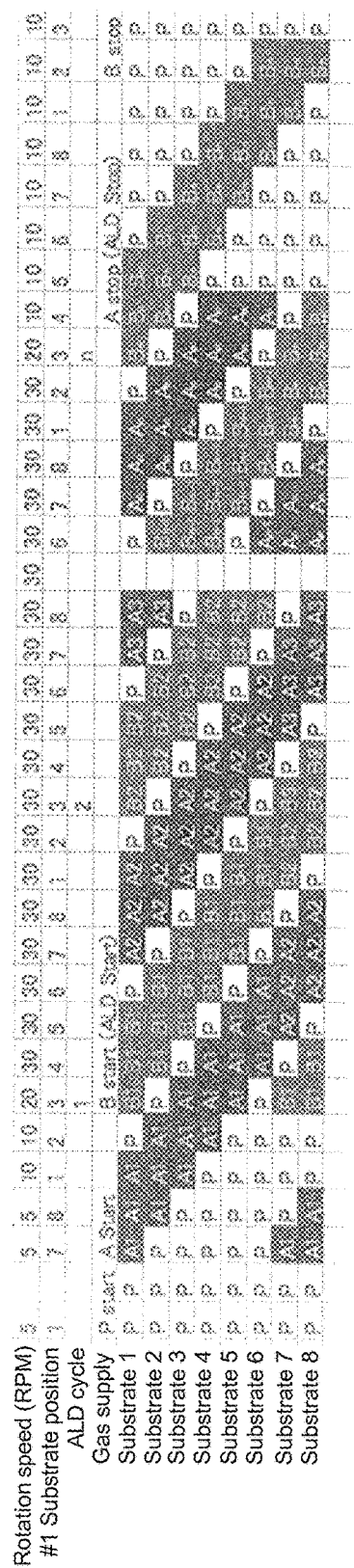
FIG. 24 is a diagram showing the ALD process sequence in the fifth embodiment of the invention considering the incubation in the configuration of the gas supply and exhaust means and eight substrates as shown in FIG. 12.
Figure 25:
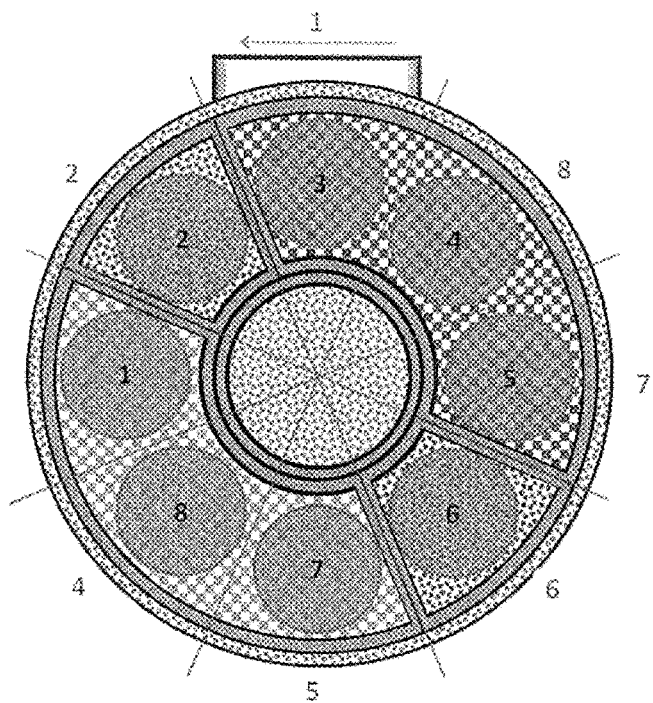
FIG. 25 is a diagram showing the substrate configuration when the ALD process starts in the fifth embodiment of the invention considering the incubation in the configuration of the gas supply and exhaust means and eight substrates as shown in FIG. 12.
Figure 26:
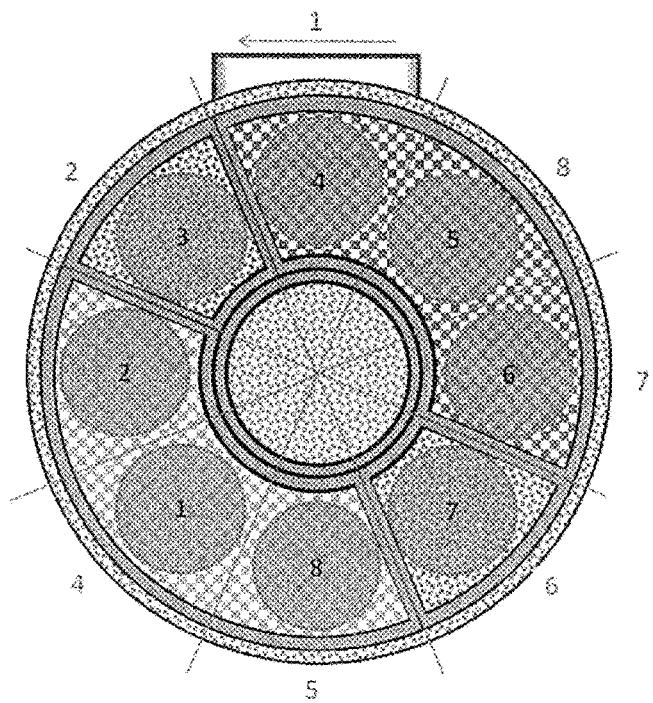
FIG. 26 is a diagram showing the substrate configuration when the ALD process ends in the fifth embodiment of the invention considering the incubation in the configuration of the gas supply and exhaust means and eight substrates as shown in FIG. 12.

As the second embodiment of the invention, FIG. 24 illustrates an ALD process sequence with respect to another embodiment, in which the number of the substrates being processed is eight, and the metal-containing reaction gas supply and exhaust part 21 and the non-metal reaction gas supply and exhaust part 22 are disposed to sandwich a purge area equivalent to one substrates being processed and the two reaction gas supply parts respectively cover an area equivalent to three substrates. Moreover, FIG. 25 and FIG. 26 illustrate the substrate positions when the ALD starts and ends in this sequence. In the ALD process, the so-called incubation often occurs, that is, for the first few cycles, it is difficult to proceed with the adsorption reaction, and there is no progress in the deposition. The reason is that it is difficult to carry out the first metal reaction gas adsorption, and the substrates being processed needs to be in contact with only the metal-containing reaction gas relatively longer. In addition, if the atoms of the first layer adsorbed to the substrates being processed are not metal atoms or non-metal atoms, characteristics of the thin film formed by the ALD deposition may deteriorate. Therefore, in this embodiment, it is assumed that the adatoms of the first layer are metal. For the first few revolutions, after the metal-containing reaction gas is supplied to flow to sufficiently expedite the initial adsorption reaction of metal atoms, the non-metal reaction gas is caused to flow when the substrates being processed 4 reaches the predetermined location of the gas supply and exhaust means 2. In this case, the time the non-metal reaction gas starts to flow is set as the ALD start time. In this embodiment, as shown in FIG. 25, the ALD start time is the time when the first substrates being processed reaches the third position (the first non-metal reaction gas supply part). In this case, since the seventh substrate is in the fifth position, the seventh substrate is exposed to only one non-metal reaction gas supply and exhaust part 22 and the contact time becomes ⅓ in contrast to the steady state where the substrate is usually exposed to three consecutive non-metal reaction gas exhaust part 22. Likewise, the time during which the eighth substrate is in contact with the non-metal reaction gas is ⅔ of the steady state. In order to compensate for the reduction of the contact time with the non-metal reaction gas, the rotation speed for the initial processing of the first substrate is set to be ⅓ of the steady rotation or less, and the rotation speed for the processing of the second substrate is set to be ⅔ of the steady rotation speed or less. In the diagram, the time of supplying only the metal-containing reaction gas is set to be within one cycle. If the incubation time is long, the time may be increased to several cycles.

Same as the above embodiment, the stop of the ALD is set as the timing of cutting off the metal reaction gas. At the moment, as shown in FIG. 26, the first substrates being processed is located in the fourth gas supply means area (center of the non-metal reaction gas supply part). At the time point the ALD reaction sequence is completed, the metal reaction gas has been exposed to all the eight substrates n times. The non-metal reaction gas continues to flow even after the metal-containing reaction gas is cut off. Then, by stopping the non-metal reaction gas at the time that the first substrate reaches the second gas supply means area in the n+1$^{th}$ revolution or thereafter, for all the substrates, the surface of the substrates being processed may be terminated with the non-metal gas. As a result, all the eight substrates being processed are applied with n layers of the ALD sequence. Here, when the metal-containing reaction gas is stopped, the sixth substrates being processed has just entered the area of the last metal-containing reaction gas supply means and is in contact with the metal-containing reaction gas for only ⅓ of the time in the steady rotation state. Therefore, in the last substrate processing step of completing the ALD, the susceptor rotation speed is set to be ⅓ of the steady speed or less. Moreover, at the time of processing the previous substrate, the contact time of the fifth substrates being processed and the metal-containing reaction gas is ⅔ of the steady rotation state. Thus, the rotation speed is set to be ⅔ of the steady rotation speed or less. In this embodiment, the rotation speed is lowered to 20 RPM at the time of starting processing the two substrates prior to the cut-off of the metal-containing reaction gas, and the rotation speed is further lowered to 10 RPM at the cut-off.

Figure 27:
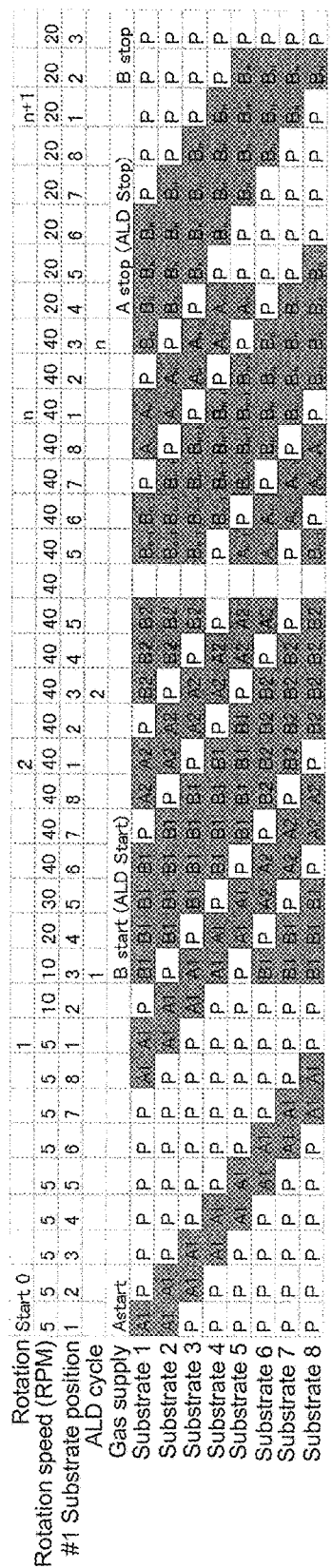
FIG. 27 is a diagram showing the ALD process sequence in the fifth embodiment of the invention in the configuration of the gas supply and exhaust means and eight substrates as shown in FIG. 14.
Figure 28:
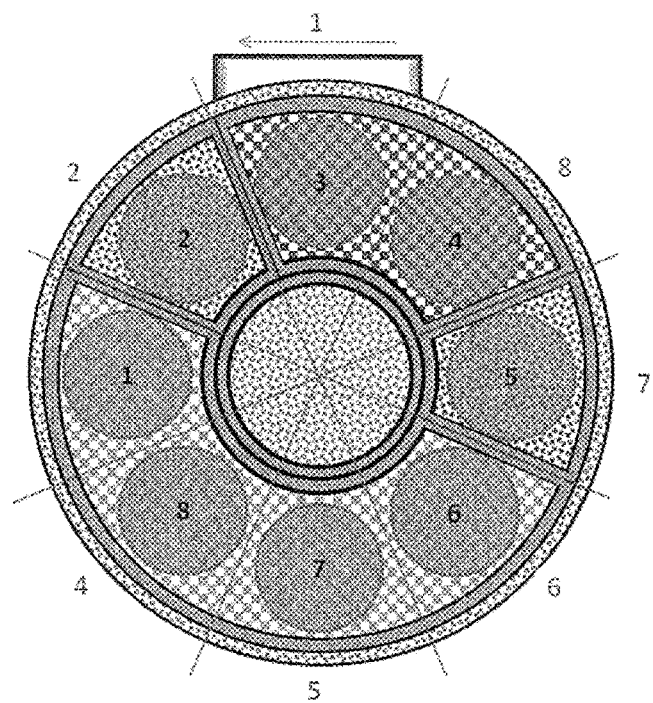
FIG. 28 is a diagram showing the substrate configuration when the ALD process starts in the fifth embodiment of the invention in the configuration of the gas supply and exhaust means and eight substrates as shown in FIG. 14.
Figure 29:
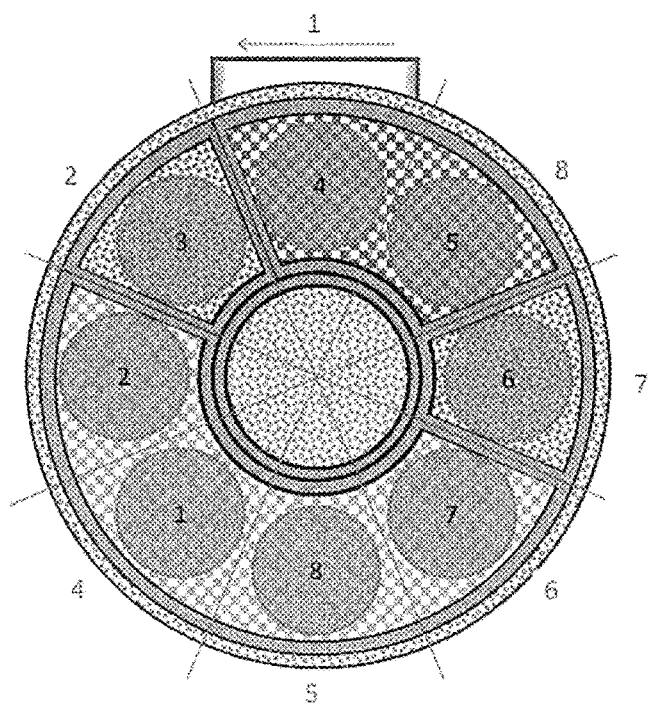
FIG. 29 is a diagram showing the substrate configuration when the ALD process ends in the fifth embodiment of the invention in the configuration of the gas supply and exhaust means and eight substrates as shown in FIG. 14.
Figure 30:
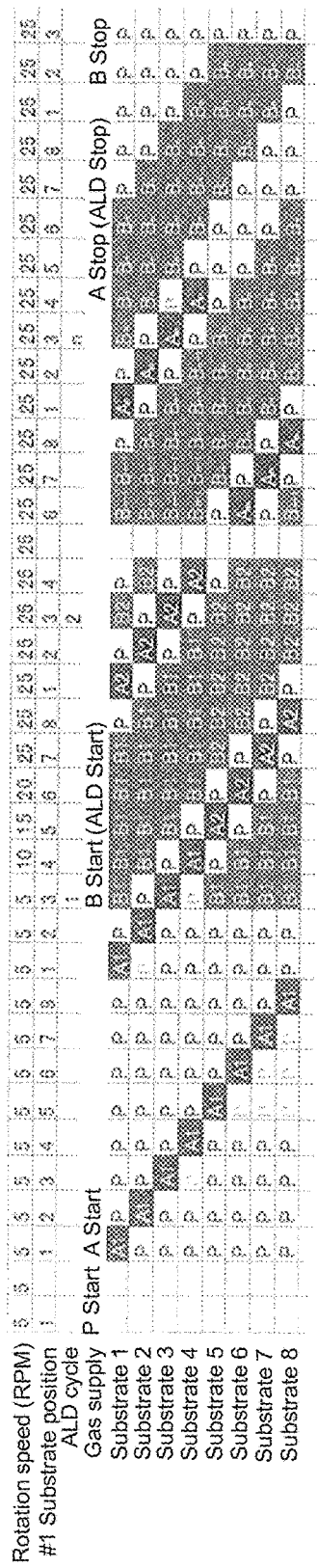
FIG. 30 is a diagram showing the ALD process sequence in the fifth embodiment of the invention in the configuration of the gas supply and exhaust means and eight substrates as shown in FIG. 16.

FIG. 27, FIG. 28, and FIG. 29 show yet another embodiment of the invention. Here, with the metal-containing reaction gas supply and exhaust part 21 and the non-metal reaction gas supply and exhaust part 22 being separated by an area equivalent to one substrates being processed, the corresponding device configuration is that the non-metal reaction gas supply and exhaust part 22 occupies an area that is twice as large as the metal-containing reaction gas supply and exhaust part 21. In other words, it is designed that the metal-containing reaction gas supply and exhaust part 21 occupies an area of two substrates while the non-metal reaction gas supply and exhaust part 22 occupies an area of four substrates. Regarding the ALD start, in order to reduce the incubation, only the metal-containing reaction gas is supplied in the first revolution such that the reaction gas is sufficiently adsorbed to the substrate surface. Then, when the first substrates being processed reaches the third position in the second revolution, the non-metal reaction gas starts to flow, and this time is set as the ALD start time. If the incubation time is long, the cycle of flowing only the metal-containing gas may be lengthened. Here, the initial contact areas between the sixth, seventh, and eighth substrates and the non-metal gas are ¼, ½, and ¾ respectively compared to the steady state. Therefore, the initial rotation speeds for processing the first, second, and third substrates are respectively set to be ¼, ½, and ¾ of the steady rotation speed or less. By performing the fluctuating rotation speed control at the time the ALD starts, the contact time with the non-metal reaction gas may be made the same for all the substrates.

Regarding ALD completion, when the first substrate reaches the fourth position in the $n^{th}$ revolution, supply of the metal-containing reaction gas is stopped and this time point is set as the time of ALD completion. At this moment, the area by which the fifth substrate contacts the metal reaction gas is only ½ of the steady state. Thus, the rotation speed for processing the last substrate is set to be ½ of the steady rotation speed or less, so as to ensure that the contact time with respect to the $n^{th}$ non-metal gas is the same for all the substrates. After the ALD is completed, only the non-metal reaction gas flows, so as to apply n layers of the ALD sequence to all the substrates being processed and terminate the surfaces of the substrates with the non-metal reaction gas.

Figure 16:
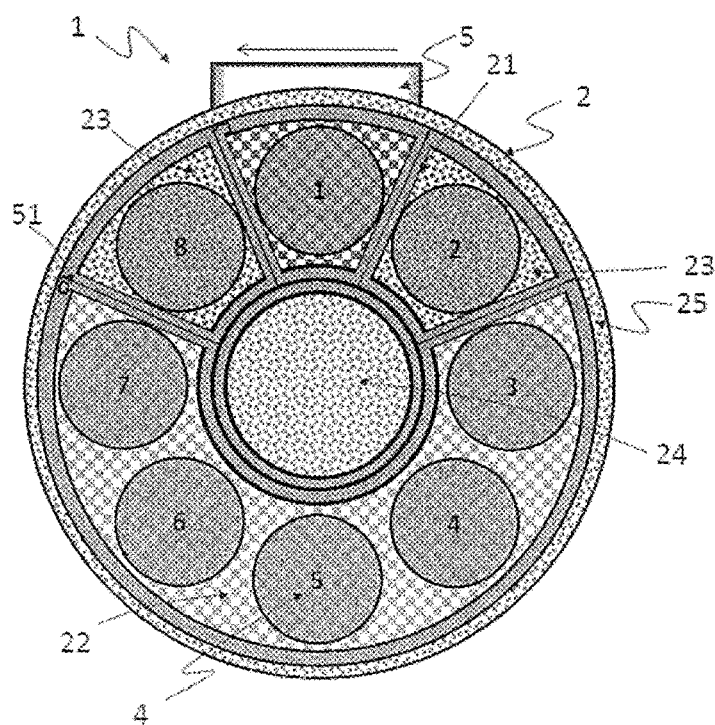
FIG. 16 is a schematic plan view of the ALD device in the third embodiment of the invention where eight substrates are disposed and the metal-containing reaction gas supply means occupies the area equivalent to one substrate.

As shown in FIG. 16, even in the case that the metal-containing reaction gas supply and exhaust part 21 occupies an area equivalent to one substrate, the non-metal reaction gas supply and exhaust part 22 occupies an area equivalent to five substrates, and the two reaction gas supply parts are separated by the purge gas supply and exhaust part 23 equivalent to one substrate, by performing the substrate position control and the fluctuating rotation speed control when the ALD starts and ends, n layers of ALD processing may be applied and the exposure time may be maintained the same for all the substrates being processed, and furthermore, all the surfaces may be terminated with the non-metal gas. Detailed descriptions thereof have been specified in the above embodiment and thus are not repeated.

Figure 13:
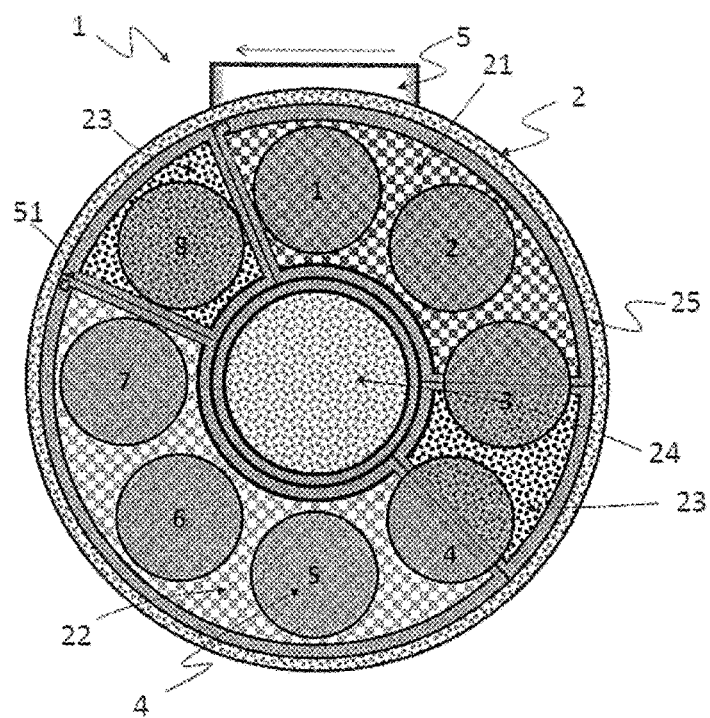
FIG. 13 is a schematic plan view of the ALD device in the third embodiment of the invention where eight substrates are disposed and the metal-containing reaction gas supply means occupies the area equivalent to 2.5 substrates.
Figure 14:
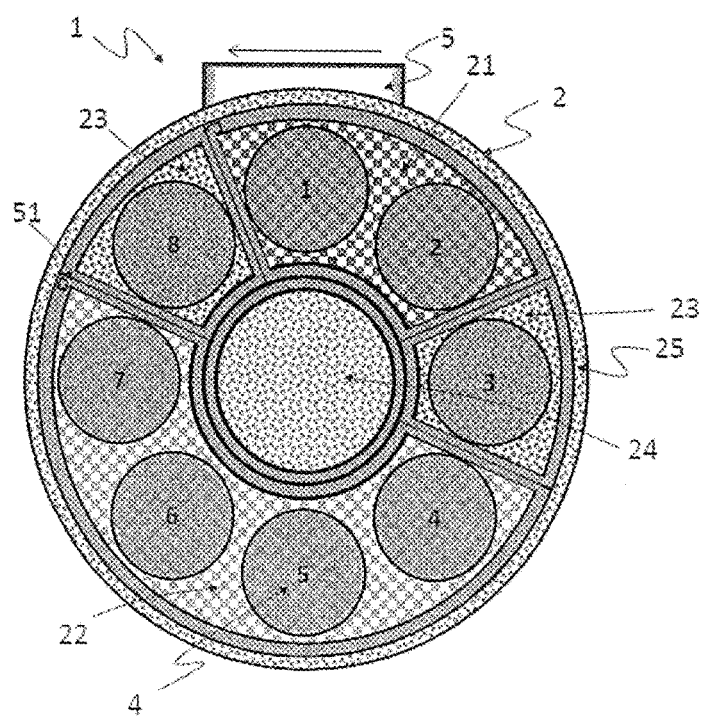
FIG. 14 is a schematic plan view of the ALD device in the third embodiment of the invention where eight substrates are disposed and the metal-containing reaction gas supply means occupies the area equivalent to two substrates.
Figure 31:
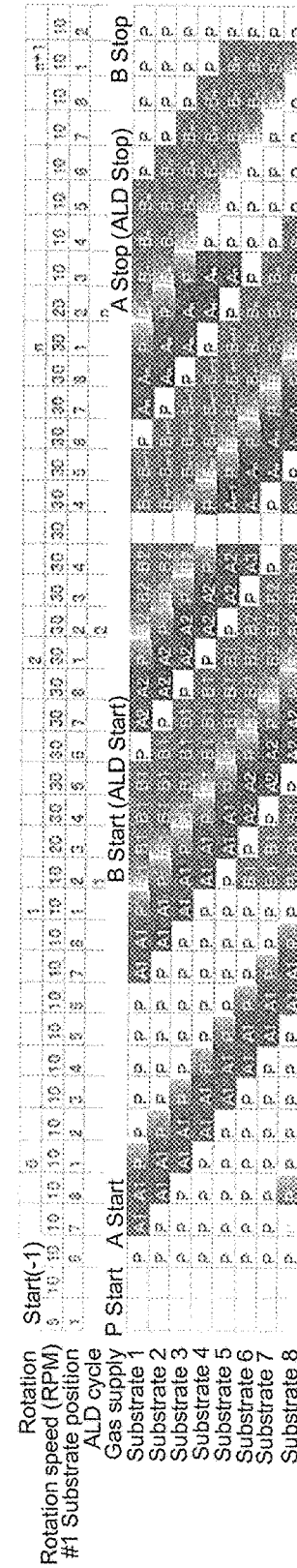
FIG. 31 is a diagram showing the ALD process sequence in the fifth embodiment of the invention in the configuration of the gas supply and exhaust means and eight substrates as shown in FIG. 13.
Figure 32:
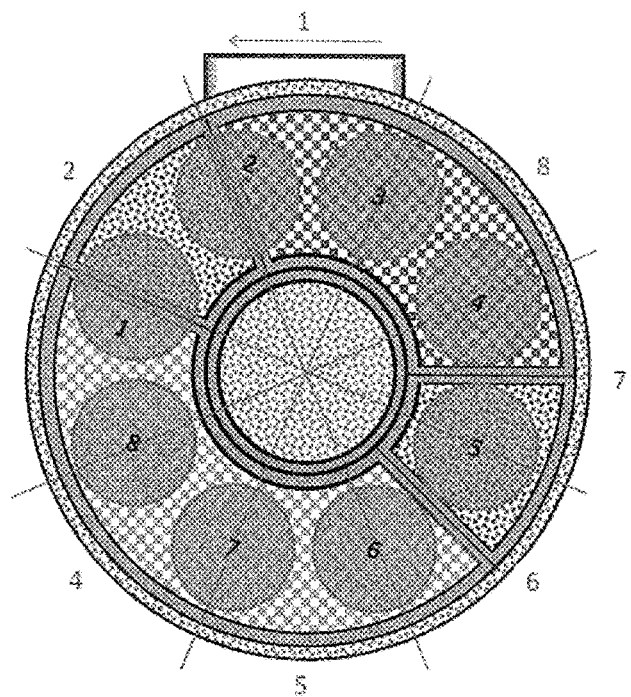
FIG. 32 is a diagram showing the substrate configuration when the ALD process starts in the fifth embodiment of the invention in the configuration of the gas supply and exhaust means and eight substrates as shown in FIG. 13.
Figure 33:
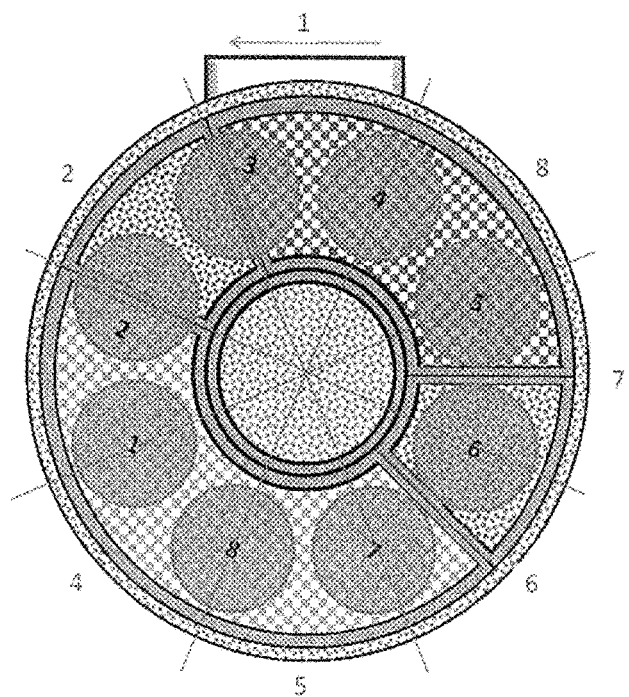
FIG. 33 is a diagram showing the substrate configuration when the ALD process ends in the fifth embodiment of the invention in the configuration of the gas supply and exhaust means and eight substrates as shown in FIG. 13.

In addition, FIG. 31, FIG. 32, and FIG. 33 are used to describe an embodiment of the ALD process sequence, in which the number of the substrates being processed is eight, as shown in FIG. 13, and the metal-containing reaction gas supply and exhaust part 21 and the non-metal reaction gas supply and exhaust part 22 are disposed to sandwich the purge gas supply and exhaust part 23 equivalent to one substrates being processed, and the metal-containing reaction gas supply and exhaust part 21 and the non-metal reaction gas supply and exhaust part 23 respectively occupy an area equivalent to 2.5 substrates being processed and an area equivalent to 3.5 substrates being processed. In this embodiment, in order to reduce the incubation, only the metal-containing reaction gas is supplied such that the metal-containing reaction gas is sufficiently adsorbed to the substrate surface. Then, when the first substrates being processed reaches the position between the second and third positions as shown in FIG. 23, the non-metal reaction gas starts to flow, and this time is set as the ALD start time. Here, the initial contact areas between the sixth, seventh, and eighth substrates and the non-metal gas are 2/7, 4/7, and 6/7 respectively compared to the steady state. Therefore, the initial rotation speeds for processing the first, second, and third substrates are respectively set to be 2/7, 4/7, and 6/7 of the steady rotation speed or less. Particularly, when the first substrate is processed, the time lag in switching from the purge gas to the non-metal gas is taken into consideration and it is necessary to further reduce the rotation speed. In this embodiment, it is set to be 5 RPM. By performing the fluctuating rotation speed control at the time the ALD starts, the contact time with the non-metal reaction gas may be made the same for all the substrates.

Regarding ALD completion, when the first substrate reaches the middle between the third and fourth positions in the $n^{th}$ revolution, as shown in FIG. 33, the time point when the metal-containing reaction gas is stopped is set as the time of ALD completion. At this moment, the areas by which the fifth and fourth substrates contact the metal reaction gas are only 2/5 and 4/5 of the steady state. Thus, the rotation speeds for processing the second last and the last substrates are set to be 4/5 and 2/5 of the steady rotation speed or less, so as to ensure that the contact time with respect to the $n^{th}$ non-metal gas is the same for all the substrates. After the ALD is completed, only the non-metal reaction gas flows, so as to apply n layers of the ALD deposition and maintain the same exposure time for all the substrates being processed and further terminate the surfaces of the substrates with the non-metal gas.

Figure 15:
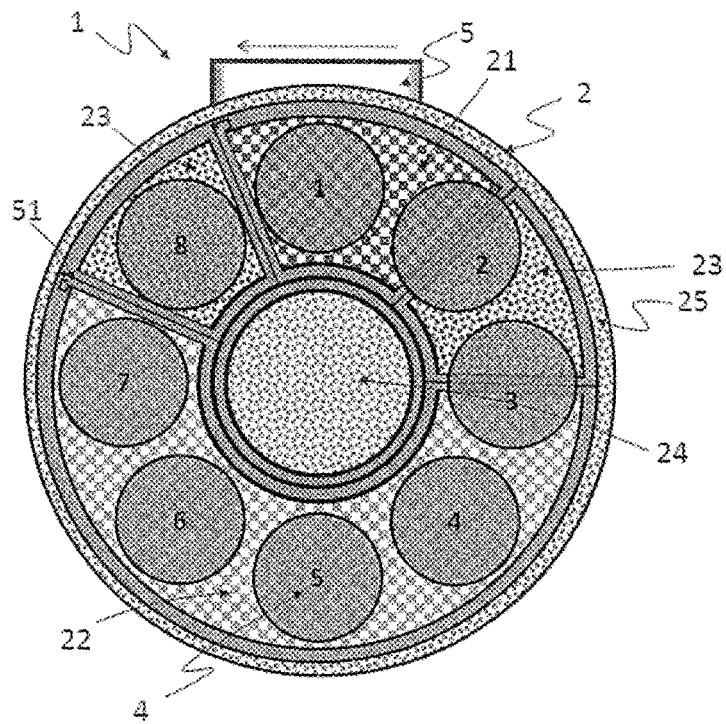
FIG. 15 is a schematic plan view of the ALD device in the third embodiment of the invention where eight substrates are disposed and the metal-containing reaction gas supply means occupies the area equivalent to 1.5 substrates.
Figure 34:
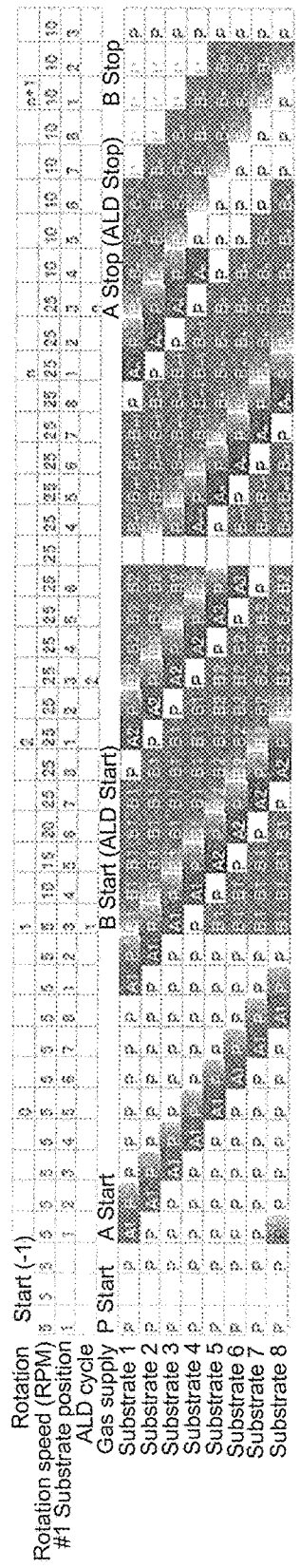
FIG. 34 is a diagram showing the ALD process sequence in the fifth embodiment of the invention in the configuration of the gas supply and exhaust means and eight substrates as shown in FIG. 15.

FIG. 34 illustrates an embodiment of the ALD process sequence, in which the number of the substrates being processed is eight, as shown in FIG. 15, and the metal-containing reaction gas supply and exhaust part 21 and the non-metal reaction gas supply and exhaust part 22 are disposed to sandwich the purge gas supply and exhaust part 23 equivalent to one substrates being processed, and the metal-containing reaction gas supply and exhaust part 21 and the non-metal reaction gas supply and exhaust part 23 respectively occupy an area equivalent to 1.5 substrates being processed and an area equivalent to 4.5 substrates being processed. In this case, the substrate position control and the fluctuating rotation speed control may also be performed when the ALD starts and ends, so as to apply n layers of the ALD process and maintain the same exposure time for all the substrates being processed and further terminate the surfaces of all the substrates with the non-metal gas. Detailed descriptions thereof have been specified in the above embodiment and thus are not repeated.

Figure 35:
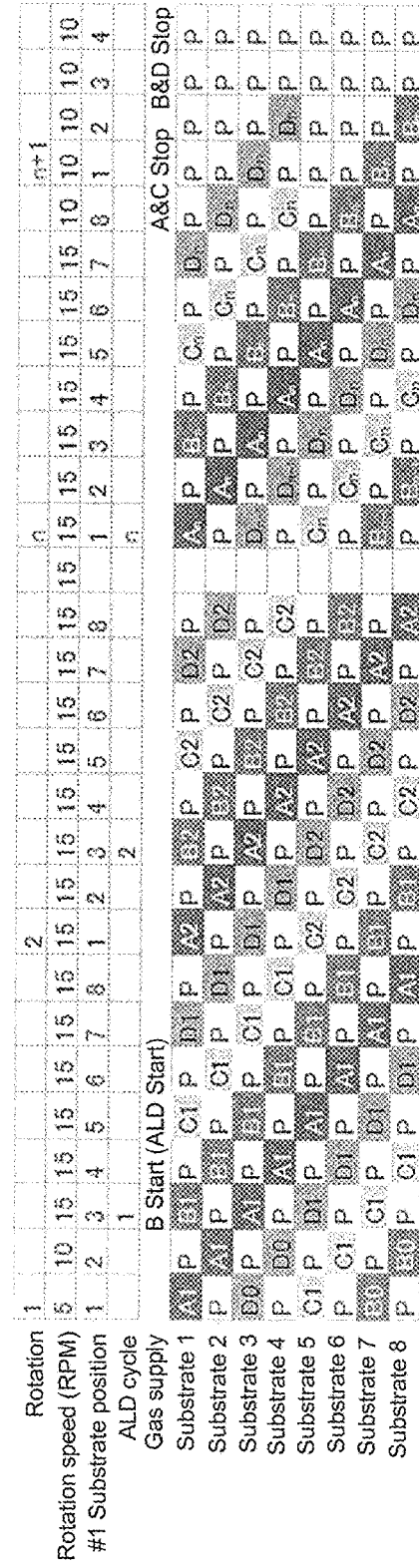
FIG. 35 is a diagram showing the ALD process sequence in the fifth embodiment of the invention in the configuration of two pairs of gas supply and exhaust means and eight substrates as shown in FIG. 17.
Figure 36:
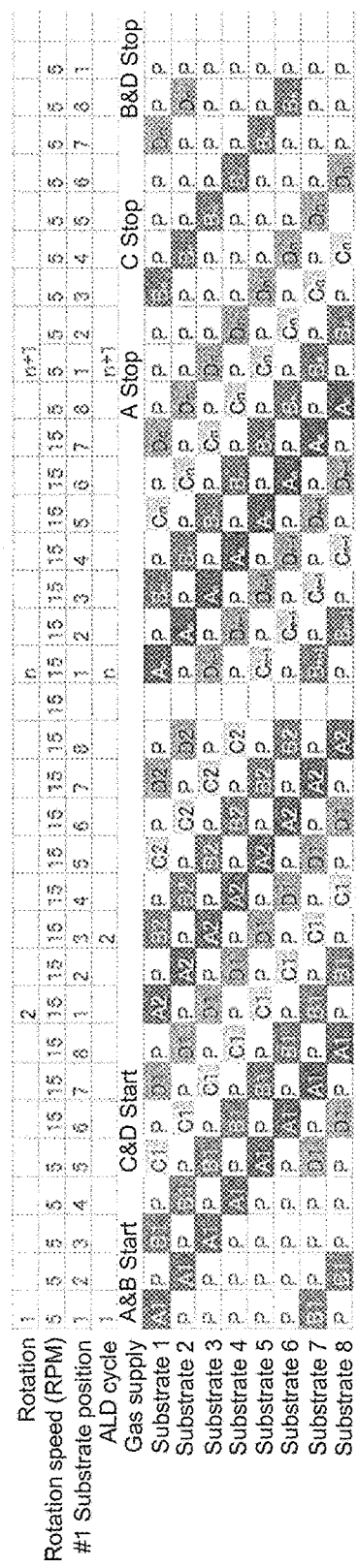
FIG. 36 is a diagram showing the ALD process sequence in the fifth embodiment of the invention in the configuration of two pairs of gas supply and exhaust means and eight substrates as shown in FIG. 17.
Figure 37:
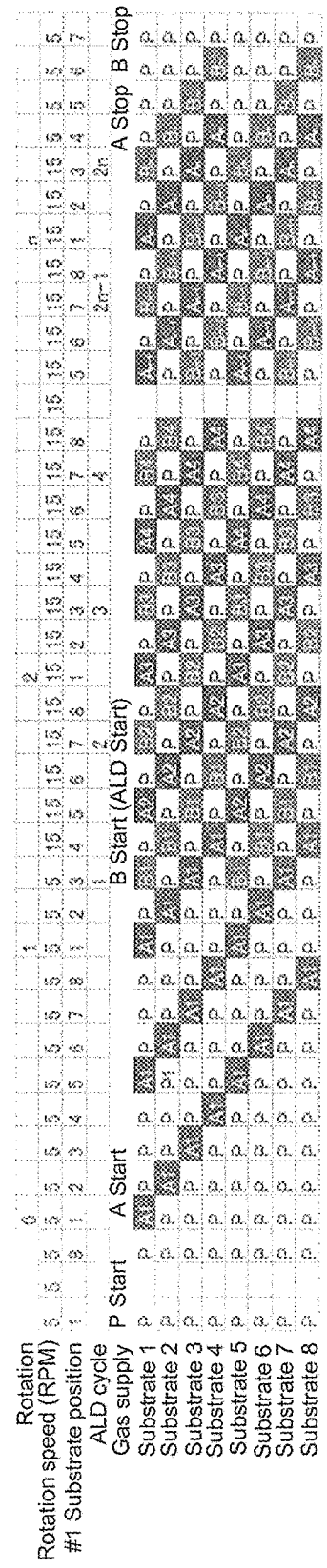
FIG. 37 is a diagram showing the ALD process sequence in the fifth embodiment of the invention in the configuration of two pairs of gas supply and exhaust means and eight substrates as shown in FIG. 17.

FIG. 35 to FIG. 37 illustrate an embodiment of the ALD sequence, in which one revolution of the rotating susceptor 3 includes a plurality of ALD cycles. In this process sequence diagram, the symbols A, B, C, D, and P respectively represent the first metal-containing reaction gas, the first non-metal reaction gas, the second metal-containing reaction gas, the second non-metal reaction gas, and the purge gas. Here, as shown in FIG. 17, eight substrates being processed are disposed on the rotating susceptor 3, and two sets of a gas supply and exhaust means including the metal-containing reaction gas, the first purge gas, the non-metal reaction gas, and the second purge gas are disposed. In this case, as shown in FIG. 35, initially in the home position that the first substrate is in the first position, all the gases start to flow and simultaneously the rotation starts at a low speed. In this embodiment, considering the time lag in switching from the purge gas to the reaction gas, the rotation speed at the start is set to be ⅓ of the steady rotation speed. For the first to fourth substrates, the film containing the first metal is first deposited on the substrate. For the fifth to eighth substrates, the film containing the second metal is first deposited on the substrate. Regarding the stop of the ALD, when the first substrate that has just reached the $n+1^{th}$ revolution comes to the first position, the first and second metal-containing reaction gases are both cut off, and this time point is set as the ALD completion time point. The first and second non-metal reaction gases are cut off at the time the first substrate reaches the third position or thereafter. By this sequence, the ALD film formed by a predetermined number of times of depositions is obtained on all the substrates, and all substrate surfaces are terminated with the non-metal reaction gas and are in a stable state. However, for the first to third substrates, the outermost layer is composed of the film containing the second metal, and the outermost layer of the fourth to eighth substrates is composed of the film containing the first metal.

FIG. 36 illustrates an ALD process sequence, in which the deposition starts with the film containing the first metal for all the substrates with the configuration of the gas supply and exhaust means shown in FIG. 17. In this case, the supply of the first metal-containing reaction gas and the first non-metal reaction gas starts when the rotating susceptor 3 is in the home position, and the rotation starts. Then, when the first substrate reaches the fifth position, the supply of the second metal-containing reaction gas and the second non-metal reaction gas starts. By this sequence, for all the substrates, the film containing the first metal is deposited first and then the film containing the second metal is deposited. Regarding ALD completion, when the first substrate reaches the eighth position in the $n^{th}$ revolution, only supply of the first metal-containing reaction gas is stopped. Then, when the first substrate reaches the fourth position in the $n+1^{th}$ revolution, the first metal-containing reaction gas is cut off. Both the non-metal reaction gases are cut off at the time the first substrate reaches the eighth position in the $n+1^{th}$ revolution or thereafter. By such a sequence, n layers of hybrid deposition with the same film order may be formed on all the substrates.

FIG. 37 illustrates an embodiment where the deposition is carried out with the film containing only the first metal for all the substrates with the configuration of the gas supply and exhaust means shown in FIG. 17. First, the metal-containing reaction gas supply and exhaust parts in the first and fifth positions only supply the metal-containing reaction gas. When the first substrate reaches the third position, supply of the two non-metal reaction gases starts and this time point is set as the ALD start time point. Regarding ALD completion, when the first substrate reaches the third position in the $n^{th}$ revolution, the two metal-containing reaction gas supply and exhaust parts are cut off, and thereafter, when the first substrate reaches the sixth position, the two non-metal reaction gases are cut off. By this sequence, 2n layers (an even number) of ALD deposition are applied to all the substrates. 2n+1 layers (an odd number) of ALD deposition is achieved by shifting the timing of the cut-off by half a revolution, and cutting off both metal reaction gases when the first substrate reaches the seventh position and cutting off the non-metal reaction gas when the first substrate reaches the second position in the $n+1^{th}$ revolution.

Figure 38:
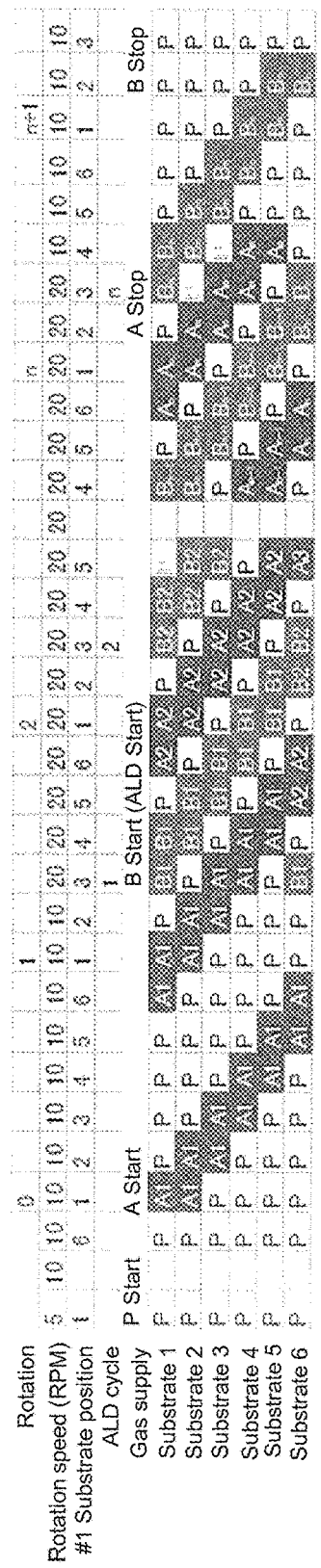
FIG. 38 is a diagram showing the ALD process sequence in the fifth embodiment of the invention in the configuration of the gas supply and exhaust means and six substrates as shown in FIG. 4.
Figure 39:
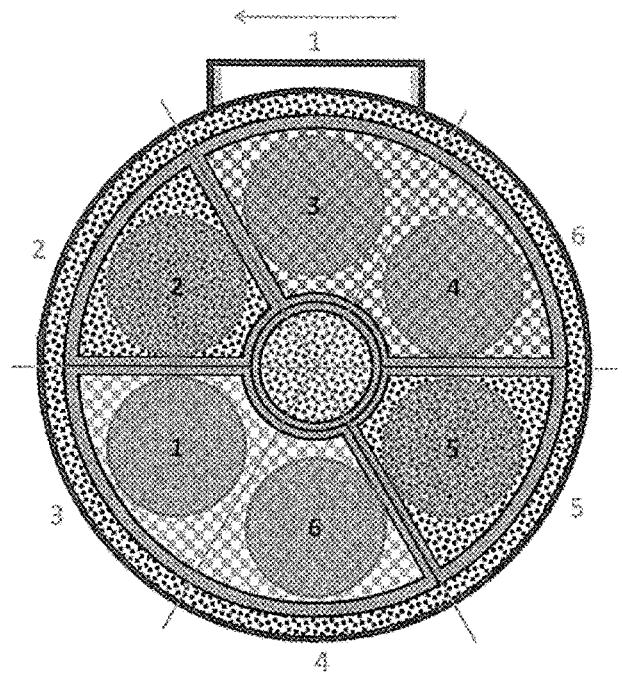
FIG. 39 is a diagram showing the substrate configuration when the ALD process starts in the fifth embodiment of the invention in the configuration of the gas supply and exhaust means and six substrates as shown in FIG. 4.
Figure 40:
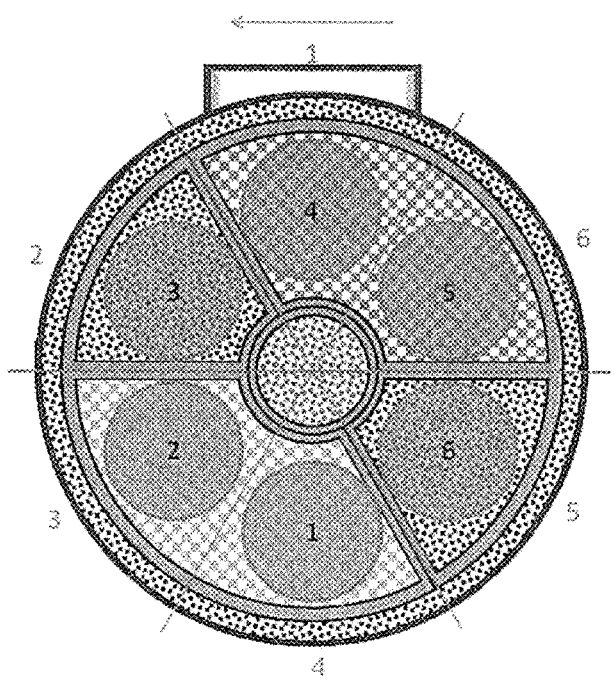
FIG. 40 is a diagram showing the substrate configuration when the ALD process ends in the fifth embodiment of the invention in the configuration of the gas supply and exhaust means and six substrates as shown in FIG. 4.

Further, FIG. 38 to FIG. 40 show an example of the embodiment of the ALD process sequence with the device configuration that six substrates being processed are disposed on the rotating susceptor 3. Here, as shown in FIG. 4, the metal reaction gas supply and exhaust part 21 and the non-metal gas supply and exhaust part 22 respectively occupy an area equivalent to two substrates and are separated by the purge gas supply and exhaust part 23 occupying an area equivalent to one substrate. In this embodiment, first only the metal-containing reaction gas is supplied such that the surfaces of all the substrates being processed sufficiently adsorb the metal-containing reaction gas. Then, when the first substrate reaches the third position as shown in FIG. 39, supply of the non-metal reaction gas starts and this time point is set as the ALD start time point of the first layer. Regarding the time point of ALD completion, when the $n^{th}$ revolution is reached and the first substrate reaches the fourth position as shown in FIG. 40, the supply of the metal-containing reaction gas is stopped. After that, only the non-metal gas is supplied. By this sequence, n layers of ALD deposition may be applied to all the six substrates and the surfaces of all the substrates may be terminated with the stable non-metal gas. In addition, similar to the case of eight substrates being processed, for the first layer and the last n layer of the ALD start, the fluctuating rotation control for lowering the rotation speed may be performed so as to ensure that the reaction gas contact time is the same for all the substrates being processed.

Figure 41:
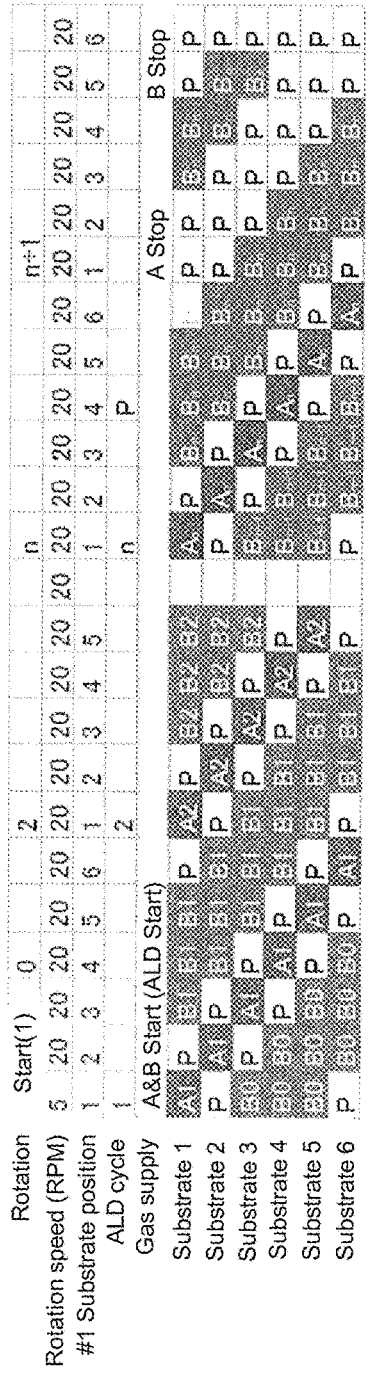
FIG. 41 is a diagram showing the ALD process sequence in the fifth embodiment of the invention in the configuration of the gas supply and exhaust means and six substrates as shown in FIG. 10.

Moreover, FIG. 41 illustrates an ALD process sequence with respect to the configuration that six substrates being processed are disposed on the rotating susceptor, as shown in FIG. 10, and the metal-containing reaction gas supply and exhaust part 21 occupies an area equivalent to one substrate while the non-metal reaction gas supply and exhaust part 22 occupies an area equivalent to three substrates, and the reaction gas supply and exhaust parts 21 and 22 are separated by the purge gas supply and exhaust part 23 occupying an area equivalent to one substrate. In this embodiment, in the home position where the first substrate is in the first position, all the gases start to supply and this time point is set as the ALD start time point. Regarding ALD completion, when the first substrate that has just reached the $n+1^{th}$ revolution comes to the first position, the metal-containing reaction gas is cut off and this time point is set as the ALD completion time point. Then, the non-metal reaction gas is stopped when the first substrate is in the fifth position in the $n+1^{th}$ revolution or thereafter. By this sequence, n layers of ALD deposition may be applied to all the six substrates and the surfaces of all the substrates may be terminated with the stable non-metal reaction gas. In addition, similar to the case of eight substrates being processed, for the first layer of the ALD start, the time lag in switching from the purge gas to the non-metal reaction gas is taken into consideration, and the rotation speed is reduced so as to ensure that the reaction gas contact time is the same for all the substrates being processed. In this embodiment, it is not required to perform the fluctuating rotation control at the time of completion.

Figure 42:
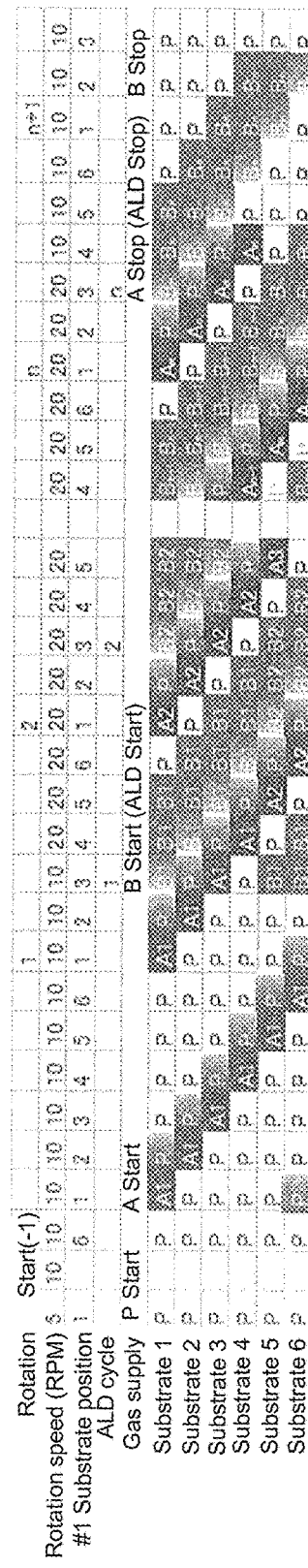
FIG. 42 is a diagram showing the ALD process sequence in the fifth embodiment of the invention with the configuration of the gas supply and exhaust means and six substrates as shown in FIG. 11.
Figure 43:
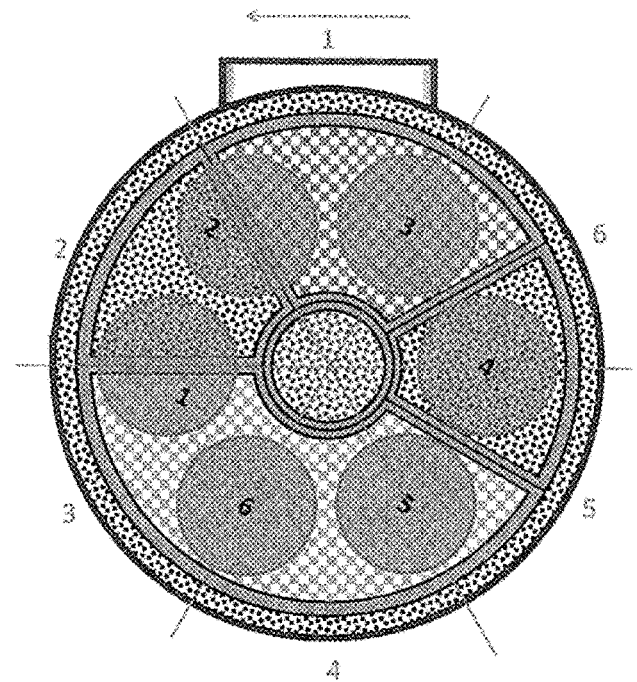
FIG. 43 is a diagram showing the substrate configuration when the ALD process starts in the fifth embodiment of the invention with the configuration of the gas supply and exhaust means and six substrates as shown in FIG. 11.
Figure 44:
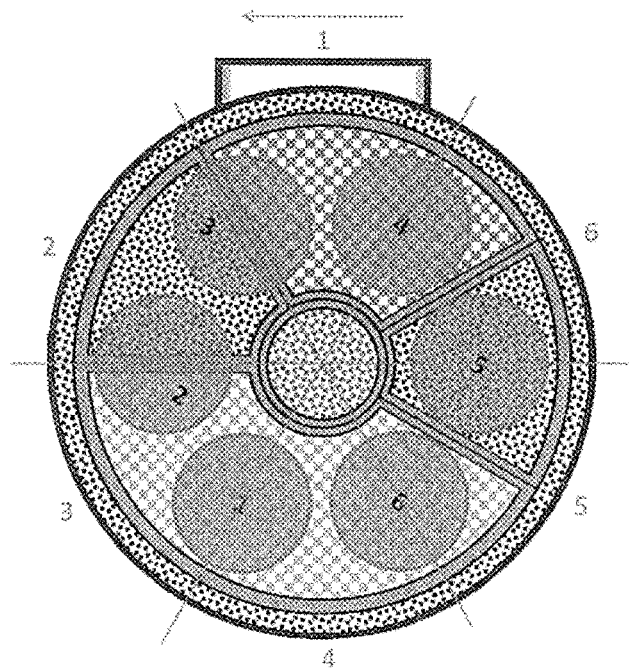
FIG. 44 is a diagram showing the substrate configuration when the ALD process ends in the fifth embodiment of the invention with the configuration of the gas supply and exhaust means and six substrates as shown in FIG. 11.

Furthermore, FIG. 42 to FIG. 44 illustrate an ALD process sequence with respect to the configuration that six substrates being processed are disposed on the rotating susceptor 3, as shown in FIG. 11, and the metal-containing reaction gas supply and exhaust part 21 occupies an area equivalent to 1.5 substrate while the non-metal reaction gas supply and exhaust part 22 occupies an area equivalent to 2.5 substrates, and the reaction gas supply and exhaust parts 21 and 22 are separated by the purge gas supply and exhaust part 23 occupying an area equivalent to one substrate. In this embodiment, when the first substrate reaches the middle position between the second and third positions, as shown in FIG. 43, the supply of the metal-containing reaction gas starts and this time point is set as the ALD start time point. Regarding ALD completion, when the $n^{th}$ revolution is reached and the first substrate reaches the middle position between the third and fourth positions as shown in FIG. 44, the metal-containing reaction gas is cut off and this time point is set as the ALD completion time point. Then, the non-metal reaction gas is stopped when the first substrate reaches the third position in the $n+1^{th}$ revolution or thereafter. By this sequence, n layers of ALD deposition may be applied to all the six substrates and the surfaces of all the substrates may be terminated with the stable non-metal gas. In addition, similar to the case of eight substrates being processed, for the first layer and the last n layer of the ALD start, the fluctuating rotation control for lowering the rotation speed is performed so as to ensure that the reaction gas contact time is the same for all the substrates being processed.

Figure 45:
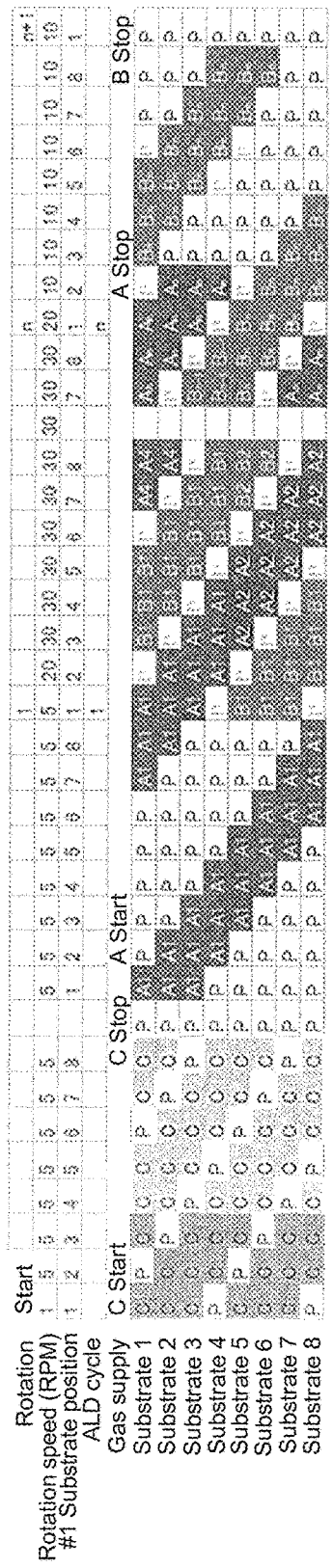
FIG. 45 is a diagram showing the sequence of the fifth embodiment of the invention when the pretreatment and the ALD process are performed in the same chamber using the configuration of the gas supply and exhaust means in the configuration shown in FIG. 12.
Figure 46:
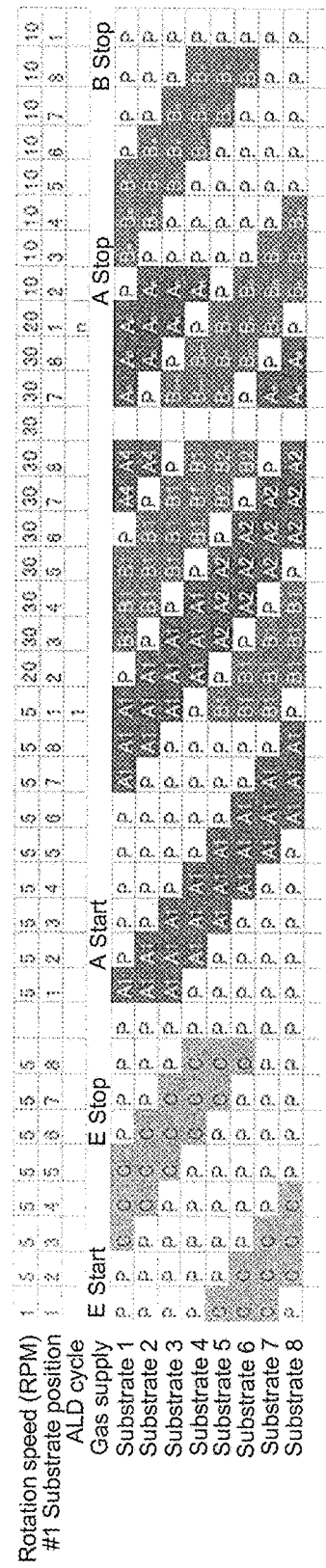
FIG. 46 is a diagram showing the sequence of the fifth embodiment of the invention when the pretreatment and the ALD process are performed in the same chamber using the configuration of the gas supply and exhaust means in the configuration shown in FIG. 12.

In the case of forming thin films such as the TiN metal electrode or High-k dielectric film of a DRAM capacitor by the ALD deposition, it may be required to remove the natural oxide film formed on the surface of the substrates being processed or perform a substrate pretreatment to form a high-quality radical oxide film on the substrate surface using low-damage plasma. According to the conventional technology, in such cases, a pretreatment chamber different from the ALD chamber has been used to carry out the pretreatment process. However, the device configuration for such a method is a cluster system, which is expensive and has low productivity. By applying the fifth embodiment of the invention, the pretreatment and the ALD deposition may be performed with use of the same process chamber. FIG. 45 illustrates an embodiment where the pretreatment is performed on the substrates being processed with an etching gas (gas C) before the ALD deposition. In this case, referring to FIG. 20, the etching time and the overetch ratio are set to calculate the rotation speed required for the pretreatment. First, the etching gas is ejected to the surface of the substrates being processed from the two reaction gas supply and exhaust parts 21 and 22 to etch the surface. Here, the susceptor is rotated so as to maintain the uniformity of the etching of all the substrates. Since the rotation speed does not affect the productivity, the rotation may be slow. At the time that the etching pretreatment is completed, the gas is changed to the purge gas and the rotation continues for 2-3 revolutions. Then, at the time that the pretreatment gas is completely exhausted and the rotating susceptor reaches the home position, the supply of the metal-containing reaction gas starts such that the substrate surface that has been surface-processed sufficiently adsorbs the metal-containing reaction gas. Thereafter, when the first substrate reaches the first position (the home position), the supply of the non-metal reaction gas starts and this time point is set as the ALD start time point. Regarding ALD completion, when the first substrate reaches the second position in the $n^{th}$ revolution, the supply of the metal-containing reaction gas is stopped and this time point is set as the ALD completion time point. After that, the non-metal reaction gas continues to flow, and when the first substrate reaches the eighth position in the $n^{th}$ revolution or thereafter, the supply of the non-metal reaction gas is stopped. By such a sequence, both the pretreatment of the substrate and the ALD process may be performed in the same process chamber. FIG. 46 illustrates another embodiment of the pretreatment process. Here, the excitation means of plasma, etc., disposed in the non-metal reaction gas supply part 221 is used to generate oxygen radicals, nitrogen radicals, or hydrogen radicals to form a high-quality radical oxide film or radical nitride film on the substrates being processed, or the poor-quality natural oxide film is removed from the substrate surface. Then, high-quality ALD thin films are formed by the ALD process. In this case, in the pretreatment and the ALD process, the substrate position and the rotation speed during supply and cut-off of each gas may also be controlled, so as to carry out the pretreatment on all the substrates for only the time required and then move on to the ALD process.

Figure 47:
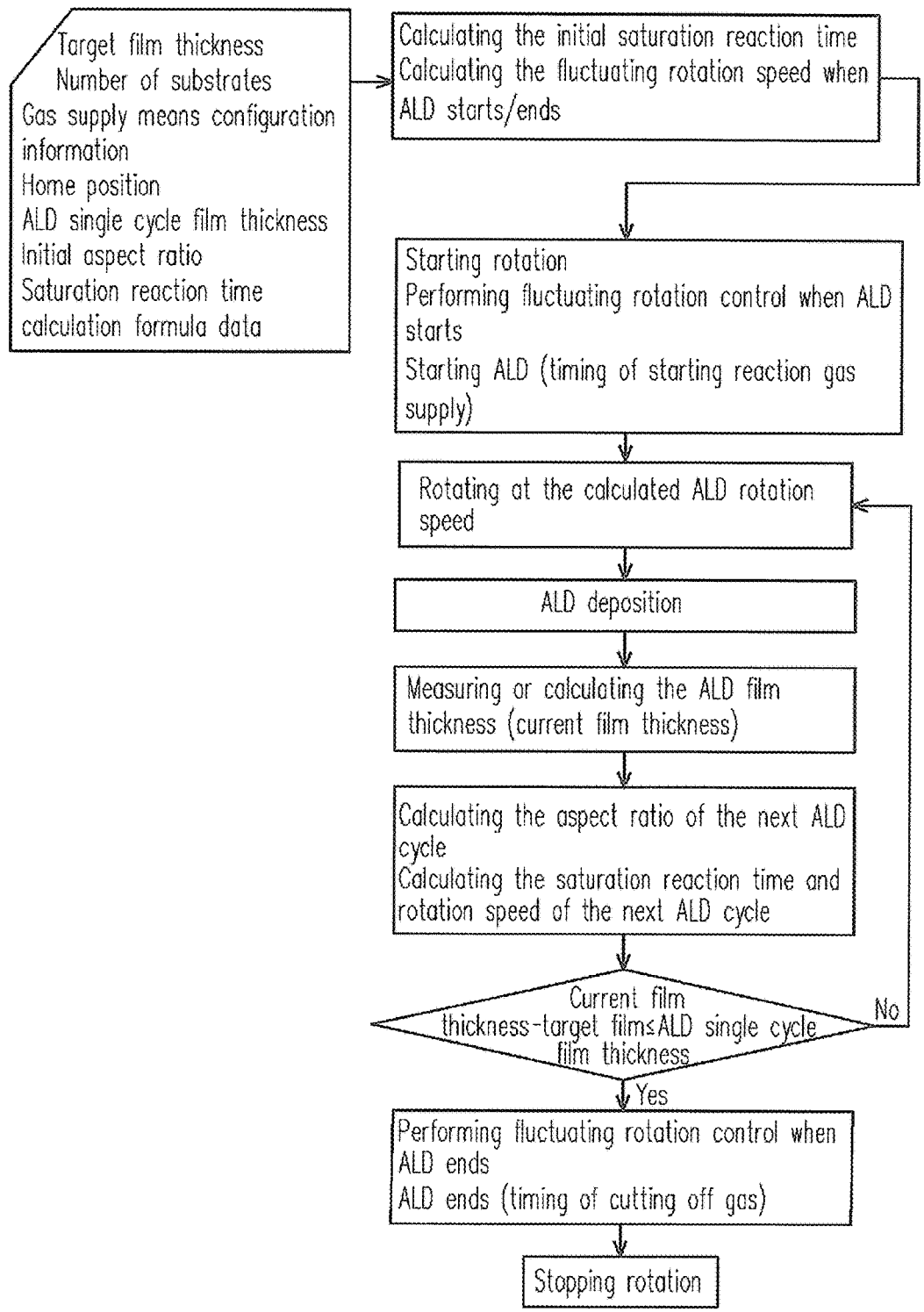
FIG. 47 is a diagram showing the rotation control sequence in the sixth embodiment of the invention.

The sixth embodiment of the invention is described with reference to the rotation speed control sequence shown in FIG. 47. First, provided that the ALD saturation reaction time with respect to the maximum aspect ratio pattern of the substrates being processed is a known value, the value is inputted to a device process recipe. If the value is unknown, the process pressure, temperature, reaction gas type, and the maximum aspect ratio are inputted and a function of the saturation reaction time with respect to the maximum aspect ratio pattern is calculated under these process conditions. As an embodiment of calculation of the function, when performing the ALD deposition on a pattern with an aspect ratio of 10 or more, the saturation time $t_{s1}$ of the aspect ratio a1 at a certain point at a certain process pressure $P_1$ and a certain temperature $T_1$ is calculated, and the saturation time $t_s$ of the aspect ratio $\alpha$ at random temperature T and pressure P is represented by the following equation.

$$t_s = t_{s1}(\alpha/\alpha_1)^2 (P_1/P)(T_1/T)^{0.5} \qquad \text{(Equation 7)}$$

By adjusting the rotation speed of the susceptor to maintain the obtained saturation reaction time, the maximum throughput may be achieved without compromising the complete step coverage.

Another form of the sixth embodiment of the invention discloses a situation where, in the ALD process, the rotation speed is changed gradually according to the deposited film thickness. That is, if the initial aspect ratio before the ALD process is $\alpha_0$ and the film thickness deposited in one single ALD cycle is h, a film having the thickness h is formed on the sidewalls on two sides in the $n^{th}$ cycle. Accordingly, the aspect ratio of the $n^{th}$ cycle may be calculated by $\alpha(n) = \alpha_0/(1-2nh/d)$. Here, d is the width or the diameter of the maximum aspect ratio pattern. The saturation time of the $n^{th}$ cycle is obtained based on $\alpha(n)$ to calculate the rotation speed at the moment, by which the rotation speed is changed in real time. By performing such real-time rotation speed control, the rotation speed in the initial ALD stage where the aspect ratio is relatively small may be increased, so as to obtain the maximum throughput while maintaining 100% step coverage.

Figure 48:
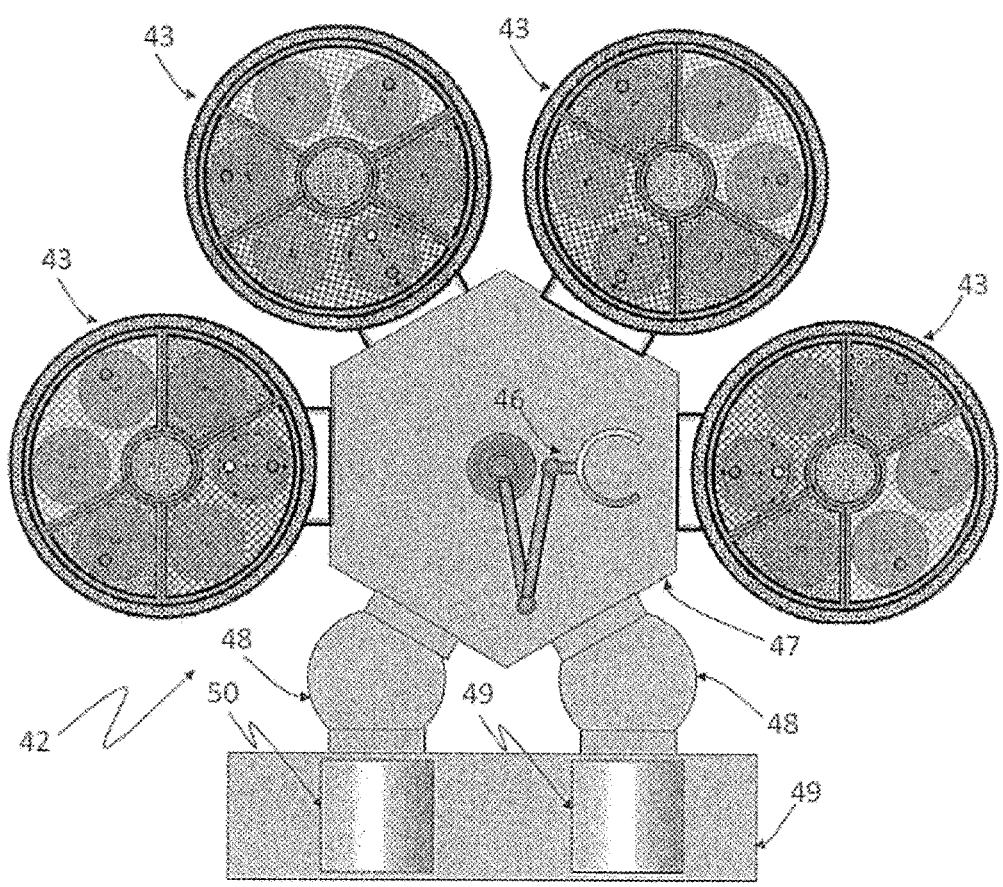
FIG. 48 is a diagram showing an embodiment of the ALD system with six substrates in the invention.
Figure 49:
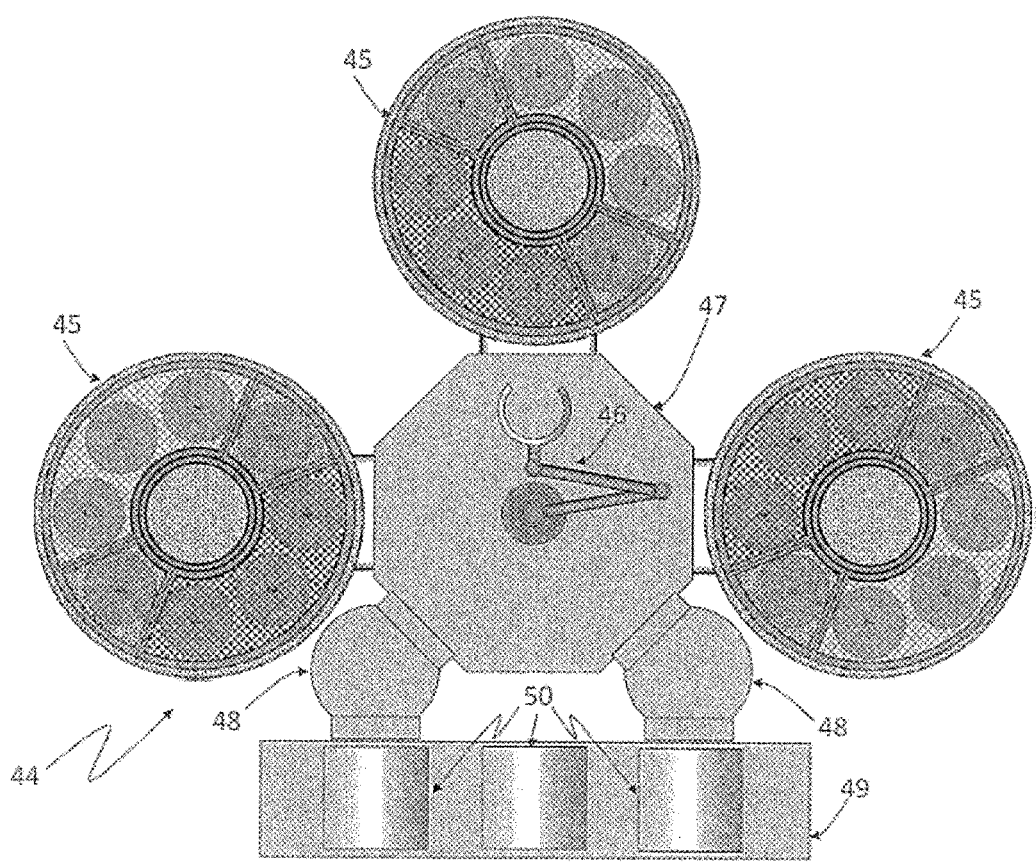
FIG. 49 is a diagram showing an embodiment of the ALD system with eight substrates in the invention.

FIG. 48 and FIG. 49 illustrate a device system provided with a plurality of the ALD process chambers of the invention. In the four-chamber ALD deposition system 42 shown in FIG. 48, six substrates are disposed in one ALD process chamber 43 and four process chambers are installed in one system. Accordingly, the deposition for twenty four substrates may be carried out at the same time. In addition, in the three-chamber ALD deposition system 44 shown in FIG. 49, eight substrates are disposed in one ALD process chamber 45 and three process chambers are installed in one system. Each of these systems includes a common end station 49, an in/out load lock chamber 48, a vacuum transporting chamber 47, and a substrate vacuum transporting robot 46, and is capable of simultaneously processing twenty four substrates as one lot in one system. This embodiment is not intended to limit the number of the process chambers or the number of the substrates. An appropriate system may be selected according to the productivity and the product types.

The four-chamber configuration system as shown in FIG. 48 is used to illustrate a process embodiment of applying the device and process of the invention to the ALD deposition of TiN. At the pressure of 4 Torr and the temperature of 350° C., $TiCl_4$ and $NH_3$ are respectively used as the metal reaction gas and the non-metal reaction gas to deposit a TiN film of 10 nm with use of the rotating semi-batch ALD device of the invention. A patterned silicon substrate having a hole with a diameter of 50 nm and an aspect ratio of 80 is used as the substrates being processed. Nitrogen is used as the purge gas. Here, six substrates being processed each having a diameter of 300 mm are disposed on the rotating susceptor 3. Regarding the gas supply and exhaust means, as shown in FIG. 4, the metal-containing reaction gas supply part and the non-metal reaction gas supply part respectively cover an area equivalent to two substrates and are separated by the purge gas supply part occupying an area equivalent to one substrate. The central purge gas supply part is disposed in the area with a radius of 12 cm at the central portion of the vacuum container. Moreover, the peripheral purge gas supply part is disposed in the area that is 7 cm wide at the peripheral portion. The metal-containing reaction gas supply part, the non-metal reaction gas supply part, and the purge gas supply part are all surrounded by a vacuum evacuation groove having a width of 2 cm. The gas flow rate is 200 SCCM (standard cubic centimeter per minute) for both $TiCl_4$ and $NH_3$. For the two purge gas supply parts that separate the reaction gases, the purge gas flow rate is 400 SCCM respectively. The entire wall of the vacuum container is heated and kept at 200° C. The gas supply means is held by a flange and twenty four springs 24 as shown in FIG. 17. The set gap is 0.8 mm. The gap between the gas supply means and the substrates being processed is measured by an optical laser beam at three points on the substrates being processed. By supplying gases at 500 SCCM and 1 SLM from the central purge gas and peripheral purge gas supply parts respectively, a gap of 0.8 mm may be stably maintained to prevent contact between the substrate and the gas supply means. Regarding the timing of ALD start and completion, the gas supply is started or cut off according to the sequence of FIG. 29.

The saturation time at the aspect ratio of 80 is 1.8 seconds, and the initial steady rotation speed is set to be 10 RPM. The saturation time at the completion time point is 4.8 seconds, and the rotation speed is 6 RPM. The average throughput of one ALD process chamber is 25 WPH including the overhead, such as transporting and heating of the substrates. The three-chamber system as shown in FIG. 49 may achieve a throughput as high as 80 WPH despite the overhead due to transporting the substrates from the end station to the process chambers. Here, the step coverage is observed by a scanning electron microscope and a transmission electron microscope, and the result shows that the step coverage is 100% even for the holes having the aspect ratio of 80. Meanwhile, the same ALD process is carried out on a design with the maximum aspect ratio being 10. The result shows that 100% step coverage may be maintained even if the rotation speed is increased to 200 RPM, and the throughput per process chamber reaches 90 WPH, which is as high as CVD. The four-chamber system shown in FIG. 48 achieves a throughput of 200 WPH or more. In this case, the step coverage also achieves 100% for all the substrates.

Regarding the particles, a marathon test is carried out on 3000 pieces of substrates, and the result is +5 or less on the substrate surface side and about +500 on the back side. The thickness of TiN is 10.08 nm, and the in-plane uniformity and interface reproducibility reach 0.8% (3σ), which is a very good performance.

Regarding gas utilization efficiency, i.e. the ratios of Ti and N atoms that contribute to the TiN deposition in the supplied $TiCl_4$ and $NH_3$ gases, both are 2%. It is known that this efficiency is twice as low as the conventional ALD gas utilization efficiency, which is usually 1%, and helps to significantly reduce the material gas costs.

INDUSTRIAL APPLICABILITY

This specification mainly elaborates the applicability of the invention in the manufacturing process of semiconductors. Nevertheless, by changing the size, shape, or material of the substrate, the invention may also provide an ALD surface processing device with high productivity, high step coverage, and low gas consumption to be extensively used in the fields of manufacturing devices, such as liquid crystal, solar cell, LED, lithium ion secondary battery electrode, nano-materials, and bio-materials.

What is claimed is:

1. A rotating semi-batch ALD device, comprising:
    a vacuum container,
    a rotating susceptor,
    a plurality of substrates being processed disposed on the susceptor,
    a substrate heating heater,
    a plurality of substantially sector-shaped reaction gas supply means disposed in an upper portion of the vacuum container,
    a plurality of separate purge gas supply means disposed between the plurality of substantially sector-shaped reaction gas supply means, and
    a vacuum evacuation means provided as an independent separate system for each reaction gas,
    wherein
    the rotating semi-batch ALD device repeatedly exposes the substrates to the reaction gas sequentially by rotating the susceptor to perform an ALD deposition,
    an entire circumference of each reaction gas supply means is surrounded by a different one of a plurality of first vacuum evacuation grooves as first parts of the vacuum evacuation means, and
    an entire circumference of each of the plurality of separate purge gas supply means is surrounded by a different one of a plurality of separate second vacuum evacuation grooves as second parts of the vacuum evacuation means.

2. The rotating semi-batch ALD device according to claim 1, wherein another purge gas supply means is disposed circularly in a central portion of the vacuum container, and a circumference of the another purge gas supply means is surrounded by a third vacuum evacuation groove as a third part of the vacuum evacuation means.

3. The rotating semi-batch ALD device according to claim 1,
    wherein
    at least one of the substantially sector-shaped reaction gas supply means comprises a porous shower plate, a cavity allowing the gas to flow down under the porous shower plate, and a partition wall surrounding the cavity, wherein the partition wall extends down to lower than a bottom surface of the porous shower plate to define the cavity,
    the purge gas supply means comprises a narrow-gapped shower plate, and
    a first gap between gas ejection holes of the narrow-gapped shower plate of the purge gas supply means and a top surface of the rotating susceptor is narrower than a second gap between gas ejection holes of the porous shower plate of the at least one reaction gas supply means and the top surface of the rotating susceptor, and no cavity is formed under the narrow-gapped shower plate of the purge gas supply means.

4. The rotating semi-batch ALD device according to claim 3, wherein a gas molecule excitation means is disposed in the cavity, wherein the cavity is disposed in the reaction gas supply means containing no metal.

5. The rotating semi-batch ALD device according to claim 4, wherein a means that introduces an etching gas for removing a deposition material into the gas molecule excitation means is disposed for etching the deposition material deposited on the substrates being processed and the susceptor or in the vacuum container.

6. The rotating semi-batch ALD device according to claim 3, wherein a pitch of arrangement of gas ejection holes of the shower plates for the reaction gas and purge gas is set to be 10 mm or less.

7. The rotating semi-batch ALD device according to claim 3, wherein an edge of the shower plate disposed in the reaction gas supply means has a shape with a curvature to prevent stagnation of the reaction gas at the edge.

8. The rotating semi-batch ALD device according to claim 3, wherein a height of the cavity disposed in the reaction gas supply means is set to be 5 cm or less.

9. The rotating semi-batch ALD device according to claim 3, wherein different ones of the reaction gas supply means are separated by a diameter of the substrates being processed or more such that any two of the reaction gas supply means do not come above the same substrate.

10. The rotating semi-batch ALD device according to claim 3, wherein a relative position relationship between the substrates being processed and a gas supply means at a time of starting and cutting off supply of each reaction gas is controlled to apply an ALD process on all the substrates being processed for the same number of cycles.

11. The rotating semi-batch ALD device according to claim 10, wherein a rotation speed of the susceptor at the time of starting and cutting off supply of each reaction gas is varied and controlled according to the relative position relationship between the substrate and the gas supply unit such that all the substrates being processed are in contact with the reaction gas supply means for the same exposure time.

12. The rotating semi-batch ALD device according to claim 10, wherein a pretreatment process is provided before the ALD process starts, and the relative position relationship between the substrates being processed and the gas supply means at the time of starting and cutting off supply of a pretreatment gas is controlled such that the pretreatment is applied to all the substrates being processed for substantially the same time.

13. The rotating semi-batch ALD device according to claim 3, wherein an ALD saturation reaction time, being a minimum time required for covering all adsorption sites on a surface of the substrate with a reaction gas precursor, is calculated according to a maximum aspect ratio of a pattern formed on the surface of the substrates being processed, and a substrate rotation speed is controlled such that the surface of the substrate is exposed longer than the ALD saturation reaction time, wherein the maximum aspect ratio is a ratio of a depth to a width of a hole or a trench.

14. The rotating semi-batch ALD device according to claim 13, wherein the aspect ratio at any time during the deposition and the ALD saturation reaction time corresponding to the aspect ratio are calculated and the substrate rotation speed is controlled in real time such that the surface of the substrates being processed is constantly exposed longer than the saturation reaction time.

15. The rotating semi-batch ALD device according to claim 14, wherein the ALD saturation reaction time is calculated and approximated by a linear function or a quadratic function of the maximum aspect ratio of the surface shape of the substrates being processed, and the substrate rotation speed is controlled such that the surface of the substrate is exposed longer than the calculated ALD saturation reaction time.

16. The rotating semi-batch ALD device according to claim 13, wherein the ALD saturation reaction time is calculated and approximated by a linear function or a quadratic function of the maximum aspect ratio of a surface shape of the substrates being processed, and the substrate rotation speed is controlled such that the surface of the substrate is exposed longer than the calculated ALD saturation reaction time.

17. The rotating semi-batch ALD device according to claim 16, wherein the quadratic function representing the ALD saturation reaction time is approximated by $t_{s0}(1+\gamma\alpha^2)$, wherein the aspect ratio is represented by $\alpha$ and $t_{s0}$ and $\gamma$ are set to be constant.

18. The rotating semi-batch ALD device according to claim 16, wherein a saturation time $t_{s1}$ of an aspect ratio $\alpha_1$ of a point at a process pressure $P_1$ and a temperature $T_1$ is measured, a saturation time $t_s$ of the aspect ratio $\alpha$ at random temperature T and pressure P is calculated by $t_s=t_{s1}(\alpha/\alpha_1)^2(P_1/P)(T_1/T)^{0.5}$, and a rotation speed of the susceptor is adjusted to maintain an obtained saturation reaction time.

19. The rotating semi-batch ALD device according to claim 3, wherein the plurality of substantially sector-shaped reaction gas supply means comprise metal-containing reaction gas supply means and non-metal reaction gas supply means.

* * * * *